US010453892B2

(12) United States Patent
Imoto et al.

(10) Patent No.: US 10,453,892 B2
(45) Date of Patent: Oct. 22, 2019

(54) IMAGING DEVICE AND ELECTRONIC APPARATUS

(71) Applicant: SONY CORPORATION, Tokyo (JP)

(72) Inventors: Tsutomu Imoto, Kanagawa (JP); Keiji Mabuchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/811,275

(22) Filed: Nov. 13, 2017

(65) Prior Publication Data

US 2018/0130848 A1 May 10, 2018

Related U.S. Application Data

(63) Continuation of application No. 15/490,683, filed on Apr. 18, 2017, which is a continuation of application No. 15/148,127, filed on May 6, 2016, now Pat. No. 9,659,994, which is a continuation of application No. 14/567,777, filed on Dec. 11, 2014, now Pat. No. 9,373,655, application No. 15/811,275, which is a continuation of application No. 15/109,865, filed as application No. PCT/JP2015/000129 on Jan. 14, 2015, now Pat. No. 9,853,085, which is a continuation of application No. 14/567,777, filed on Dec. 11, 2014, now Pat. No. 9,373,655.

(60) Provisional application No. 61/929,842, filed on Jan. 21, 2014.

(51) Int. Cl.
*H01L 27/148* (2006.01)
*H01L 27/146* (2006.01)

(52) U.S. Cl.
CPC .... *H01L 27/14887* (2013.01); *H01L 27/1461* (2013.01); *H01L 27/1463* (2013.01); *H01L 27/1464* (2013.01); *H01L 27/14609* (2013.01); *H01L 27/14612* (2013.01); *H01L 27/14627* (2013.01); *H01L 27/14636* (2013.01); *H01L 27/14643* (2013.01); *H01L 27/14654* (2013.01); *H01L 27/14689* (2013.01); *H01L 27/14812* (2013.01); *H01L 27/14656* (2013.01)

(58) Field of Classification Search
CPC ......... H01L 27/14887; H01L 27/14609; H01L 27/14612; H01L 27/1463; H01L 27/14627; H01L 27/14636; H01L 27/14643; H01L 27/14654; H01L 27/14689; H01L 27/14812

See application file for complete search history.

(56) References Cited

FOREIGN PATENT DOCUMENTS

| JP | 2001-156280 | 6/2001 |
|---|---|---|
| JP | 2004-336469 | 11/2004 |
| JP | 2010-103316 | 5/2010 |
| JP | 2011-188148 | 9/2011 |

(Continued)

OTHER PUBLICATIONS

Official Action (no English translation) for Japanese Patent Application No. 2016-541737, dated Jan. 24, 2019, 4 pages.

*Primary Examiner* — Victor A Mandala
*Assistant Examiner* — Colleen E Snow
(74) *Attorney, Agent, or Firm* — Sheridan Ross P.C.

(57) ABSTRACT

There is provided an imaging device that includes photovoltaic type pixels that have photoelectric conversion regions generating photovoltaic power for each pixel depending on irradiation light; and an element isolation region that is provided between the photoelectric conversion regions of adjacent pixels and in a state of substantially surrounding the photoelectric conversion region.

13 Claims, 53 Drawing Sheets

(56) References Cited

FOREIGN PATENT DOCUMENTS

| JP | 2012-520599 | 9/2012 |
|----|-------------|--------|
| JP | 2013-211832 | 10/2013 |

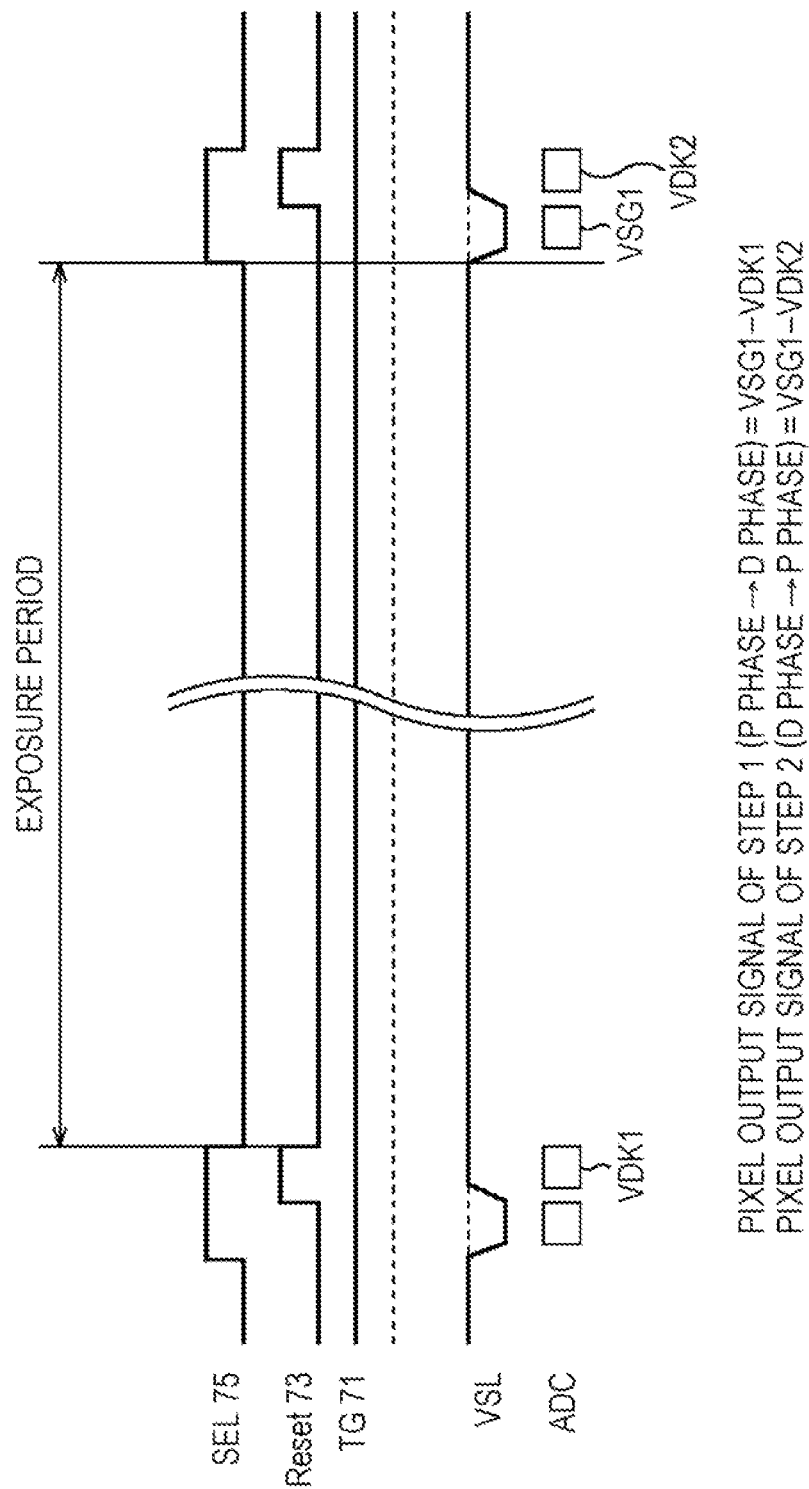

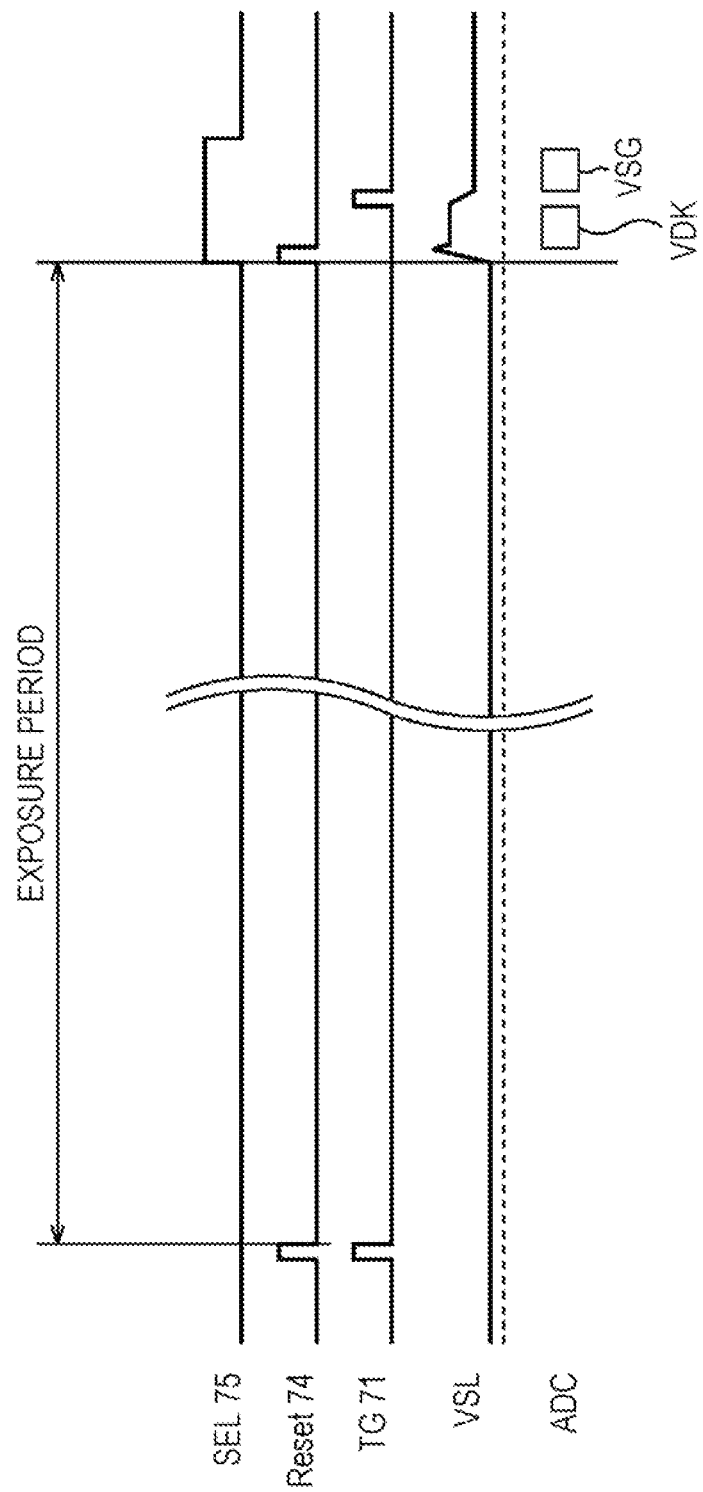

LINEAR READING AND LOGARITHMIC READING ARE SWITCHED FOR
A PLURALITY OF FRAMES AND ONE OF IMAGES IS USED

LINEAR READING AND LOGARITHMIC READING ARE SWITCHED FOR
ONE FRAME AND BOTH IMAGES ARE SYNTHESIZED

LINEAR PIXEL AND LOGARITHMIC PIXEL ARE SIMULTANEOUSLY READ
AND BOTH IMAGES ARE SYNTHESIZED IN ONE FRAME

FIG. 30A

| R Lin | G Log |
|---|---|
| G Lin | B Lin |

FIG. 30B

| R Lin | W Log |
|---|---|
| G Lin | B Lin |

FIG. 30C

| R Log | G Lin |
|---|---|
| G Log | B Log |

FIG. 30D

| R Log | W Lin |
|---|---|
| G Log | B Log |

FIG. 30E

| R Log | G Log |
|---|---|
| G Log | B Log |

FIG. 30F

| R Log | W Log |
|---|---|
| G Log | B Log |

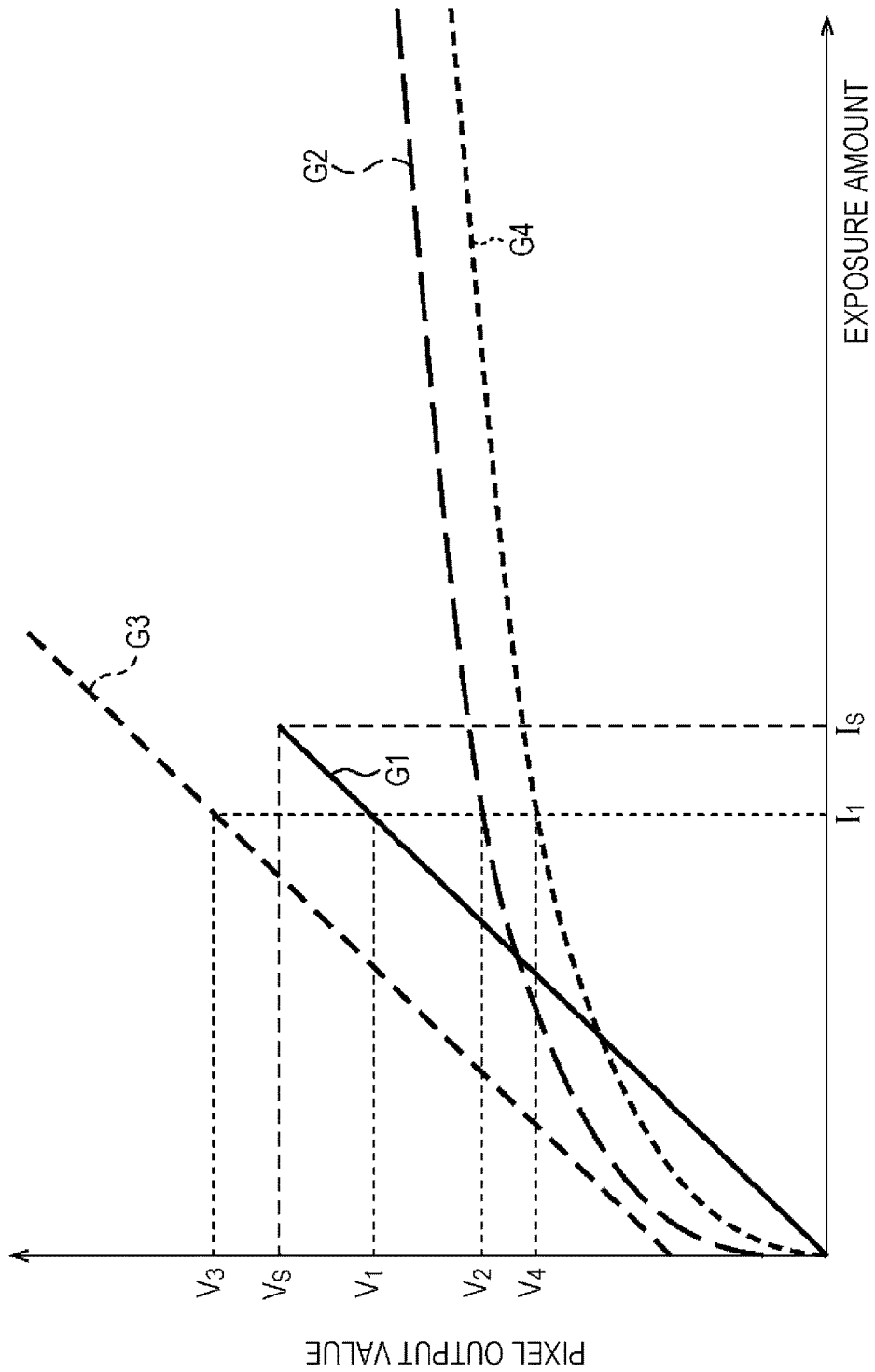

IMAGING DEVICE AND ELECTRONIC APPARATUS

CROSS REFERENCE TO RELATED APPLICATIONS

This application is a continuation of U.S. patent application Ser. No. 15/109,865, filed Jul. 6, 2016, which is a national stage application under 35 U.S.C. 371 and claims the benefit of PCT Application No. PCT/JP2015/000129 having an international filing date of Jan. 14, 2015, which designated the United States, which PCT application is a continuation of and claimed the benefit of U.S. Nonprovisional application Ser. No. 14/567,777, filed Dec. 11, 2014, now U.S. Pat. No. 9,373,655, issued on Jun. 21, 2016, and U.S. Provisional Application Ser. No. 61/929,842, filed Jan. 21, 2014. This application is also a continuation of US Nonprovisional application Ser. No. 15/490,683, filed Apr. 18, 2017, which is a continuation of U.S. Nonprovisional application Ser. No. 15/148,127, filed May 6, 2016, now U.S. Pat. No. 9,659,994; which is a continuation of U.S. Nonprovisional application Ser. No. 14/567,777, filed Dec. 11, 2014, which claimed the benefit of U.S. Provisional Application No. 61/929,842, filed Jan. 21, 2014. The disclosures of all of these applications and patents are incorporated herein by reference in their entirety.

TECHNICAL FIELD

The present disclosure relates to an imaging device and an electronic apparatus, and specifically, to an imaging device and an electronic apparatus that can solve a problem such as crosstalk due to a PN junction diode.

BACKGROUND ART

In the related art, a charge accumulation type imaging device (hereinafter, referred to as an accumulation type imaging device) as an imaging device with which an electronic apparatus having an imaging function represented by a digital camera is equipped is known.

In the accumulation type imaging device, when excessive light is incident and an accumulation charge amount exceeds a saturation charge amount, an excess portion of a signal charge flows into an N-type substrate beyond an overflow barrier or flows into a floating diffusion beyond a potential barrier under a transfer gate. Therefore, since a dynamic range of the accumulation type imaging device is limited by the saturation charge amount of a charge accumulation region, it is difficult to realize a large dynamic range and, as a result, there is a problem that overexposure or underexposure is likely to occur.

Thus, as a solid-state imaging device capable of solving such a problem, a log-arithmic sensor configured of photovoltaic type pixels is proposed (for example, see PTL 1 or PTL 2).

FIG. 1 illustrates an equivalent circuit for one pixel of the photovoltaic type pixel configuring the logarithmic sensor disclosed in PTL 1.

In a photovoltaic type pixel 1, photovoltaic power proportional to a logarithm of a photocurrent value depending on incident light 2 is generated by a PN junction diode 3, the photovoltaic power that is generated is amplified by an amplifier 4 and becomes an image signal, and the image signal that is generated is output to a vertical signal line 7 through a switch 6. Moreover, the PN junction diode 3 is reset by a switch 5.

As described above, in the photovoltaic type pixel 1, since the image signal that is generated is output to a subsequent stage without being accumulated, even when excessive incident light 2 is incident, the pixel signal is not saturated.

Moreover, the photovoltaic type pixel 1 can be operated as an accumulation type.

CITATION LIST

Patent Literature

PTL 1: EP1354360
PTL 2: US2011/0025898A1

SUMMARY OF INVENTION

Technical Problem

However, as a result of analysis of the photovoltaic type pixel 1, the following disadvantages are found.

A first disadvantage is so-called crosstalk. FIG. 2 is a cross-sectional view illustrating an example of a pixel structure of the photovoltaic type pixel illustrated in FIG. 1 and illustrates an overview of the crosstalk.

Specifically, when photovoltaic power is generated depending on the incident light 2, the PN junction diode that is a photo-sensor is biased in a forward direction and, as a result, since electrons diffuse from an N-type region into a P-type substrate, as represented by a dashed arrow line A of FIG. 2, the electrons which are diffused may reach the adjacent photo-sensor (PN junction diode). In this case, since the adjacent pixel is also a photovoltaic type pixel, crosstalk occurs. Moreover, although not illustrated, even if the adjacent pixel of the photovoltaic type pixel 1 is the accumulation type pixel, crosstalk occurs similarly.

A second disadvantage is that a change in the pixel signal amount with temperature is large. A pixel signal voltage $V_{PD}$ can be represented by the following Expression (1).

[Math. I]

$$V_{PD} = -T \ln(-f_S + 1) \tag{1}$$

Here, $I_{iambda}$ is the photocurrent, $I_s$ is a reverse saturated current in the PN junction diode 3 and is a value that exponentially increases with increase of the temperature. Thus, when $I_s$ exponentially increases with increase of the temperature, the pixel signal voltage $V_{PD}$ decreases markedly.

The description will be explained in more detail. FIG. 3 illustrates a relationship between illuminance (standardized) of the incident light at each temperature of the photovoltaic type pixel 1 illustrated in FIG. 1 and an output voltage of the PN junction diode 3. It can be understood from FIG. 3 that the generated voltage decreases markedly even at the same illuminance when the temperature is decreased.

A third disadvantage is that low illuminance sensitivity is low and variation suppression is difficult. As represented in Expression (1), in order to increase the sensitivity, it is necessary to lower I. However, it is known that I, is increased by impurity contamination or crystal defects. However, it becomes costly to suppress all these because it takes a high degree of process control.

A fourth disadvantage is that when a photovoltaic type pixel 1 operates as the accumulation type, the dark current is increased.

FIG. 4 illustrates a relationship between irradiation time of the photovoltaic type pixel 1 and the output voltage (PTL 2, FIG. 2).

A case where the photovoltaic type pixel operates as the accumulation type corresponds to a linear region of the drawing and the occurrence of the dark current can be confirmed.

Description will be given in detail. FIG. 5 is an enlarged view when a reverse bias is applied in the vicinity of the photo-sensor (the PN junction diode 3) of the photovoltaic type pixel 1 illustrated in FIG. 1. When the photovoltaic type pixel 1 is operated as the accumulation type, the photo-sensor is reverse biased and, in this case, since a depletion layer spreads as illustrated in the drawing and then an $Si/SiO_2$ interface is positioned in the depletion layer, the dark current is increased due to influence of the interface state.

The present disclosure is made in view of such a situation and it is desirable to realize an imaging device which is excellent in low illuminance sensitivity and low illuminance SIN and of which crosstalk is low while realizing a wide dynamic range.

Solution to Problem

An imaging device according to a first embodiment of the disclosure includes photovoltaic type pixels that have photoelectric conversion regions generating photovoltaic power for each pixel depending on irradiation light, and an element isolation region that is provided between the photoelectric conversion regions of adjacent pixels and in a state of substantially surrounding the photoelectric conversion region.

The element isolation region may be configured of a material that blocks diffusion of signal charge of the photovoltaic type pixels to the adjacent pixel.

The imaging device that is the first embodiment of the disclosure may further include an accumulation type pixel that is provided adjacent to the photovoltaic type pixel.

A PN junction diode may be formed in the photoelectric conversion region as a photo-sensor.

The photovoltaic type pixel may further include a transfer gate and floating diffusion and may operate as an accumulation type and photovoltaic type pixel.

The imaging device that is the first embodiment of the disclosure may further include an accumulation type pixel that is provided in a position adjacent to the accumulation type and photovoltaic type pixel.

The imaging device that is the first embodiment of the disclosure may further include an accumulation type and photovoltaic type pixel having the photoelectric conversion region, a transfer gate, and floating diffusion, in which the photovoltaic type pixel and the accumulation type and photovoltaic type pixel may be formed adjacent to each other.

A portion between the photoelectric conversion region and a pixel circuit region in each pixel is insulated.

An electronic apparatus according to a second embodiment of the disclosure is an electronic apparatus that is equipped with an imaging device, in which the imaging device includes photovoltaic type pixels that have photoelectric conversion regions generating photovoltaic power for each pixel depending on irradiation light, and an element isolation region that is provided between the photoelectric conversion regions of adjacent pixels and in a state of substantially surrounding the photoelectric conversion region.

In the first and second embodiments of the present disclosure, the photovoltaic power is generated depending on incident light by the photoelectric conversion region provided in each pixel and a diffusion current generated by the photovoltaic power is blocked from arriving in the adjacent pixel by the element isolation region provided between the photoelectric conversion regions of adjacent pixels in a state of substantially surrounding the photoelectric conversion region.

Advantageous Effects of Invention

According to the first embodiment of the present disclosure, it is possible to suppress crosstalk between the pixels.

According to the second embodiment of the present disclosure, it is possible to obtain an image with excellent sensitivity and SIN in low illuminance.

BRIEF DESCRIPTION OF DRAWINGS

FIG. 24 is a view illustrating an example of a drive timing of the photovoltaic type pixel.

FIG. 25 is a view illustrating an example of a drive timing of the accumulation type pixel.

FIGS. 30A-30F illustrate another example of an arrangement of the photovoltaic type pixel and the accumulation type pixel.

FIG. 54 is a view illustrating an outline of a calibration method of an output value of the photovoltaic type pixel.

DESCRIPTION OF EMBODIMENTS

Figure 1:
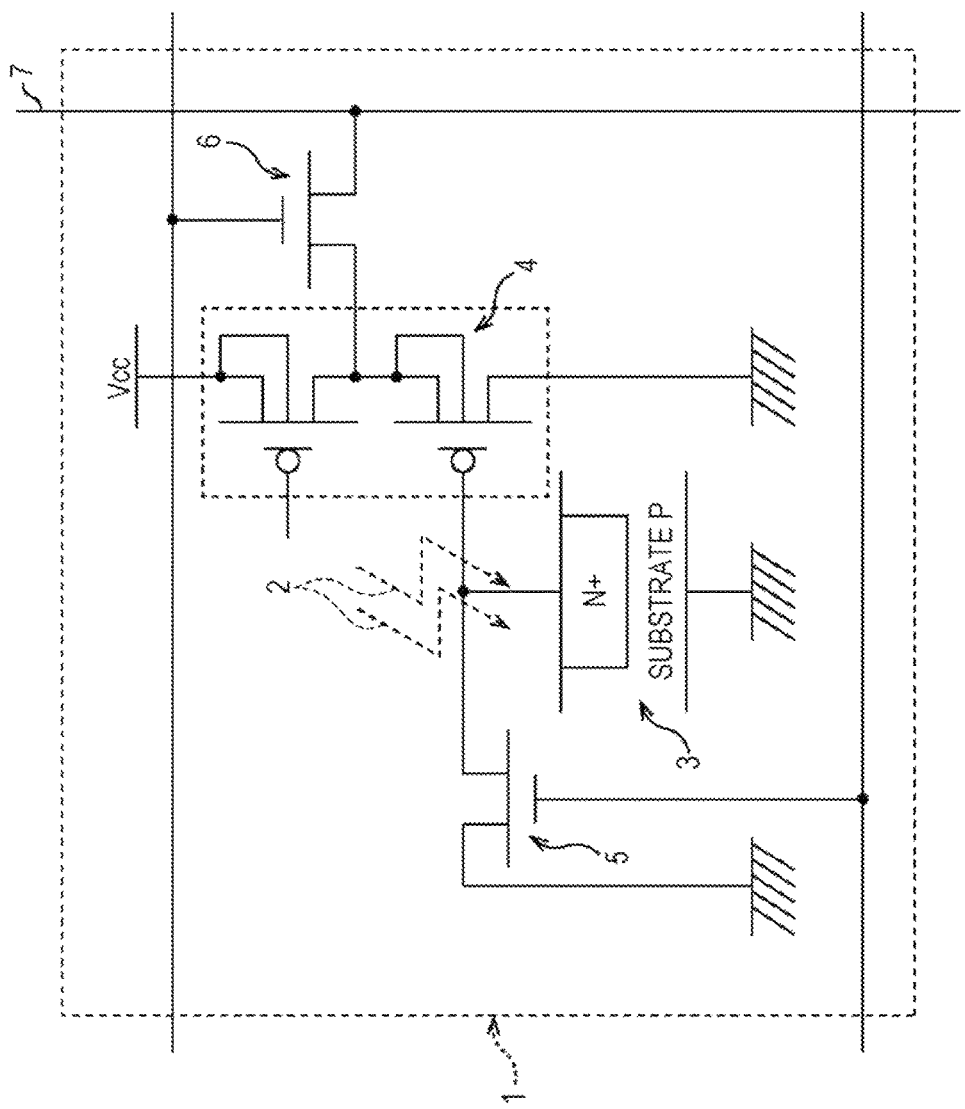
FIG. 1 is an equivalent circuit diagram for one pixel of a photovoltaic type pixel configuring a logarithmic sensor.
Figure 2:
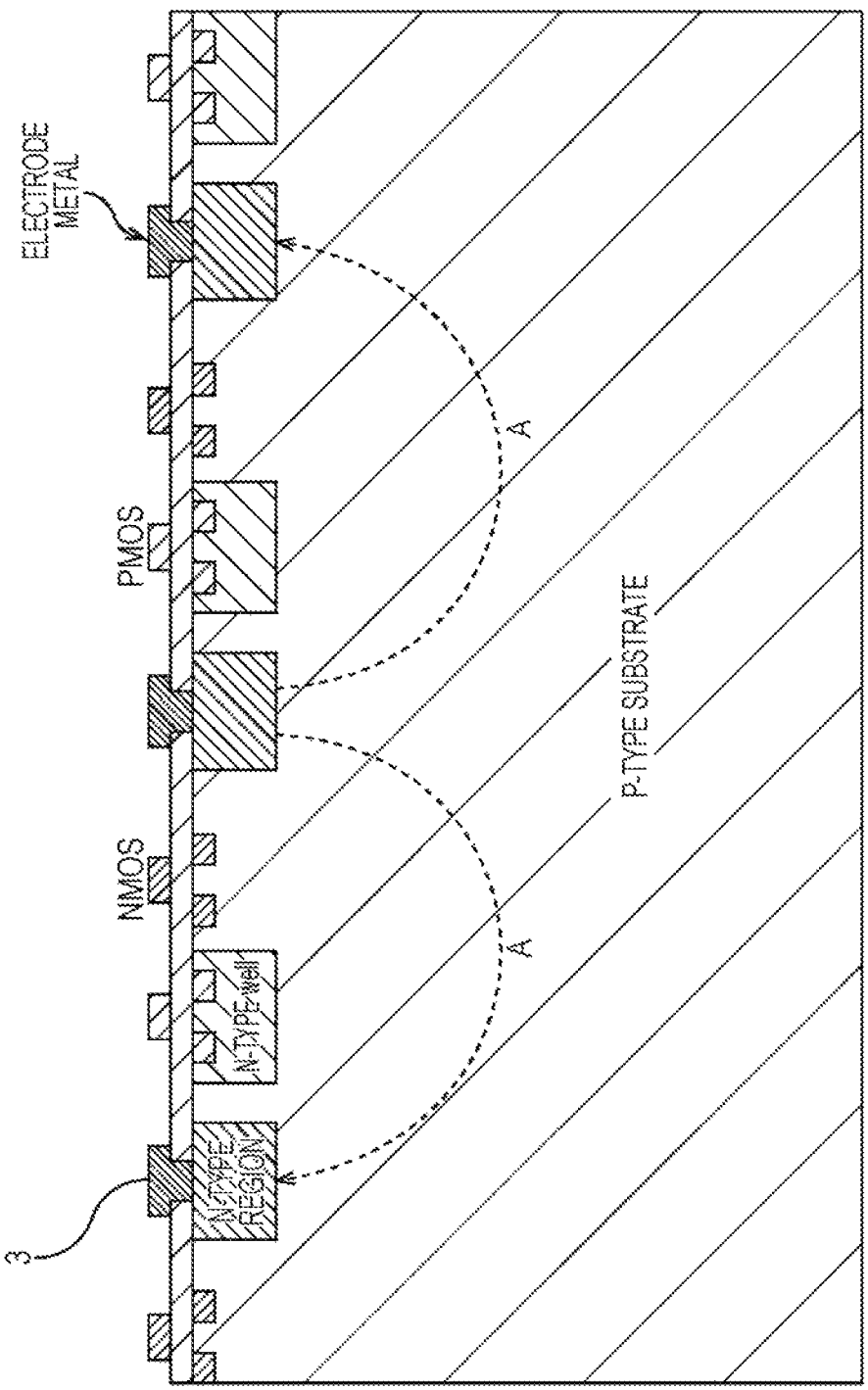
FIG. 2 is a cross-sectional view of a pixel structure corresponding to the equivalent circuit of FIG. 1.

Hereinafter, best modes (hereinafter, referred to as embodiments) for implementing the present disclosure are described in detail with reference to the drawings.

(1. First Embodiment)

A photovoltaic type pixel according to a first embodiment will be described with reference to the drawings. Moreover, the same reference numerals are appropriately given to common portions in each view.

Figure 6:
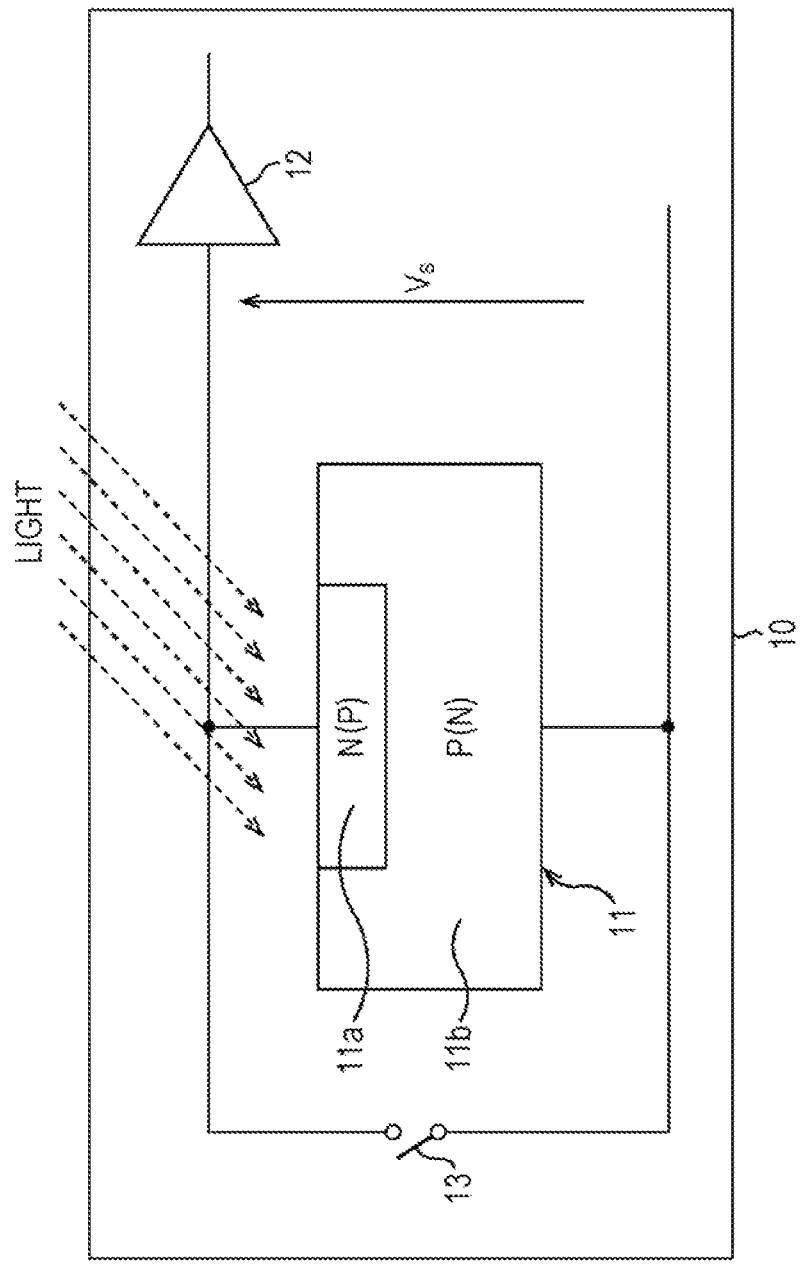
FIG. 6 is an equivalent circuit diagram of a photovoltaic type pixel that is a first embodiment of the present disclosure.

FIG. 6 illustrates an equivalent circuit of a photovoltaic type pixel according to the first embodiment. A photovoltaic type pixel 10 has a PN junction diode 11, an amplifier 12 and a switch 13. The PN junction diode 11 generates photovoltaic power in proportion to a logarithm of a photocurrent value depending on incident light. The amplifier 12 amplifies the generated photovoltaic power and outputs a pixel signal obtained as a result thereof to a subsequent stage. The switch 13 generates a diode output voltage when dark by shorting the PN junction diode 11.

Moreover, in the equivalent circuit of FIG. 6, the photovoltaic power generated in an N-type region is amplified by the amplifier 12 and is used as a signal voltage, but conductive types of the N-type region and a P-type region of FIG. 6 may be switched as displayed in parentheses and a voltage generated in the P-type region may be used as the signal voltage. In the following description, unless otherwise specified, a case where a potential of the N-type region is used as the signal voltage is described as an example.

Figure 7:
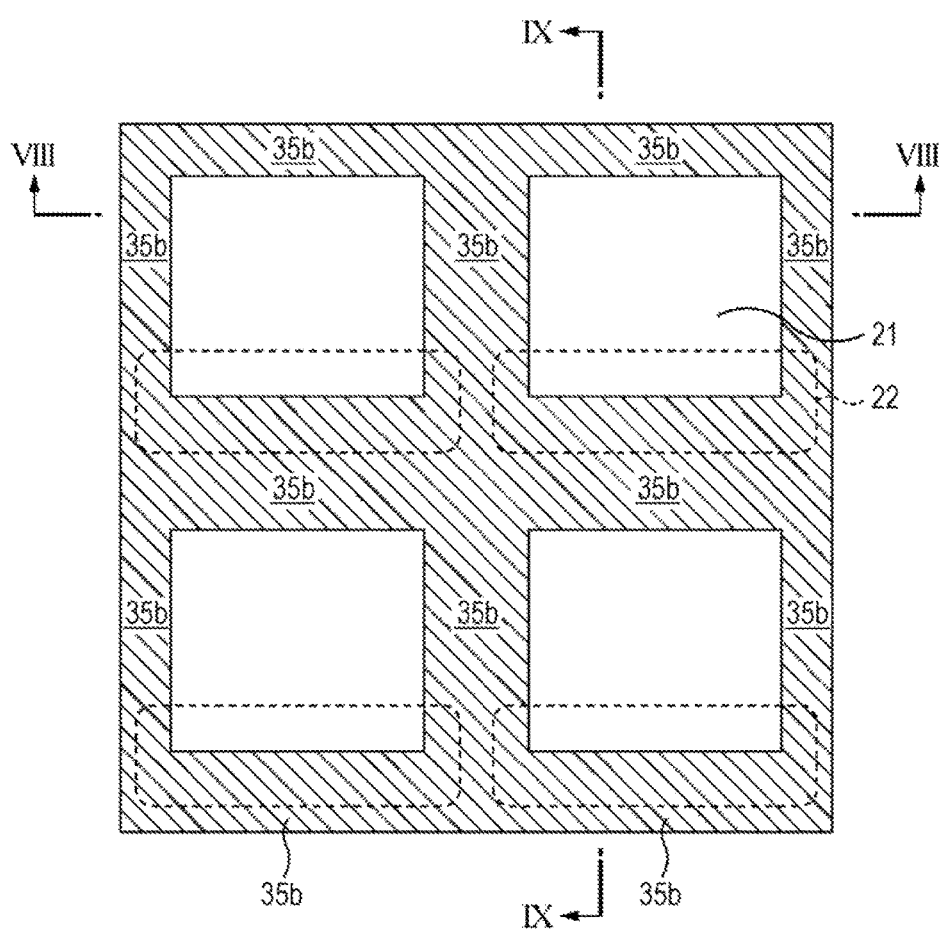
FIG. 7 is a top view of a pixel structure corresponding to the photovoltaic type pixel of FIG. 6.

FIG. 7 illustrates an arrangement view of an upper surface for 2×2 pixels of a pixel structure corresponding to the photovoltaic type pixel 10 of which the equivalent circuit is illustrated in FIG. 6.

As illustrated in the drawing, the photovoltaic type pixel 10 has a photoelectric conversion region 21 separated by an element isolation region 35. The PN junction diode 11 of FIG. 6 is formed in the photoelectric conversion region 21. A pixel circuit region 22 can be provided in an appropriate region in the pixel which overlaps with the photoelectric conversion region 21 or the element isolation region 35 and the amplifier 12, the switch 13, and the like besides the PN junction diode 11 are formed in the pixel circuit region 22.

Figure 8:
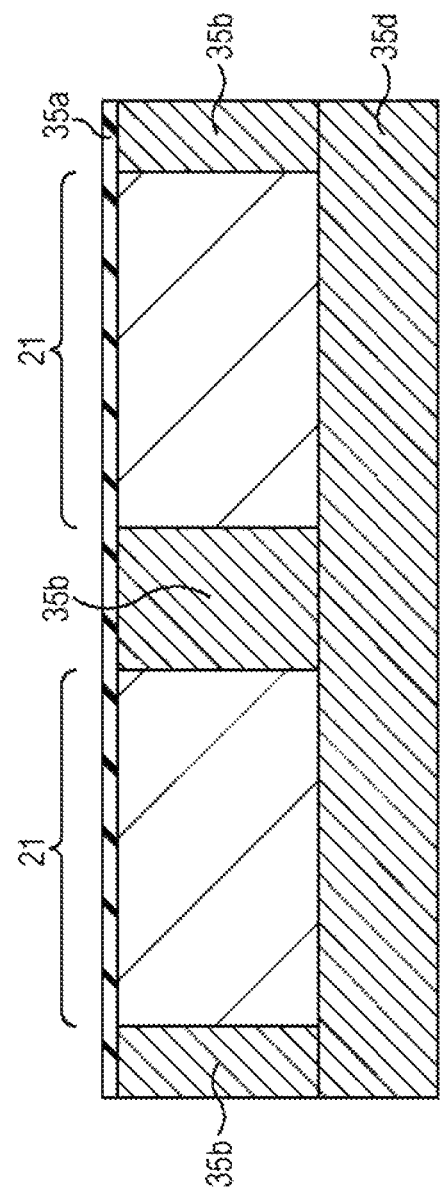
FIG. 8 is a cross-sectional view of a pixel structure corresponding to the photovoltaic type pixel of FIG. 6.
Figure 9:
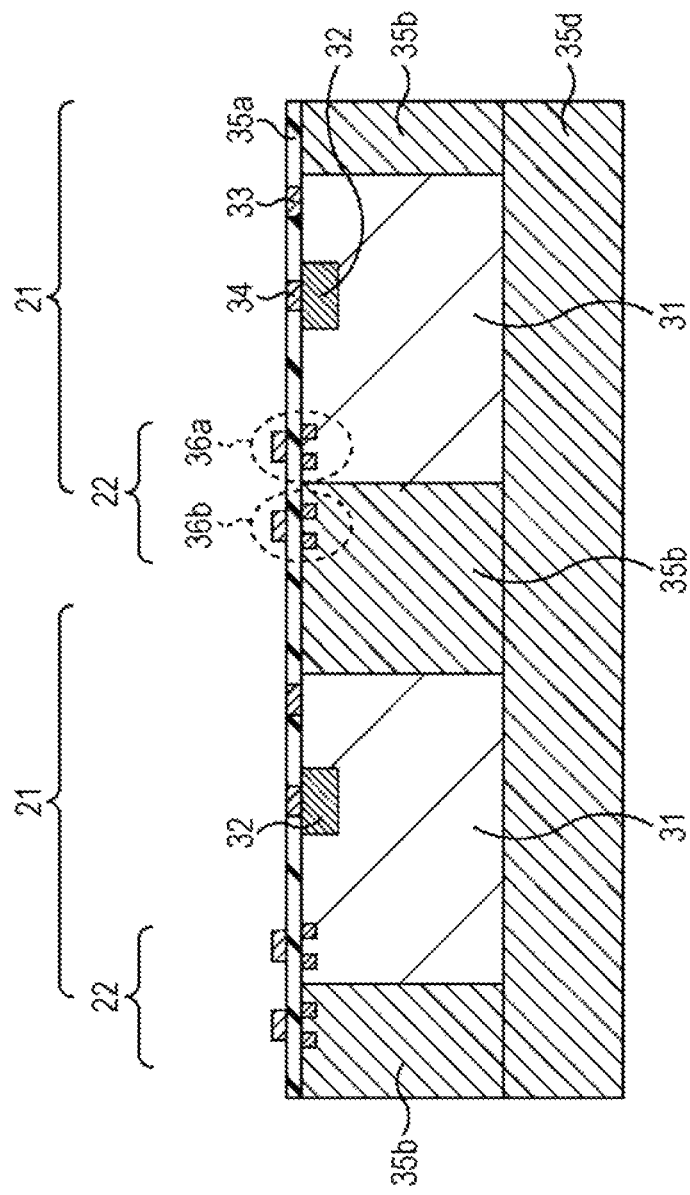
FIG. 9 is a cross-sectional view of a pixel structure corresponding to the photovoltaic type pixel of FIG. 6.

FIG. 8 illustrates a cross section of the pixel structure in line VIII-VIII of FIG. 7 and FIG. 9 illustrates a cross section of the pixel structure in line IX-IX of FIG. 7. As is apparent from the cross sections of FIGS. 8 and 9, isolation between the photoelectric conversion region 21 and the photoelectric conversion region 21 is performed by the element isolation region 35.

Specifically, as illustrated in FIG. 9, the PN junction diode 11 formed in the photoelectric conversion region 21 is configured of a P-type region 31, an N-type region 32, an electrode 33 for ohmic contact with the P-type region 31, and an electrode 34 for ohmic contact with the N-type region 32.

For example, the P-type region 31 is a Group IV semiconductor such as Si and Ge into which acceptor impurities are introduced, a Group III-V semiconductor such as GaAs, InP, and InGaAs, or a Group II-VI semiconductor selected from Hg, Zn, Cd, Te, and the like.

For example, the N-type region 32 is a Group IV semiconductor such as Si and Ge into which donor impurities are introduced, a Group III-V semiconductor such as GaAs, InP, and InGaAs, or a Group II-VI semiconductor selected from Hg, Zn, Cd, Te, and the like.

The electrodes 33 and 34 are selected depending on a material of the P-type region 31 or the N-type region 32 with which each of the electrodes 33 and 34 comes into contact. For example, if the P-type region 31 and the N-type region 32 are Si, for example, an Al, Ti/W laminated film and the like are selected as the electrodes 33 and 34.

The element isolation region 35 is provided to suppress a leakage current between the photoelectric conversion regions 21 (the PN junction diodes 11) which are adjacent to each other, and the photoelectric conversion regions 21 which are adjacent to each other. Thus, the element isolation region 35 is disposed so as to substantially surround a circumference of the photoelectric conversion region 21 (the PN junction diode 11).

Moreover, at least one of element isolation regions 35a and 35d disposed above and below the P-type region 31 has optical transparency in order to cause the incident light to reach the PN junction diode 11.

The element isolation region 35 is configured of one of the following materials or a combination thereof.

Insulating material ($SiO_2$, SiN, BSG, PSG, SiON, and the like)

Conductive semiconductor (for example, if the PN junction diode 11 is Si, n-Si and the like of a reverse conductive type with respect to the P-type region 31)

Metal (an ohmic electrode and a Schottky electrode for the P-Type region 31)

Moreover, the conductive semiconductor as the element isolation region 35 may be the same material as the P-type region 31 or the N-type region 32 of the PN junction diode 11, and is configured of a different type semiconductor material and then may form a heterojunction. When it is the same material, the N-type region is the reverse conductive type with respect to the P-type region 31. Otherwise, if the photoelectric conversion region and the element isolation region are configured of a Group III-V semiconductor such as GaAs, boron and the like are ion-implanted at a high concentration in the element isolation region 35 and it is possible to use a high resistance material by degrading the crystallinity.

As described above, since electrons diffused from the N-type region 32 to the P-type region 31 or electrons generated within the P-type region are prevented from reaching the adjacent pixel by providing the element isolation region 35, it is possible to suppress crosstalk to the adjacent pixel.

Figure 10:
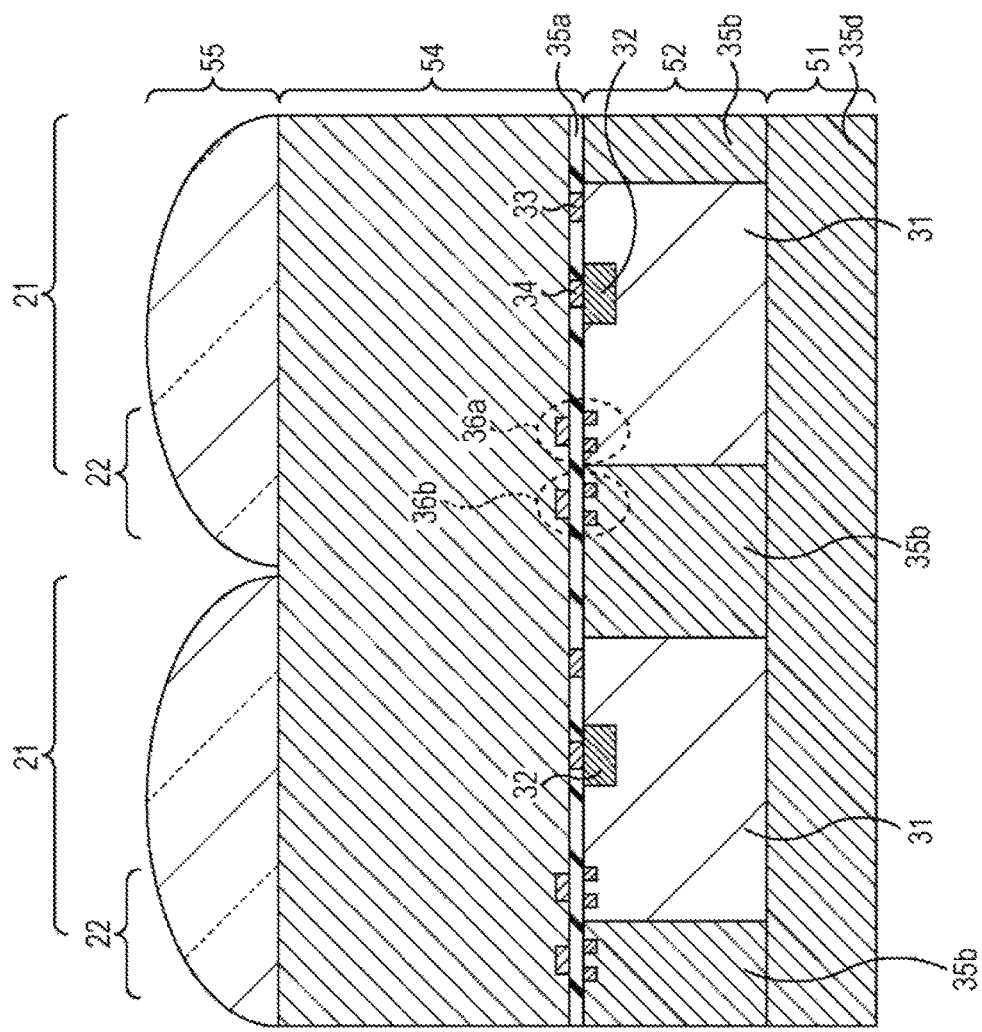
FIG. 10 is a cross-sectional view illustrating a first configuration example when the photovoltaic type pixel of FIG. 6 is applied to a surface irradiation type imaging device.

FIG. 10 is a cross-sectional view of a configuration example (hereinafter, referred to as a first configuration example) in a case where the photovoltaic type pixel 10 of the first embodiment is applied to a surface irradiation type imaging device.

In the first configuration example, $SiO_2$ is used for the element isolation region 35a covering an upper side of the N-type region 32, the conductive semiconductor (n-Si) is used for the element isolation region 35b, and an N-type substrate 51 of the conductive semiconductor (n-Si) functions as the element isolation region 35d covering a lower side of the P-type region 31.

An NMOS Tr. 36a of the pixel circuit region 22 is formed in the P-type region 31 and a PMOS Tr. 36b is formed in the element isolation region 35b.

In the first configuration example, the N-type substrate 51 and the element isolation region 35b function as a collector of diffusion current from the N-type region 32 to the P-type region 31 and prevent flowing of the diffusion current into the adjacent photoelectric conversion region 21, and thereby crosstalk can be suppressed.

A manufacturing method of the first configuration example will be described. First, an N-type epitaxial growth layer 52 of a low concentration is laminated on the N-type substrate 51 by an existing method. Next, an N-type impurity (for example, phosphorus or arsenic) and a P-type impurity (for example, boron) are ion-implanted in the epitaxial growth layer 52 by an existing method, activation annealing is performed, and the P-type region and the N-type region (not illustrated) of high concentration are formed respectively in forming regions of the P-type region 31, the N-type region 32, the element isolation region 35b, and the electrodes 33 and 34.

Next, a Si surface of the epitaxial growth layer 52 is thermally oxidized and then the element isolation region 35a is formed. Oxide films on the P-type region 31 and the N-type region 32 are removed by etching, metal is embedded therein, and then the electrodes 33 and 34 are formed. As the metal embedded as the electrodes 33 and 34, for example, it is possible to use Al, Ti/W laminated film, and the like.

Thereafter, a wiring layer 54 is formed by an existing method and finally, a condensing layer 55 including an on-chip lens is formed by an existing method.

Figure 11:
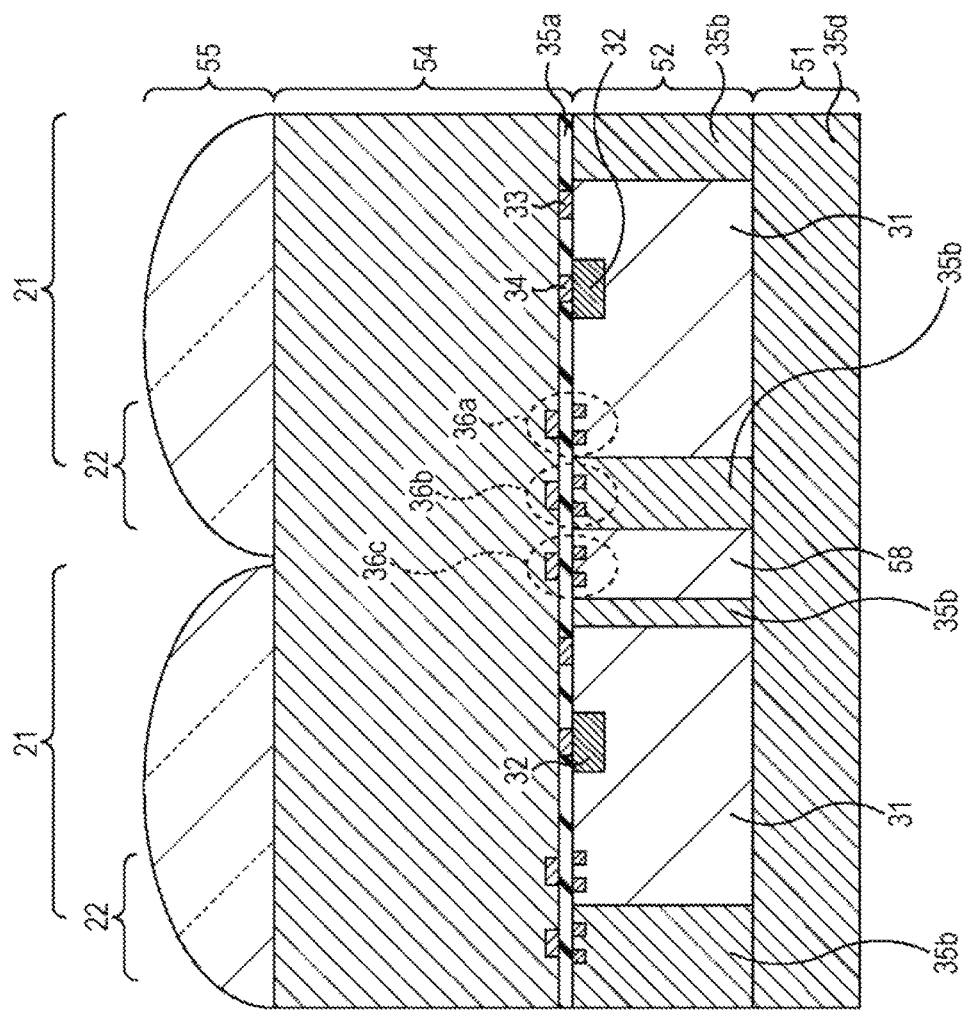
FIG. 11 is a cross-sectional view illustrating a modified example of the first configuration example of FIG. 10.

FIG. 11 illustrates a modified example of the first configuration example. That is, as illustrated in FIG. 11, a P-type region 58 is inserted into the element isolation region 35b and the element isolation region 35b, and an element such as an NMOS Tr. 36c may be formed therein. The P-type region 58 can be formed by introducing impurities of the P-type region 58 before and after a step of introducing acceptor impurities in the P-type region 31.

(Specific Configuration Example of Photovoltaic Type Pixel 10 that is First Embodiment)

Figure 12:
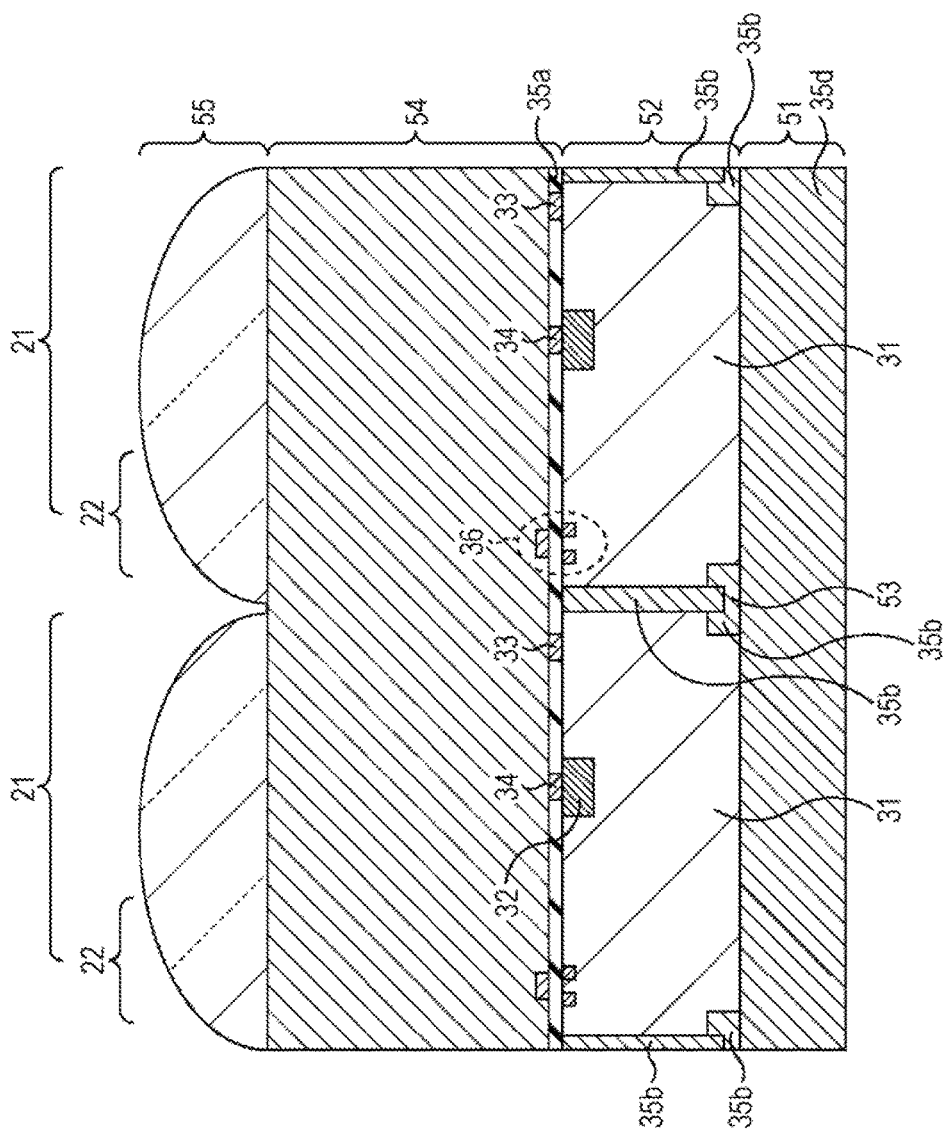
FIG. 12 is a cross-sectional view illustrating a second configuration example when the photovoltaic type pixel of FIG. 6 is applied to a surface irradiation type imaging device.

Next, FIG. 12 is a cross-sectional view of a configuration example (hereinafter, referred to as a second configuration example) in which the photovoltaic type pixel 10 of the first embodiment is applied to the surface irradiation type imaging device.

The second configuration example is configured by laminating an epitaxial growth layer (epitaxial layer) 52, a wiring layer 54, and a condensing layer 55 on an N-type substrate 51 in this order.

In the second configuration example, $SiO_2$ is used in the element isolation region 35a covering the upper side of the N-type region 32, a combination of $SiO_2$ and the conductive semiconductor (n-Si) is used in the element isolation region 35b, and the N-type substrate 51 of the conductive semiconductor functions as the element isolation region 35d covering the lower side of the P-type region 31.

A manufacturing method of the second configuration example will be described. First, the N-type epitaxial growth layer 52 of low concentration is laminated on the N-type substrate 51 by an existing method. Next, an N-type impurity (for example, phosphorus or arsenic) and a P-type impurity (for example, boron) are ion-implanted in the epitaxial growth layer 52, and activation annealing is performed by an existing method and then the P-type region and the N-type region (not illustrated) of high concentration are formed respectively in forming regions of an N-type region 53, the P-type region 31, the N-type region 32, and the electrodes 33 and 34.

Next, an active element such as a MOS Tr. 36 and a passive element such as MOS capacitor and diffusion layer resistance are formed in the pixel circuit region 22 by an existing method.

Subsequently, the region forming the element isolation region 35b of the epitaxial growth layer 52 is etched, $SiO_2$ is embedded therein, and the element isolation region 35b is formed. For the etching, it is possible to use reactive ion etching, a method of anodic oxidation, and the like. Furthermore, for the embedding of $SiO_2$ it is possible to use an ALO method, a CVD method, or a combination of CMP technology after thermally oxidizing Si of the etching surface.

Next, the Si surface of the epitaxial growth layer 52 is thermally oxidized, the element isolation region 35a is formed, oxide films on the P-type region 31 and the N-type region 32 are removed by etching, metal is embedded therein, and then the electrodes 33 and 34 are formed. For the metal that is embedded as the electrodes 33 and 34, for example, it is possible to use Al, an Ti/W laminated film, and the like.

Thereafter, the wiring layer 54 is formed by an existing method and, finally, the condensing layer 55 including an on-chip lens is formed by an existing method.

Moreover, in FIG. 12, distribution of impurities within each of the P-type region 31 and the N-type region 32 is not illustrated, but in order to increase the sensitivity by widening a width of the depletion layer formed between both sides, the impurity concentration of a boundary region of both sides is decreased and then an effective p-i-n junction may be formed. In this case, an i layer may be an N-type layer of low concentration or a P-type layer of low concentration. However, in the configuration example of FIG. 12, the N-type region 32 is illustrated so as to be narrower than the P-type region 31, but when the N-type layer of the low concentration is provided, the N-type region 32 is formed so as to be wider than the P-type region 31.

Figure 13:
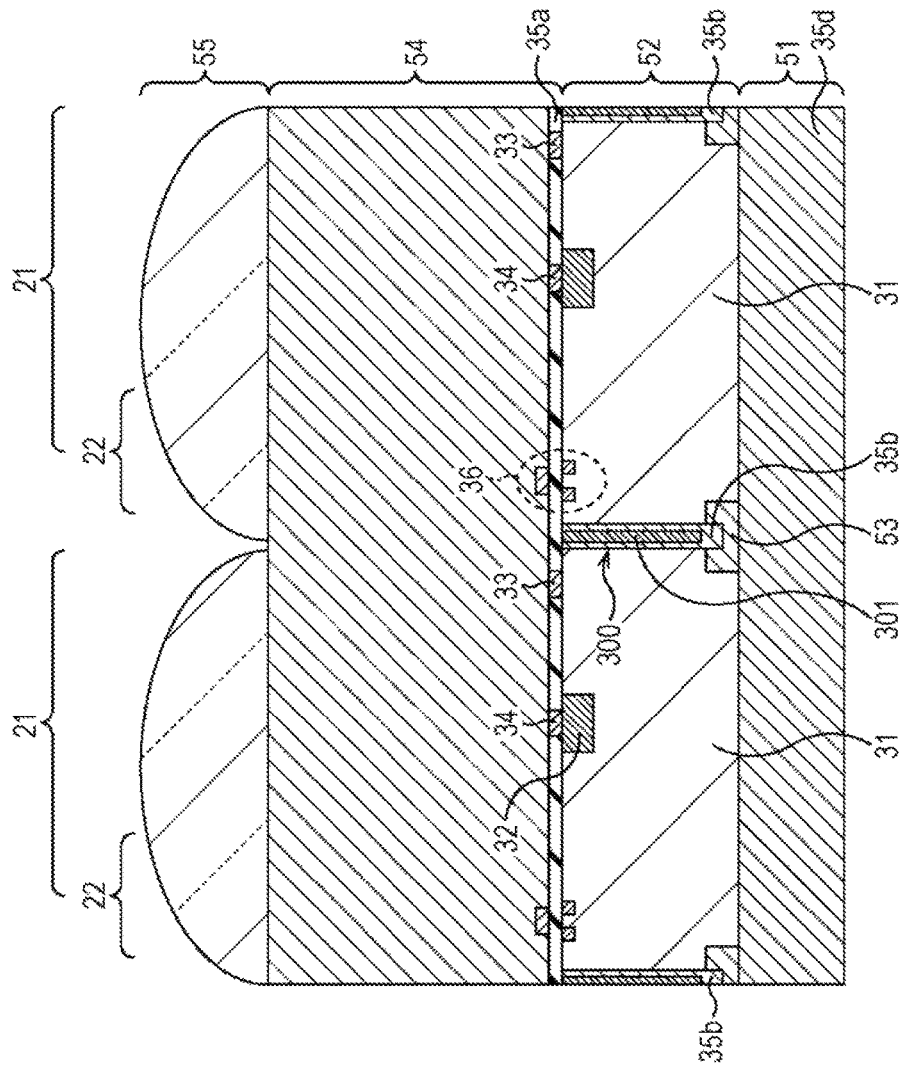
FIG. 13 is a cross-sectional view illustrating a third configuration example when the photovoltaic type pixel of FIG. 6 is applied to a surface irradiation type imaging device.

Next, FIG. 13 illustrates a modified example (hereinafter, referred to as a third configuration example) of the second configuration example. In the third configuration example, an element isolation region 35b is configured of a $SiO_2$ layer 300, a metal layer 301 that is embedded inside the $SiO_2$ layer 300 and is separated from a P-type region 31 by the $SiO_2$ layer 300, and an N-type region 53. Since the metal layer 301 functions as a reflecting mirror with respect to the incident light and light leakage from the P-type region 31 to the adjacent pixel is suppressed, crosstalk is further suppressed and the sensitivity is also improved.

The third configuration example illustrated in FIG. 13 can be manufactured by replacing $SiO_2$ as the material that is embedded after Si of the etching surface is thermally oxidized to a metal such as W or Al in the manufacturing method of the second configuration example described above.

Figure 14:
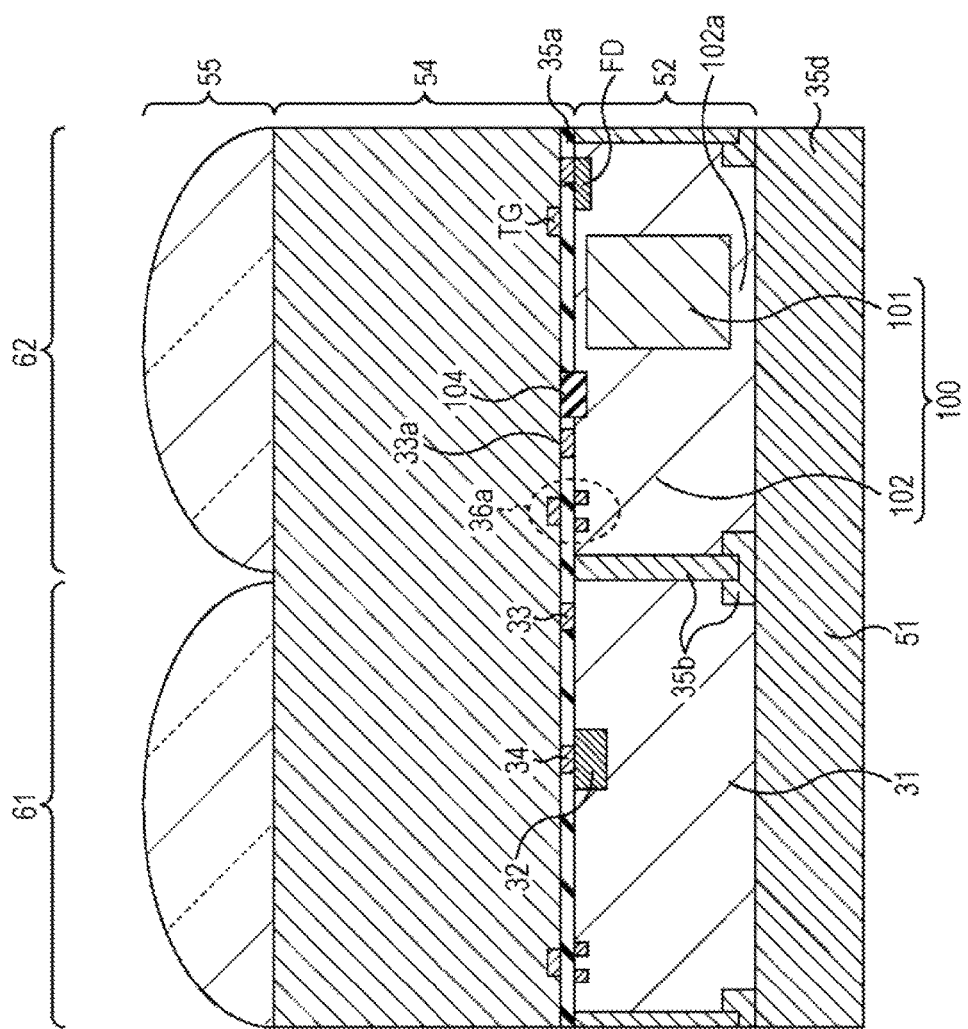
FIG. 14 is a cross-sectional view illustrating a fourth configuration example when the photovoltaic type pixel of FIG. 6 is applied to a surface irradiation type imaging device.

Next, FIG. 14 is a cross-sectional view of still another configuration example (hereinafter, referred to as a fourth configuration example) in which the photovoltaic type pixel 10 of the first embodiment is applied to the surface irradiation type imaging device.

In the fourth configuration example, a photovoltaic type pixel 61 (corresponding to the photovoltaic type pixel 10) and an accumulation type pixel 62 are disposed in photoelectric conversion regions adjacent to each other across an element isolation region 35b.

Moreover, the photovoltaic type pixel 61 of FIG. 14 is the same as the second configuration example illustrated in FIG. 12, but may employ the first configuration example illustrated in FIG. 10, the modified example illustrated in FIG. 11, or the third configuration example illustrated in FIG. 13. On the other hand, for the portion of the accumulation type pixel 62, it is possible to apply the existing configuration as illustrated in FIG. 14.

As illustrated in the view, a PN junction region of the photovoltaic type pixel 61 is substantially surrounded by the element isolation regions 35a, 35b, and 35d, but it is not necessary to surround a portion between the photoelectric conversion region 100 of the accumulation type pixel 62 and the photoelectric conversion region of the adjacent accumulation type pixel 62 by the element isolation region 35b.

For the manufacturing method of the fourth configuration example, the manufacturing process of the first configuration example illustrated in FIG. 1 may be added to the manufacturing method of the existing accumulation type pixel 62.

Figure 15:
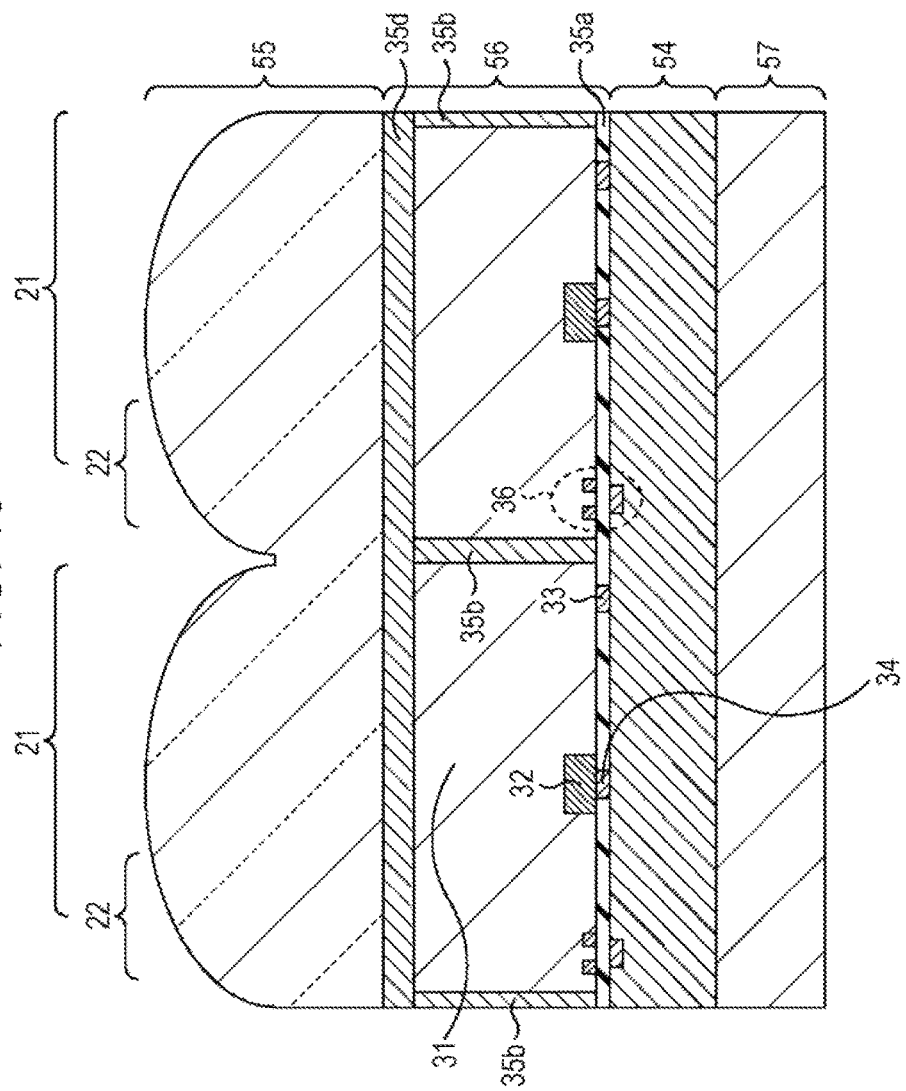
FIG. 15 is a cross-sectional view illustrating a fifth configuration example when the photovoltaic type pixel of FIG. 6 is applied to a back surface irradiation type imaging device.

Next, FIG. 15 is a cross-sectional view of a configuration example (hereinafter, referred to as a fifth configuration example) in which the photovoltaic type pixel 10 of the first embodiment is applied to a back surface irradiation type imaging device.

In the fifth configuration example, a photoelectric conversion region 21 and a pixel circuit region 22 are formed on the same substrate (sensor substrate 56). Each photoelectric conversion region 21 is substantially surrounded by the element isolation regions 35a, 35b, and 35d, and the element isolation regions 35a to 35d are formed of $SiO_2$.

A manufacturing method of the fifth configuration example will be described. First, a circuit substrate 57 in which a signal processing circuit and the like are formed and the sensor substrate 56 in which the pixel (photovoltaic type pixel) is formed are attached to each other by a wiring layer 54, and the back surface of the sensor substrate 56 is polished to a predetermined thickness. Next, a region of the sensor substrate 56 that forms the element isolation region 35b is etched from the back surface side and $SiO_2$ 35b is embedded, and then the element isolation region 35b is formed. Furthermore, a $SiO_2$ oxide film is formed on the back surface of the sensor substrate 56 as the element isolation region 35d, and, finally, a condensing layer 55 is laminated.

Moreover, for the polishing of the sensor substrate 56, for example, it is possible to apply a combination of mechanical polishing and a CMP method using an existing polishing material. For the etching of the sensor substrate 56, for example, it is possible to apply a reactive ion-etching method. For the embodiment of $SiO_2$. it is possible to apply a chemical vapor deposition method. Moreover, $SiO_2$ and metal may be embedded similar to the third configuration example illustrated in FIG. 13, instead of embedding $SiO_2$.

Figure 16:
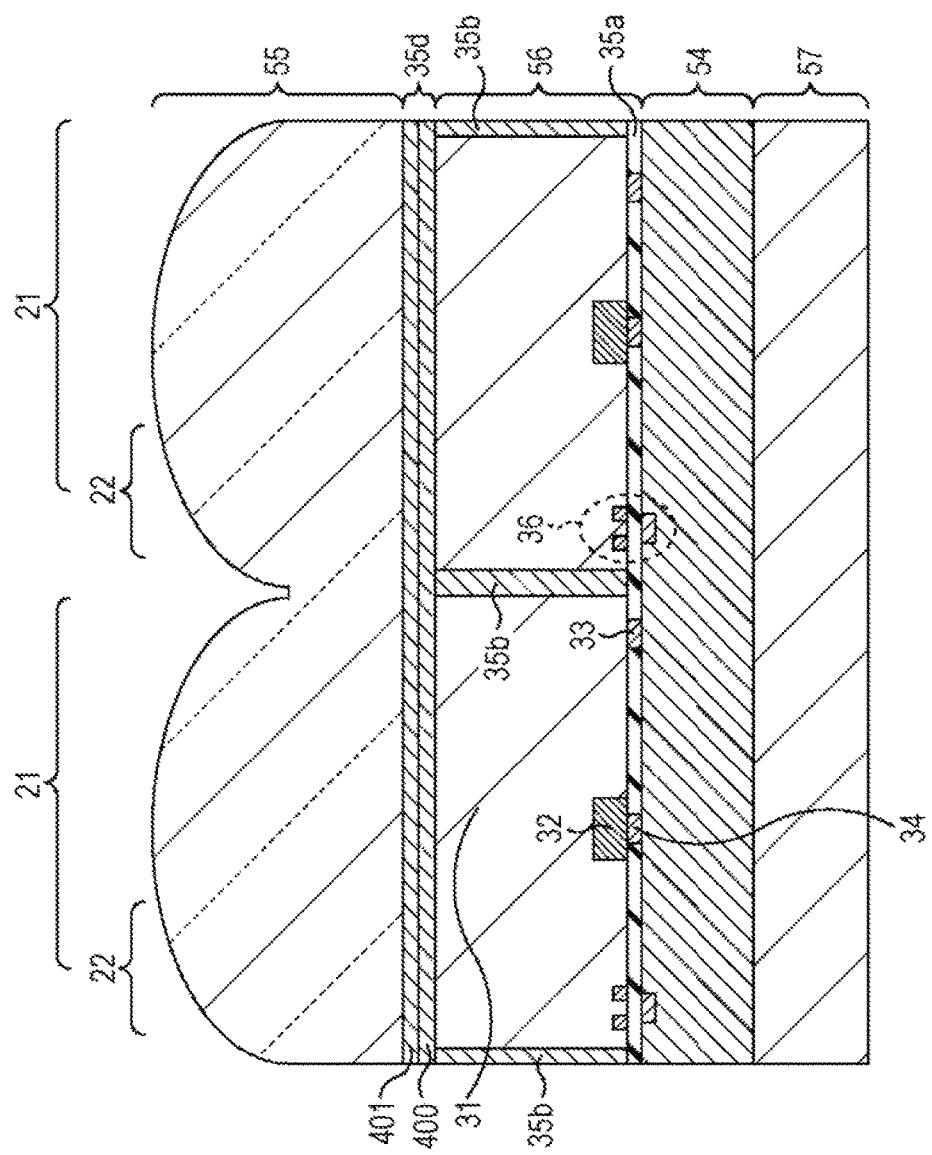
FIG. 16 is a cross-sectional view illustrating a first modified example of the fifth configuration example illustrated in FIG. 15.

In the fifth configuration example illustrated in FIG. 15, as a first modified example illustrated in FIG. 16, the element isolation region 35d is configured of a $SiO_2$ layer 400 and a thin film 401 of HfO laminated thereon, and hole concentration in the vicinity of the interface of the $SiO_2$ layer 400 and a P-type region 31 may be increased. Furthermore, as a second modified example illustrated in FIG. 17, acceptor impurities are introduced into the P-type region 31 in the vicinity of the $SiO_2$ layer 400 and a P-type region 402 of hole concentration higher than that of the P-type region 31 may be formed.

Figure 18:
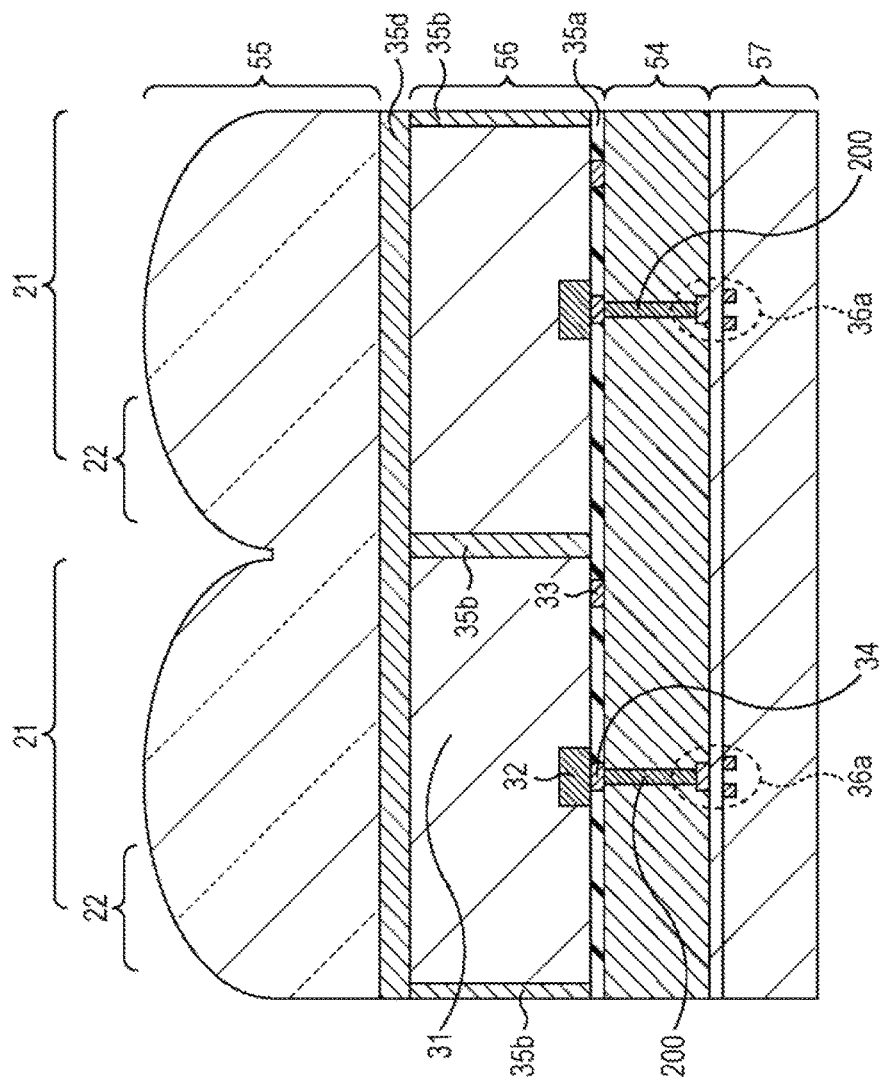
FIG. 18 is a cross-sectional view illustrating a sixth configuration example when the photovoltaic type pixel of FIG. 6 is applied to a back surface irradiation type imaging device.

Next, FIG. 18 is a cross-sectional view of another configuration example (hereinafter, referred to as a sixth configuration example) of a case where the photovoltaic type pixel 10 that is the first embodiment is applied to the back surface irradiation type imaging device.

In the sixth configuration example, a photoelectric conversion region 21 and a pixel circuit region (MOS Tr. 36 and the like) are formed on other substrates (a sensor substrate 56 and a circuit substrate 57). Each photoelectric conversion region 21 is substantially surrounded by the element isolation regions 35a, 35b, and 35d, and the element isolation regions 35a, 35b, and 35d are formed of $SiO_2$.

An N-type region 32 generating a photovoltaic power is connected to a gate of a MOS Tr. 36a of the circuit substrate 57 by an electrode 34 and a wiring 200.

For a manufacturing method of the sixth configuration example, it is possible to use the manufacturing method of the fifth configuration example illustrated in FIG. 15.

Moreover, in the sixth configuration example, a case where the sensor substrate 56 and the circuit substrate 57 are attached to each other by the wiring layer 54 is illustrated, but the electrode on the sensor substrate 56 and the electrode on the circuit substrate 57 may be bump-connected to each other by using mounting technology and a configuration of a so-called hybrid sensor may be employed.

Figure 19:
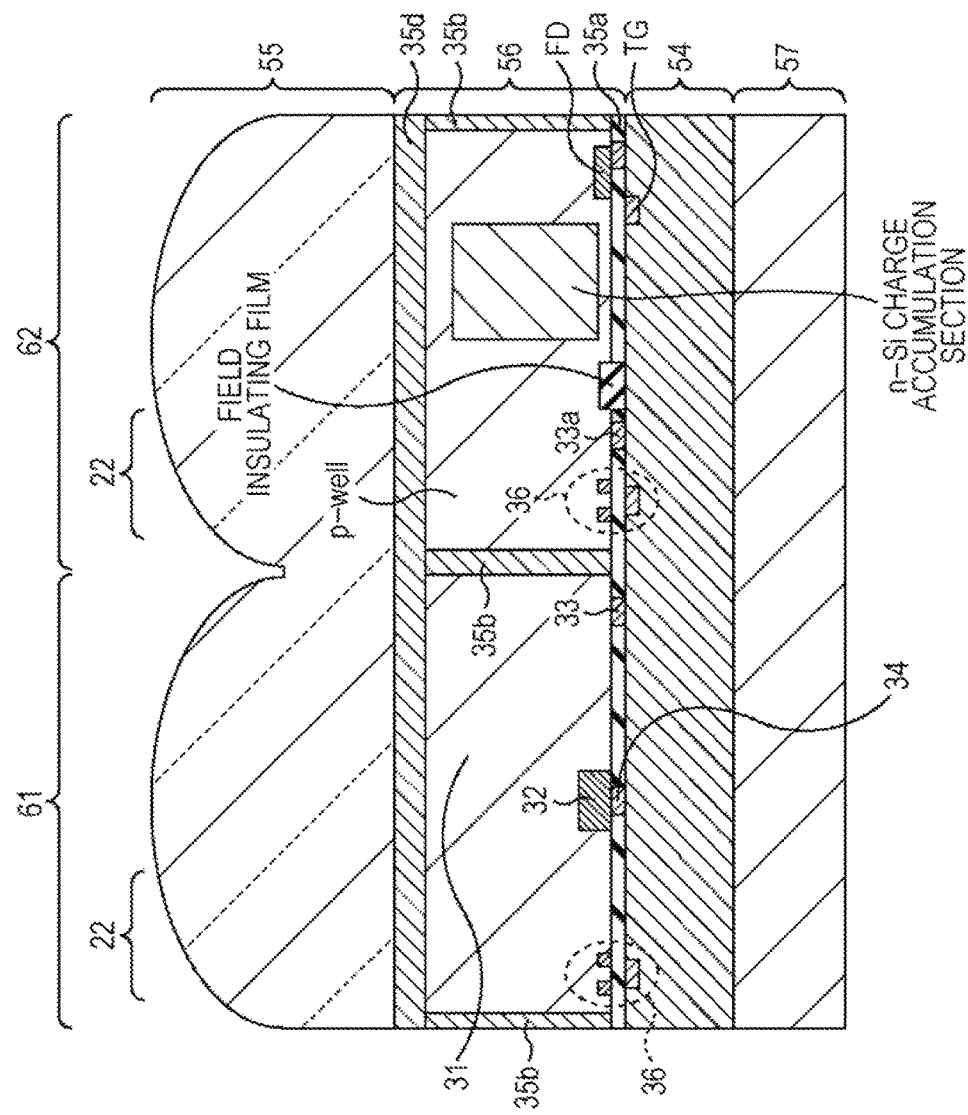
FIG. 19 is a cross-sectional view illustrating a seventh configuration example when the photovoltaic type pixel of FIG. 6 is applied to a back surface irradiation type imaging device.

Next, FIG. 19 is a cross-sectional view of still another configuration example (hereinafter, referred to as a seventh configuration example) in which the photovoltaic type pixel 10 of the first embodiment is applied to the back surface irradiation type imaging device. In the seventh configuration example, a photovoltaic type pixel 61 (corresponding to the photovoltaic type pixel 10) and an accumulation type pixel 62 are disposed in adjacent photoelectric conversion regions.

Moreover, the photovoltaic type pixel 61 in the seventh configuration example is the same as the fifth configuration example illustrated in FIG. 15, but may employ the sixth configuration example illustrated in FIG. 18. On the other hand, for the portion of the accumulation type pixel 62, it is possible to apply the existing configuration as illustrated in FIG. 19.

Figure 20:
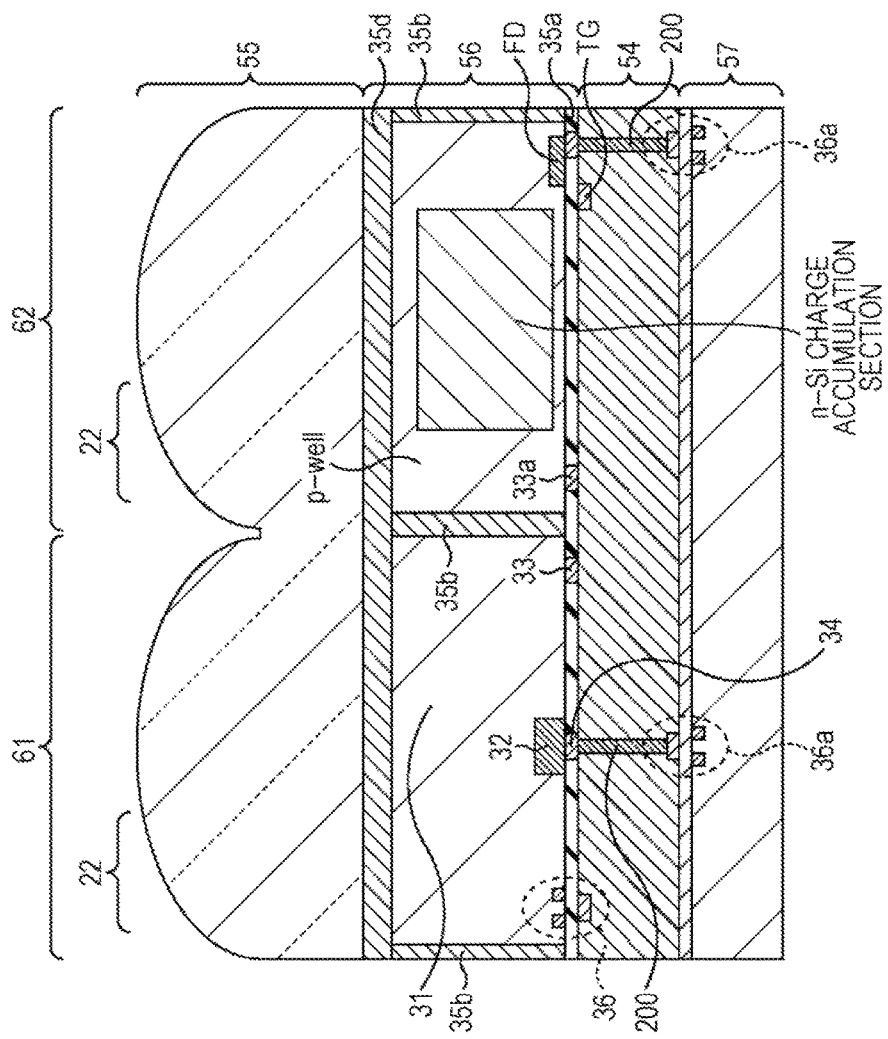
FIG. 20 is a cross-sectional view illustrating a modified example of the seventh configuration example of FIG. 19.

FIG. 20 is a cross-sectional view of still further another configuration example (hereinafter, referred to as an eighth configuration example) in which the photovoltaic type pixel 10 that is the first embodiment is applied to the back surface irradiation type imaging device. In the eighth configuration example, similar to the seventh configuration example, a photovoltaic type pixel 61 (corresponding to the photovoltaic type pixel 10) and an accumulation type pixel 62 are disposed in adjacent photoelectric conversion regions. Furthermore, similar to the sixth configuration example, a photoelectric conversion region 21 and a pixel circuit region (MOS Tr. 36 and the like) are formed on other substrates (a sensor substrate 56 and a circuit substrate 57) and an N-type region 32 generating the photovoltaic power and a FD of the accumulation type pixel 62 are respectively connected to a gate of a MOS Tr. 36a of a circuit substrate 57 by an electrode 34 and a wiring 200.

Figure 3:
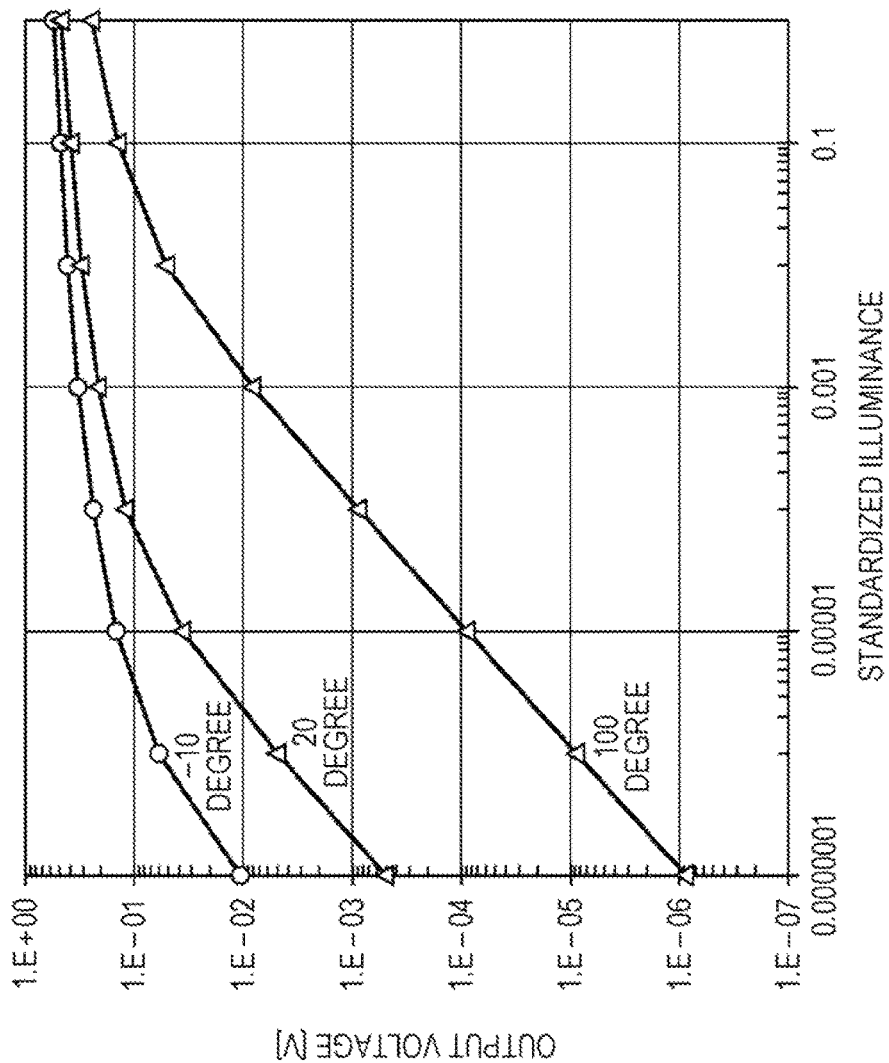
FIG. 3 is a view illustrating a voltage generated at each temperature for the same illuminance.
Figure 4:
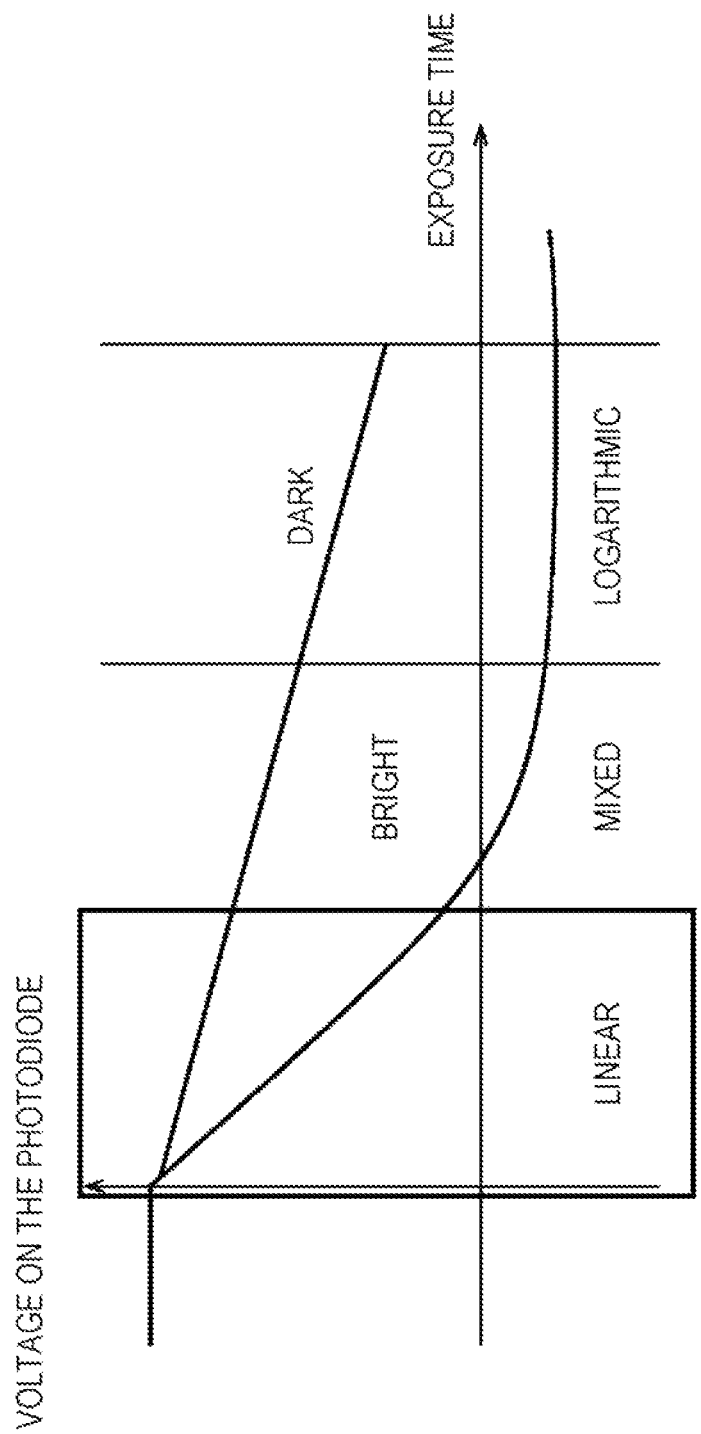
FIG. 4 is a view illustrating a relationship between irradiation time of a photovoltaic type pixel and an output voltage.
Figure 5:
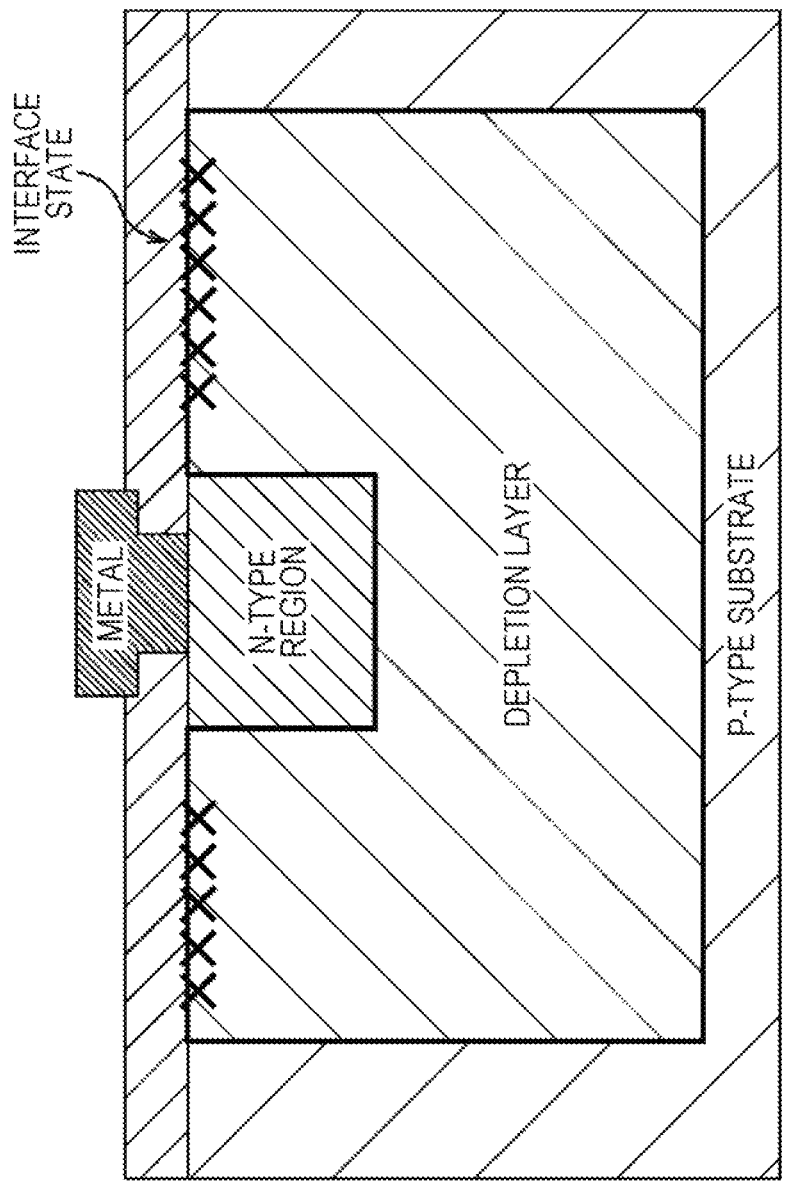
FIG. 5 is a view illustrating spread of a depletion layer generated in a photo-sensor in a reverse bias.
Figure 21:
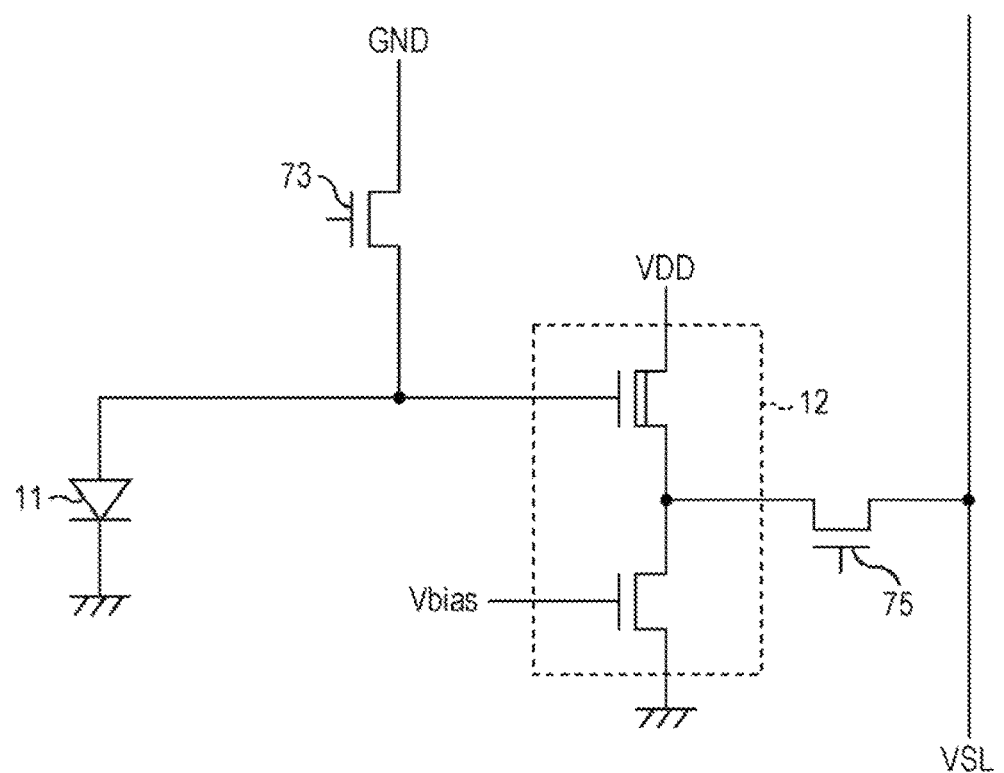
FIG. 21 is an equivalent circuit diagram of the first to seventh configuration examples.

Each configuration example of the photovoltaic type pixel 10 that is the first embodiment described above can be configured of a known circuit (for example, a circuit of FIG. 1 of PTL 1, circuits of FIGS. 3a and 3b of PTL 2, and the like). Of course, as illustrated in FIG. 21, a positive potential generated in a P-type region of a PN junction diode is taken out as a signal and may be deformed so as to be applied to a gate of a depletion type MOSFET configuring an amplifier 12.

Figure 22:
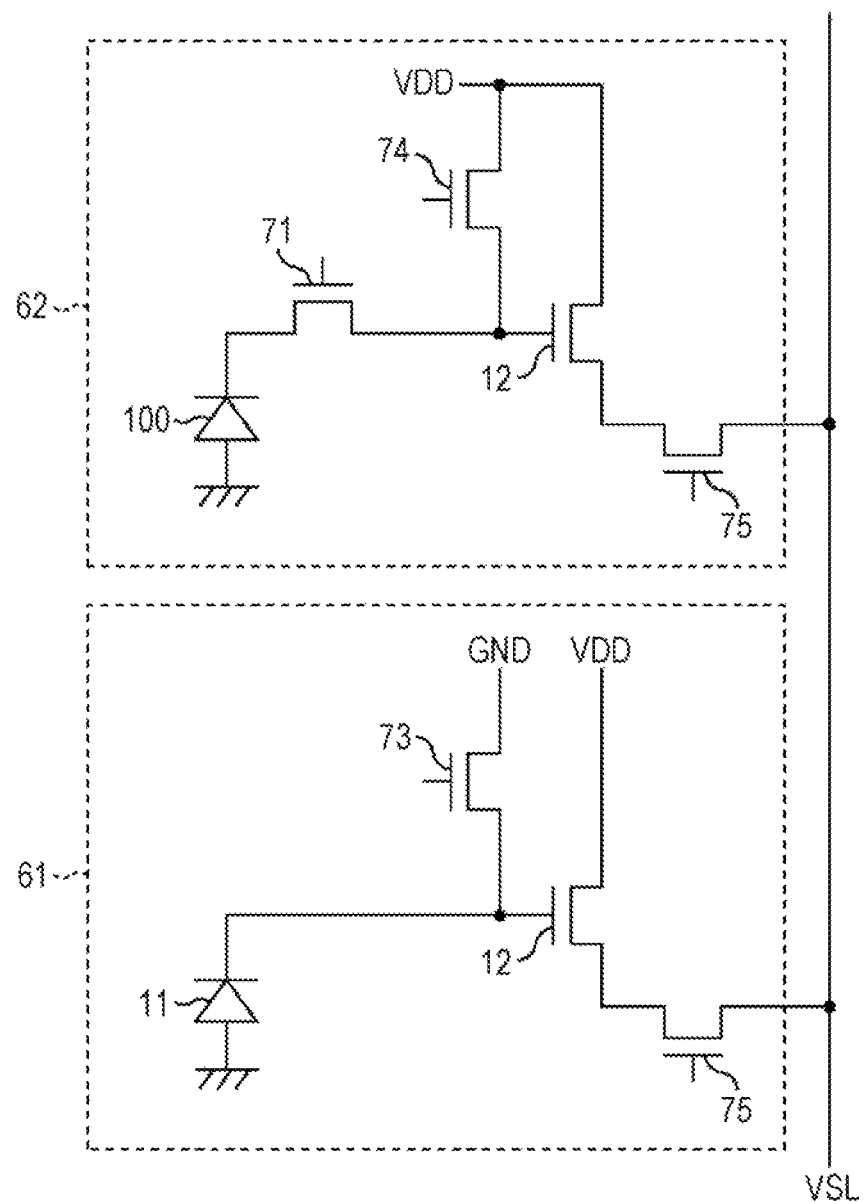
FIG. 22 is a view illustrating a configuration example of an imaging device in which the photovoltaic type pixel and the accumulation type pixel are connected to the same vertical signal line.

FIG. 22 illustrates a configuration example of an imaging device in which a photovoltaic type pixel 61 and an accumulation type pixel 62 are connected to the same vertical signal line. In the configuration example, it is possible to mix both by disposing both in the same imaging device without increasing the number of the vertical signal lines and without sacrificing an aperture ratio in the surface irradiation type.

Figure 23:
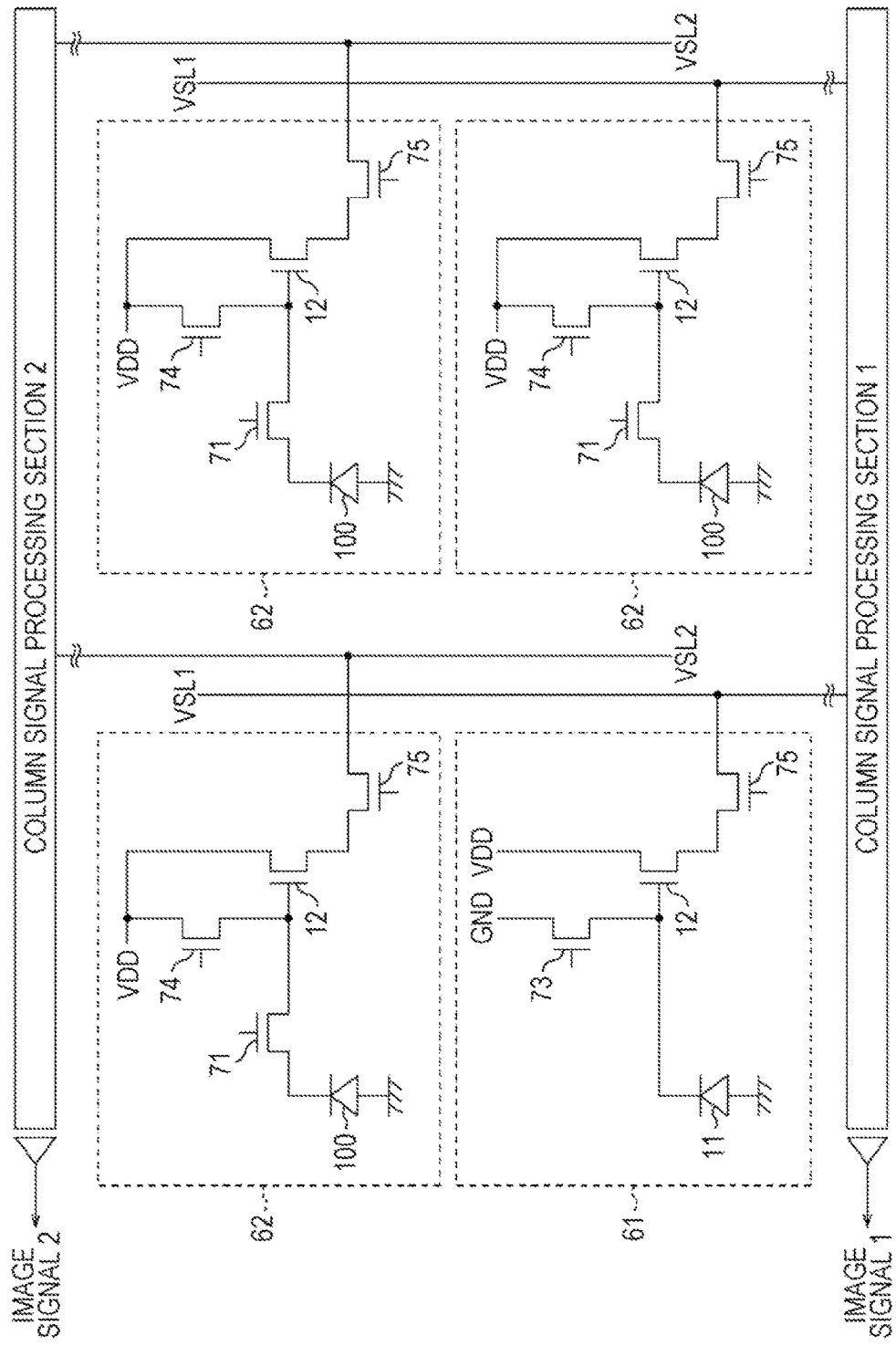
FIG. 23 is a view illustrating a configuration example of an imaging device in which the photovoltaic type pixel and the accumulation type pixel are respectively connected to different vertical signal lines.

FIG. 23 illustrates a configuration example of an imaging device in which a photovoltaic type pixel 61 and an accumulation type pixel 62 are respectively connected to other vertical signal lines. In the configuration, since pixel signals of the photovoltaic type pixel 61 and the accumulation type pixel 62 can be output simultaneously to a column signal processing section, it is possible to obtain a higher frame rate. Furthermore, since a column signal processing circuit can be optimally designed depending on each output voltage range, it is possible to reduce circuit noise with respect to each pixel signal and to obtain good image quality.

Next, FIG. 24 illustrates an example of a drive timing of the photovoltaic type pixel 61.

When an exposure period is started, a Reset 73 in the exposure period is turned off. As a result, the PN junction diode 11 is opened, a generated photocurrent is cancelled by a forward current of the PN junction diode 11, and a forward voltage is generated so that a net DC current is zero.

When an exposure period ends, a control signal for a reading row SEL 75 is turned on and a forward voltage VSG 1 of a PN junction diode. 11 that is amplified by the amplifier 12 is output to the vertical signal line. The pixel output that is output is AD-converted and becomes a digital output value of a VSG 1.

Next, a Reset 73 is turned on and an output voltage (voltage when dark) VDK 2 when the PN junction diode 11 is shorted is output to the vertical signal line. The pixel output that is output is AD-converted and becomes a digital output value of the VDK 2. A value obtained by subtracting the digital output value of the VSG 1 and the VDK 2 is a digital output value of the pixel.

Moreover, as the voltage when dark, the output voltage VDK 1 before the exposure period may be read. It is possible to perform two reading methods of step 1 and step 2 in the photovoltaic type pixel 61 by reading the VDK 1 before the exposure period or reading the VDK 2 after the exposure period. In the following description, step 2 is employed (step in which the signal voltage VSG 1 and the voltage VDK 2 when dark are sequentially read after the exposure period).

It is possible to employ the drive timing of the accumulation type pixel that is known in the related art as illustrated in FIG. 25 in the drive timing of the accumulation type pixel 62 disposed together with the photovoltaic type pixel 61 on the same imaging device.

Figure 26A:
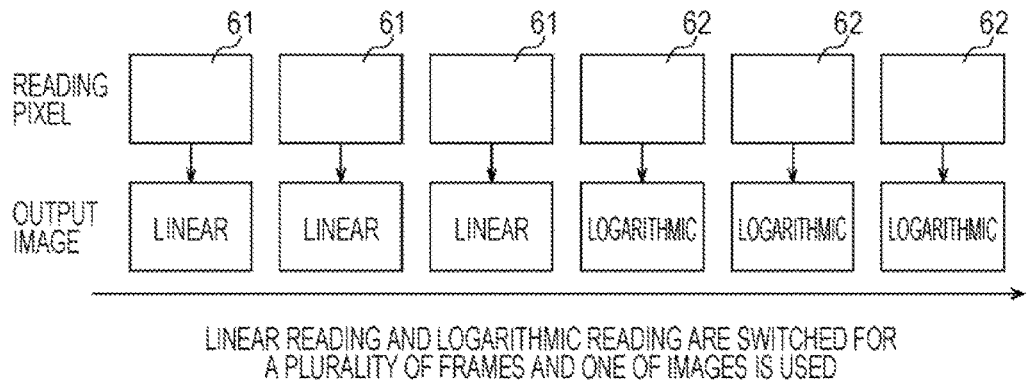
FIGS. 26A-26C illustrate examples of three types of an output image of an imaging device on which the photovoltaic type pixel and the accumulation type pixel are mounted.
Figure 26B:
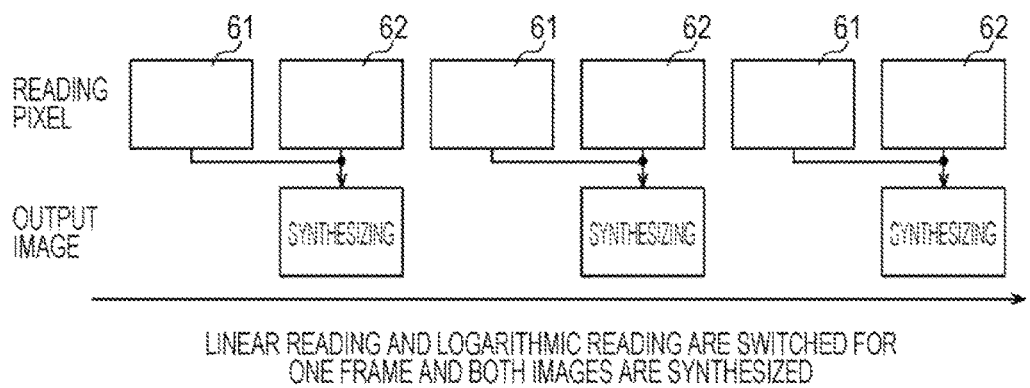
Figure 26C:
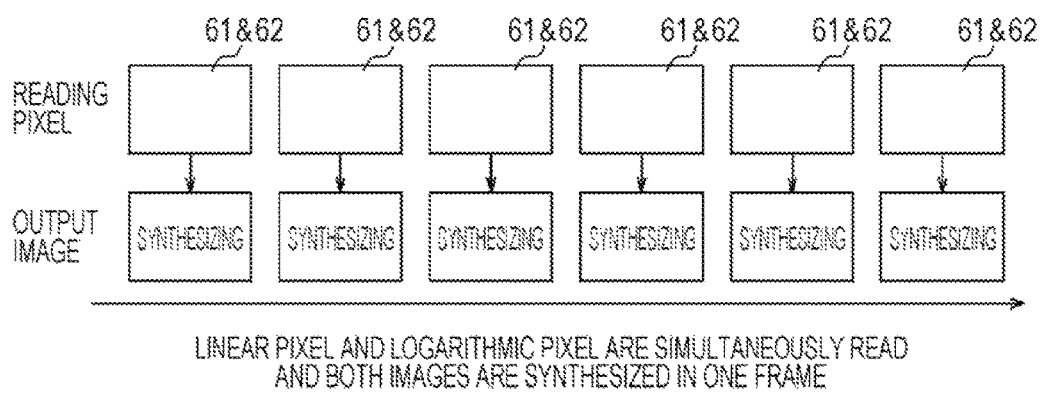

Next, FIGS. 26A to 26C illustrate examples of three types of output image from the imaging device on which the photovoltaic type pixel 61 and the accumulation type pixel 62 are mounted.

In FIG. 26A, an output image is arranged in time series in a case where only one of the photovoltaic type pixel 61 and the accumulation type pixel 62 over a plurality of frames (here, only each three frames are illustrated before and after switching the output image from a linear image to a logarithmic image) is read. Such an image output order can be obtained by switching the drive timing of FIGS. 24 and 25 for a plurality of frames. Moreover, here, an image configured of the photovoltaic type pixel output is referred to as the logarithmic image and an image configured of the accumulation type pixel output is referred to as the linear image.

In FIG. 26B, a reading pixel and an output image are arranged in time series in a case where the photovoltaic type pixel 61 and the accumulation type pixel 62 are alternately read and the logarithmic image and the linear image are synthesized and output for one frame. Such an image output order can be obtained by switching the drive timings of FIGS. 24 and 25 for one frame and synthesizing the logarithmic image and the linear image by a known method. It is possible to obtain good low illuminance sensitivity and SIN by using the signal of the accumulation type pixel in a low luminance portion in the image and to obtain a tone and color reproduction with a higher luminance by using the signal of the logarithmic type pixel in a high luminance portion exceeding a dynamic range of the accumulation pixel.

In FIG. 26C, a reading pixel and an output image are arranged in time series in a case where both the photovoltaic type pixel 61 and the accumulation type pixel 62 are read and the logarithmic image and the linear image are synthesized and output for one frame. In this case, since exposure times of the photovoltaic type pixel 61 and the accumulation type pixel 62 overlap and imaging timings of the linear image and the logarithmic image approach each other, it is possible to suppress generation of artifacts caused by imaging time difference in a synthesized image. Furthermore, it is possible to output the synthesized image at a frame rate higher than that of a case of FIG. 26B.

Figure 27:
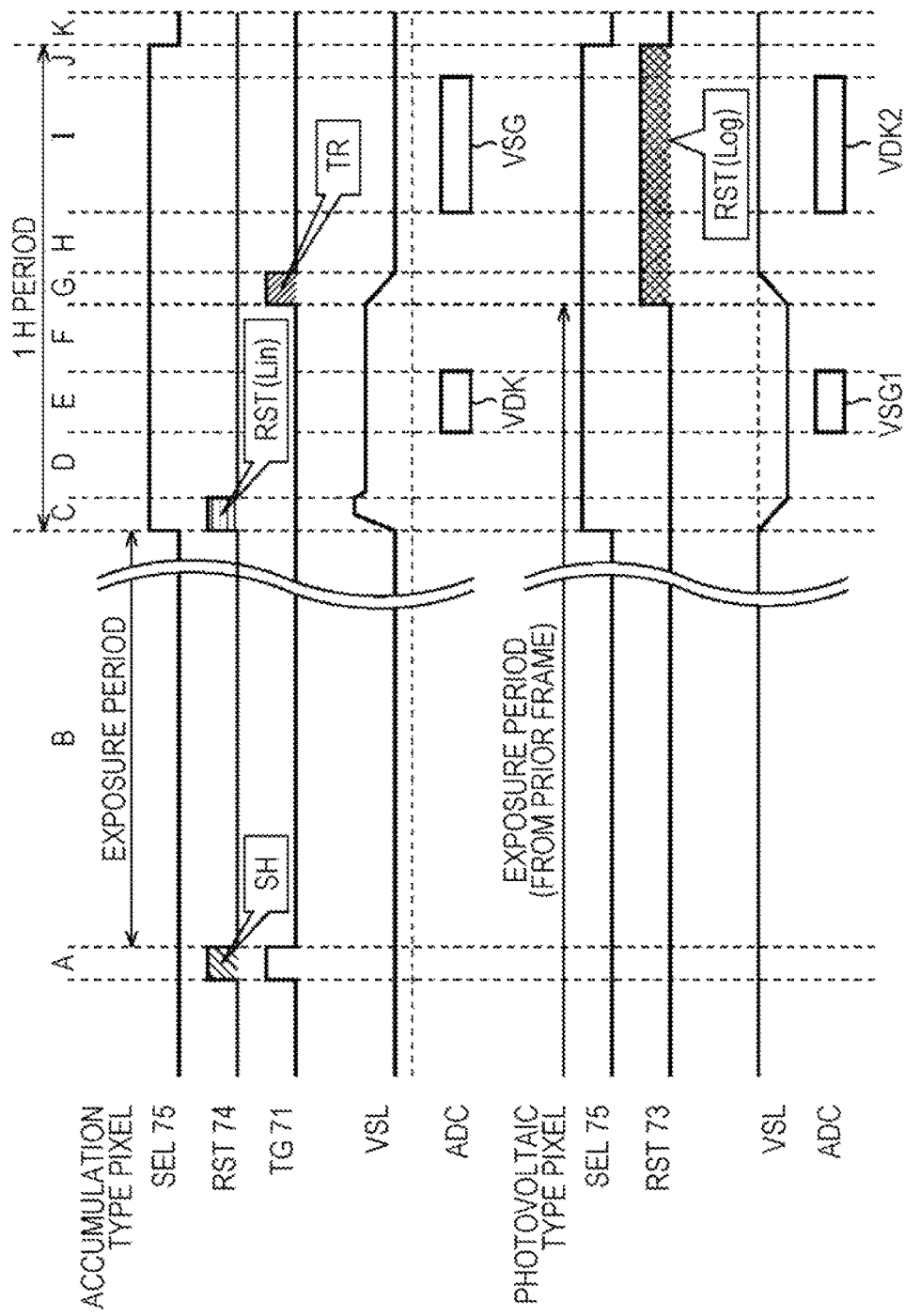
FIG. 27 is a view illustrating an example of a drive timing for obtaining an output image illustrated in FIG. 26C.

FIG. 27 illustrates an example of a drive timing of the photovoltaic type pixel 61 and the accumulation type pixel 62 in one frame period for obtaining the output image illustrated in FIG. 26C.

In the accumulation type pixel 62, in the period A, a shutter row SEL 75, a RST 74, and a TG 71 are turned on and charges of the charge accumulation region (PD) and a floating diffusion layer (FD) are swept so that an electronic shutter is turned off. In the next period B, the signal charge is accumulated in the PD. Furthermore, in a period C, a reading row SEL 75 and the RST 74 are turned on and the charge inside the FD is swept again and in a period E, a voltage (P phase voltage) VDK when dark is read. Furthermore, in a period G, the TG 71 is turned on and the charge accumulated in the PD is transferred to the FD, the signal voltage is generated in the FD, and in a period I, a signal voltage VSG amplified by the amplifier 12 is read.

Meanwhile, in the photovoltaic type pixel 61 formed in the same row as the accumulation type pixel 62, exposure is started from a period K of the previous frame and the photovoltaic power is generated in the PN junction diode 11. Next, in the period C, the reading row SEL 75 is turned on and the photovoltaic power generated in the PN junction diode 11 is amplified by the amplifier 12 and then is output to the vertical signal line, and is read as the signal voltage VSG 1. Substantially, in periods G, H, I, and J, the RST 73 is turned on, the PN junction diode 11 is shorted, and in the period I, the voltage VDK 2 when dark is read.

Figure 28:
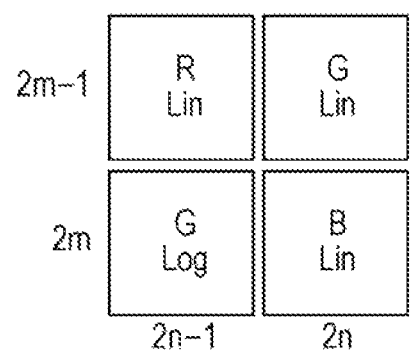
FIG. 28 is a view illustrating an example of an arrangement of the photovoltaic type pixel and the accumulation type pixel.

Next, FIG. 28 illustrates an example of an arrangement of the photovoltaic type pixel 61 and the accumulation type pixel 62 for 2×2 pixels in the imaging device. Moreover, in FIG. 28, R (Red), G (Green), and B (Blue) respectively illustrate a color of a color filter covering each pixel, Log illustrates the photovoltaic type pixel 61, and Lin illustrates the accumulation type pixel 62.

Figure 29:
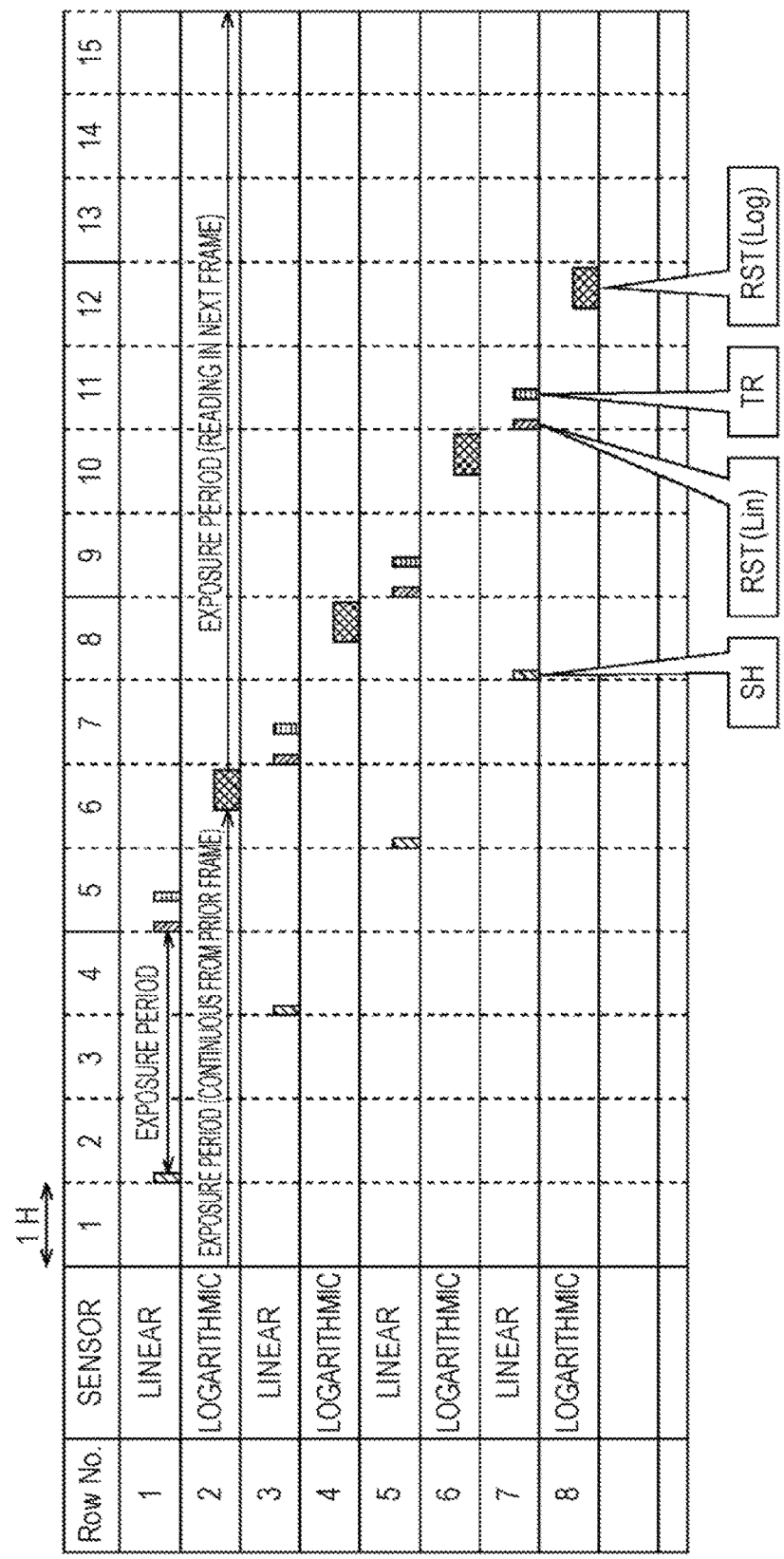
FIG. 29 is a view illustrating a drive timing corresponding to the arrangement example of FIG. 28.

FIG. 29 illustrates drive timings of the accumulation type pixel 62 of a (2n−1)-th column and a (2m−1)-th row, and the photovoltaic type pixel 61 of a (2n−1)-th column and a 2m-th row of FIG. 28.

In the (2n−1)-th column, the photovoltaic type pixel 61 and the accumulation type pixel 62 are alternately read for one row reading period (horizontal synchronization period and 1H period). Meanwhile, in the adjacent a 2n-th row (not illustrated), in all reading periods, the accumulation type pixel 62 is read. That is, the photovoltaic type pixel 61 and the accumulation type pixel 62 can be read simultaneously within one frame.

Since the photovoltaic type pixel 61 and the accumulation type pixel 62 are read at the same time when the common exposure period B ends, an exposure timing difference does not occur between the photovoltaic type pixel 61 and the accumulation type pixel 62 of the same row. Thus, no image shift occurs between the logarithmic image and the linear image. As a result, when synthesizing both, occurrence of artifacts due to the image shift is suppressed and a synthesized image of good image quality can be obtained.

FIGS. 30A to 30F illustrate another example of the arrangement of the photovoltaic type pixel 61 and the accumulation type pixel 62 in the imaging device. Moreover, in FIGS. 30A to 30F, R, G, B, and W (colorless or complementary color) respectively illustrate color of the color filter covering each pixel, Log illustrates the photovoltaic type pixel 61, and Lin illustrates the accumulation type pixel 62.

FIG. 30A is an arrangement example in which one pixel is the photovoltaic type pixel 61 of G and another three pixels are the accumulation type pixels 62 in four pixels configuring a Bayer array.

FIG. 30B is an arrangement example in which the photovoltaic type pixel 61 of G in the arrangement illustrated in FIG. 30A is replaced by the photovoltaic type pixel 61 of W.

FIG. 30C is an arrangement example in which one pixel is the accumulation type pixel 62 of G and another three pixels are the photovoltaic type pixels 61 in four pixels configuring the Bayer array.

FIG. 30D is an arrangement example in which the accumulation type pixel 62 of G in the arrangement illustrated in FIG. 30C is replaced by the accumulation type pixel 62 of W.

FIG. 30E is an arrangement example in which all four pixels configuring the Bayer array are the photovoltaic type pixels 61.

FIG. 30F is an arrangement example in which one pixel of two photovoltaic type pixels 61 of G in the arrangement illustrated in FIG. 30E is replaced by the photovoltaic type pixel 61 of W.

As the arrangement examples illustrated in FIGS. 30A and 30C, it is possible to calibrate the pixel output value of the photovoltaic type pixel 61 with the output value of the accumulation type pixel 62 that is not saturated and to compensate for temperature characteristic variation of the photovoltaic type pixel 61 or characteristic variation for each pixel by closely disposing the accumulation type pixel 62 and the photovoltaic type pixel 61 of the same color. Thus, in the synthesized image of the linear image and the logarithmic image, it is possible to obtain a smooth tone or gradation in the boundary of the linear image and the logarithmic image.

Moreover, for example, in the arrangement example illustrated in FIG. 30B, even if output of one of three accumulation type pixels 62 of R, G, and B is saturated, it is possible to obtain a certain degree of color reproducibility and tone by using the output of remaining accumulation type pixels 62 and the output of the photovoltaic type pixel 61 that are not saturated.

As the arrangement examples illustrated in FIGS. 30B, 30D, and 30F, it is possible to increase the sensitivity of the photovoltaic type pixel 61 or the accumulation type pixel 62, and to obtain the logarithmic image in a lower illuminance and the linear image having good SIN by providing the pixel of W.

(2. Second Embodiment)

Next, a photovoltaic type pixel (hereinafter, referred to as an accumulation type and photovoltaic type pixel) that can also be operated as an accumulation type pixel, that is a second embodiment will be described.

Figure 31:
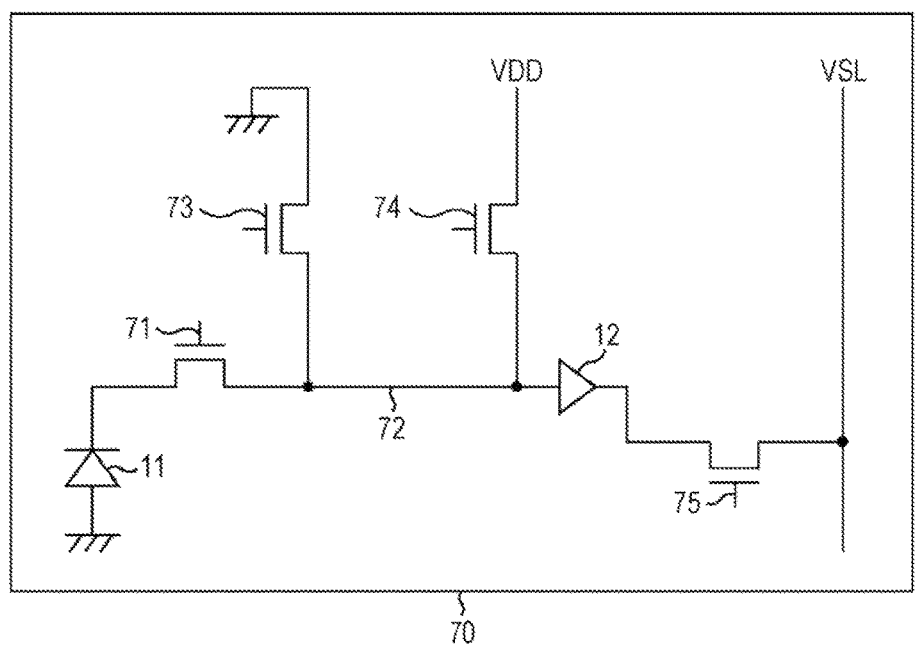
FIG. 31 is an equivalent circuit diagram of an accumulation type and photovoltaic type pixel that is a second embodiment of the present disclosure.

FIG. 31 illustrates an equivalent circuit of the accumulation type and photovoltaic type pixel according to the second embodiment. An accumulation type and photovoltaic type pixel 70 is configured of a PN junction diode 11, an amplifier 12, a TG 71, an FD 72, an RST 73, an RST 74, and an Sel 75.

The PN junction diode 11 is configured of a P-type region 31 and an N-type region (charge accumulation region) 32 (all in FIG. 19), and performs the photoelectric conversion depending on the incident light, and accumulates the signal charges generated as a result thereof or generates the photovoltaic power.

The TG 71 transfers the generated signal charges to the FD 72. Furthermore, the TG 71 transfers the generated photovoltaic power to the FD 72 by shorting the N-type region 32 in the FD 72 by a channel formed under the TG 71.

The FD 72 is the N-type region and converts the signal charges into the signal voltage. The RST 73 resets the FD 72 to a GND potential. The RST 74 resets the FD 72 to a VDD potential. The amplifier 12 amplifies the potential of the FD 72. The Sel 75 transfers an output signal of the amplifier 12 to a vertical signal line VSL.

Figure 32:
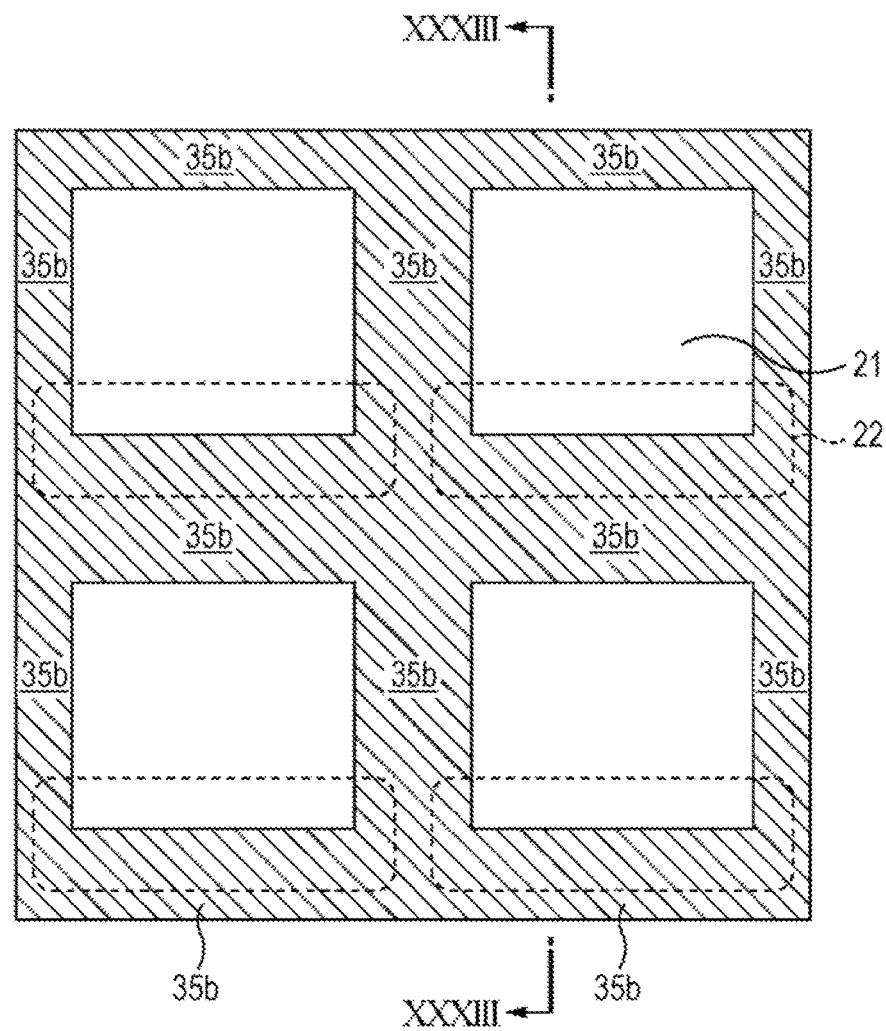
FIG. 32 is a top view of a pixel structure corresponding to the accumulation type and photovoltaic type pixel of FIG. 31.

FIG. 32 illustrates an arrangement view of an upper surface of 2×2 pixels of a pixel structure corresponding to the accumulation type and photovoltaic type pixel 70 of which the equivalent circuit is illustrated in FIG. 31. As illustrated in the drawing, the accumulation type and photovoltaic type pixel 70 has a photoelectric conversion region 21 which is substantially isolated by an element isolation region 35. The PN junction diode 11, the TG 71, and the FD 72 of FIG. 31 are formed in the photoelectric conversion region 21. The amplifier 12, the RST 73, the RST 74, the Sel 75, and the like are formed in the pixel circuit region 22 provided in an appropriate region overlapping with the photoelectric conversion region 21 or the element isolation region 35.

Figure 33:
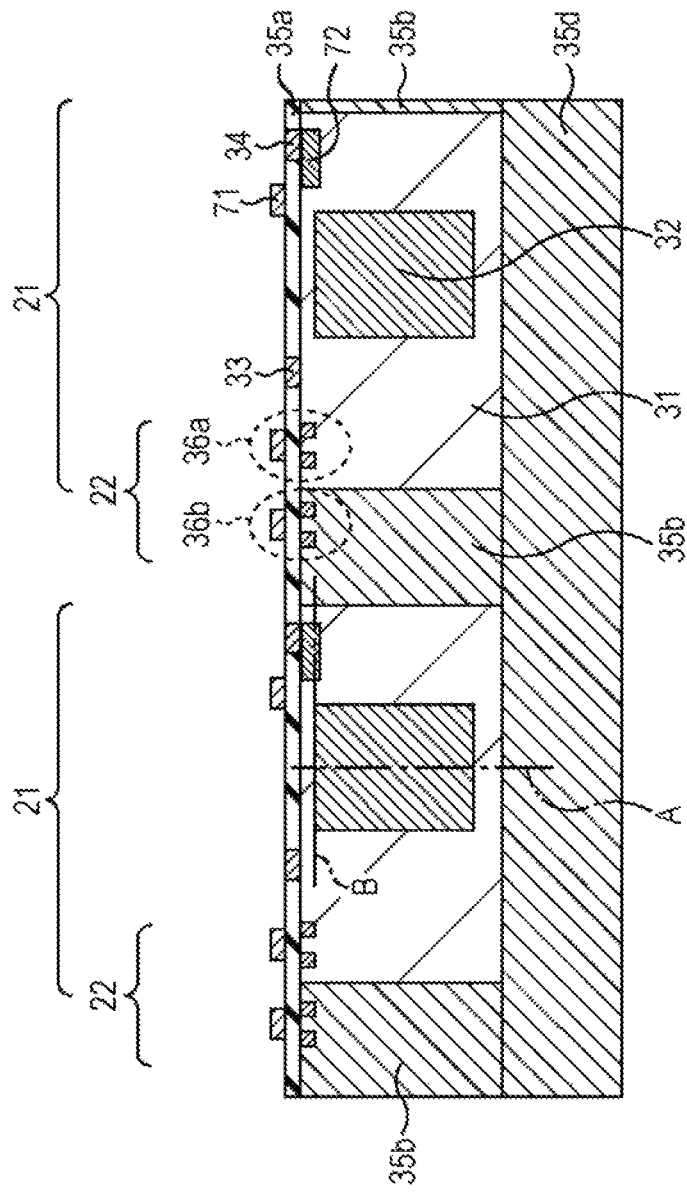
FIG. 33 is a cross-sectional view of the pixel structure corresponding to the accumulation type and photovoltaic type pixel of FIG. 31.

FIG. 33 illustrates a cross section of the pixel structure in line XXXIII-XXXIII of FIG. 32. As illustrated in the drawing, isolation between the photoelectric conversion region 21 and the photoelectric conversion region 21 is performed by the element isolation region 35.

As is apparent by comparing FIG. 32 and the cross-sectional views (FIGS. 8 and 9) of the photovoltaic type pixel 10 of the first embodiment, the accumulation type and photovoltaic type pixel 70 is structurally different from the photovoltaic type pixel 10 in that the FD 72 is provided inside thereof surrounded by the element isolation regions 35a, 35b, 35c, and 35d, the electrode (ohmic electrode) 34 is connected to the FD 72, and the TG 71 is provided for controlling the potential barrier between the FD 72 and the N-type region (charge accumulation region) 32.

Figure 34:
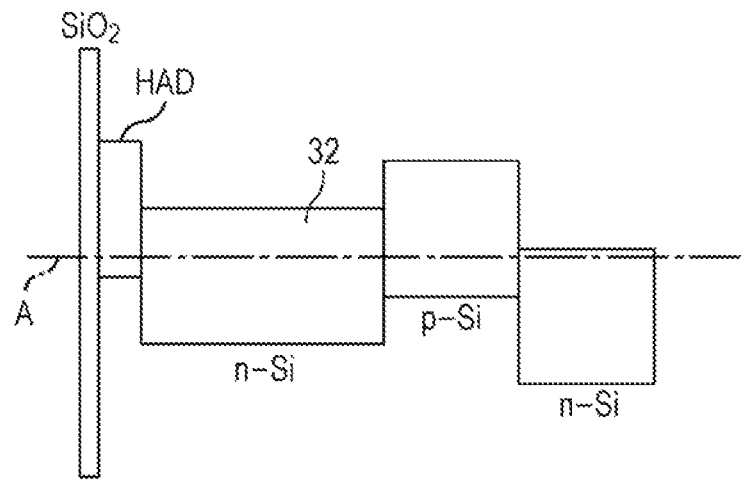
FIG. 34 is a view of a potential distribution of the accumulation type and photovoltaic type pixel of FIG. 31.
Figure 35:
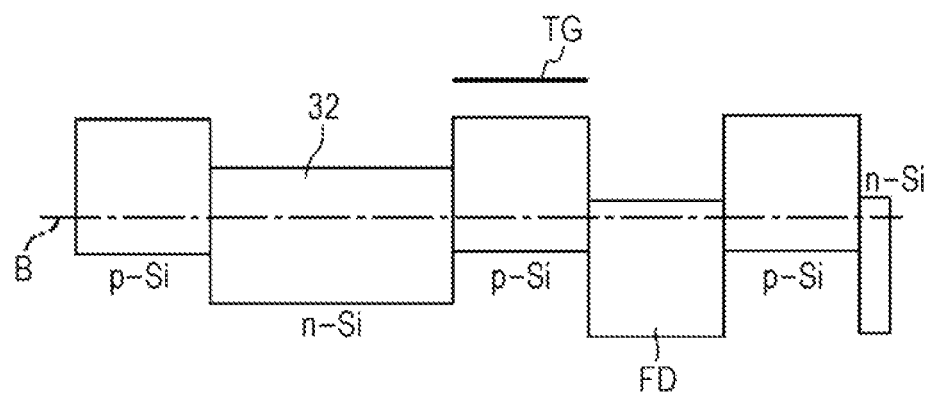
FIG. 35 is a view of the potential distribution of the accumulation type and photovoltaic type pixel of FIG. 31.

Next, FIGS. 34 and 35 are potential distribution views of the accumulation type and photovoltaic type pixel 70, FIG. 34 corresponds to line A of FIG. 33 and FIG. 35 corresponds to line B of FIG. 33. Moreover, in FIGS. 34 and 35, a case where the element isolation region 35a is $SiO_2$, and 35b and 35d are the N-type regions is illustrated. As illustrated in the drawing, it is preferable that a height of the potential barrier of the circumference of the N-type region (charge accumulation region) 32 of the accumulation type and photovoltaic type pixel 70 is substantially uniform in all directions and is distributed to a height of the potential of a P-type neutral region.

It is possible to operate the accumulation type and photovoltaic type pixel 70 illustrated in FIG. 31 as the accumulation type pixel or the photovoltaic type pixel due to this potential distribution.

(Specific Configuration Example of Accumulation Type and Photovoltaic Type Pixel 70 of Second Embodiment)

Figure 36:
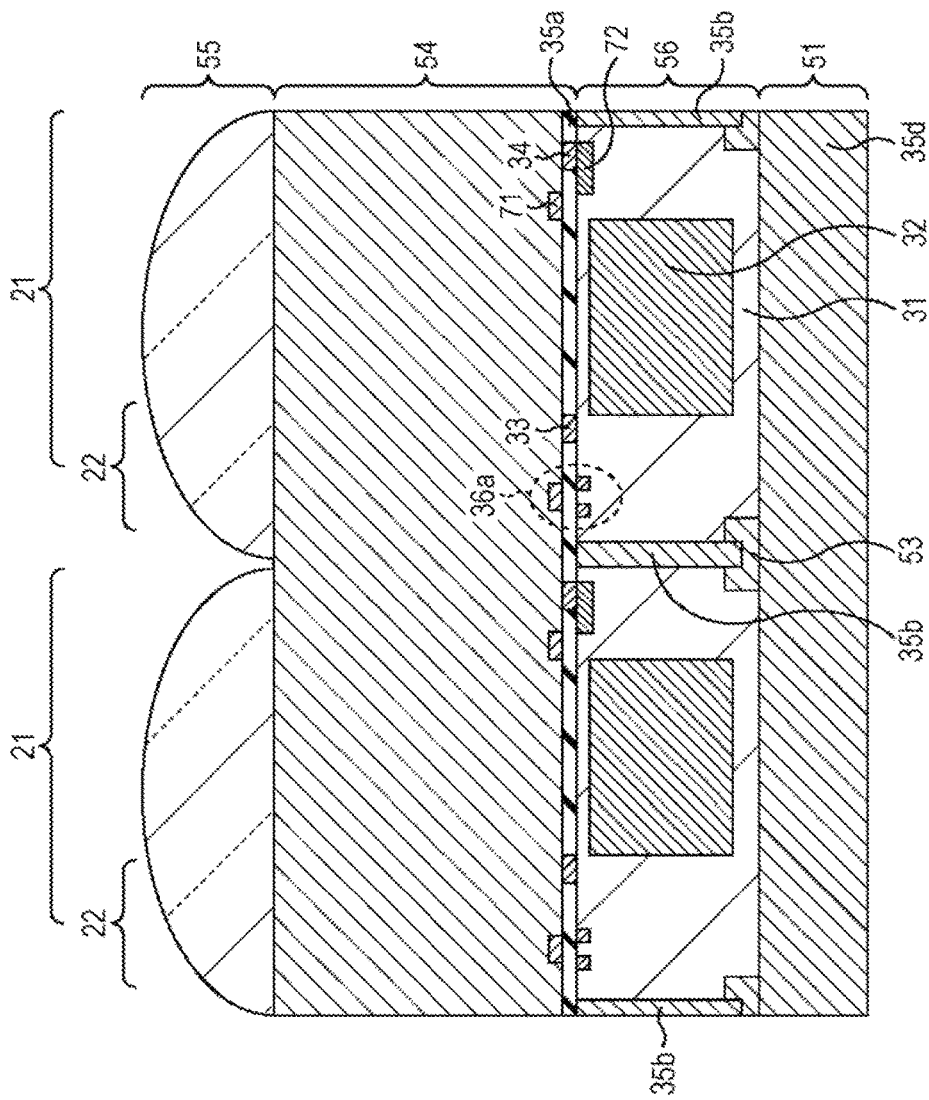
FIG. 36 is a cross-sectional view illustrating an eighth configuration example when the accumulation type and photovoltaic type pixel of FIG. 31 is applied to a surface irradiation type imaging device.

FIG. 36 is a cross-sectional view of a configuration example (hereinafter, referred to as an eighth configuration example) when the accumulation type and photovoltaic type pixel 70 of the second embodiment is applied to the surface irradiation type imaging device.

Moreover, element isolation regions 35a to 35d of the eighth configuration example use the same material as that of the element isolation regions 35a to 35d of the second configuration example illustrated in FIG. 12, but may be the same configuration as the element isolation regions 35a to 35d of the first configuration example illustrated in FIG. 11 or the third configuration example illustrated in FIG. 13.

A manufacturing method of the eighth configuration example will be described. It is possible to manufacture the eighth configuration example by slightly modifying the manufacturing method of the surface irradiation type and accumulation type pixel (for example, the accumulation type pixel 62 in the fourth configuration example illustrated in FIG. 14) of the related art as described below and by adding a forming process of the element isolation regions 35a to 35d.

An acceptor impurity is introduced into a region (a region between the N-type substrate 51 and the N-type region 32 in the P-type region 31) forming the overflow barrier in the accumulation type pixel of the related art so as to form the P-type neutral region. Therefore, when operating the eighth configuration example as the photovoltaic type pixel, it is possible to generate the same photovoltaic power as that of the photovoltaic type pixel of the first embodiment.

The acceptor impurity is introduced into the P-type region 31 or a film that generates negative fixed charges is embedded inside $SiO_2$ of the element isolation region 35b so that a hole concentration in the vicinity of the interface of the P-type region 31 and the element isolation region 35b is set so as to have a predetermined concentration or more. As the film generating the negative fixed charges, for example, it is possible to use a hafnium oxide film and as a film deposition method, it is possible to use a chemical vapor deposition method, a sputtering method, an atomic layer deposition method, and the like. Therefore, when operating the eighth configuration example as the accumulation type pixel, it is possible to reduce the dark current to the same level as that of the accumulation type pixel of the related art.

Figure 37:
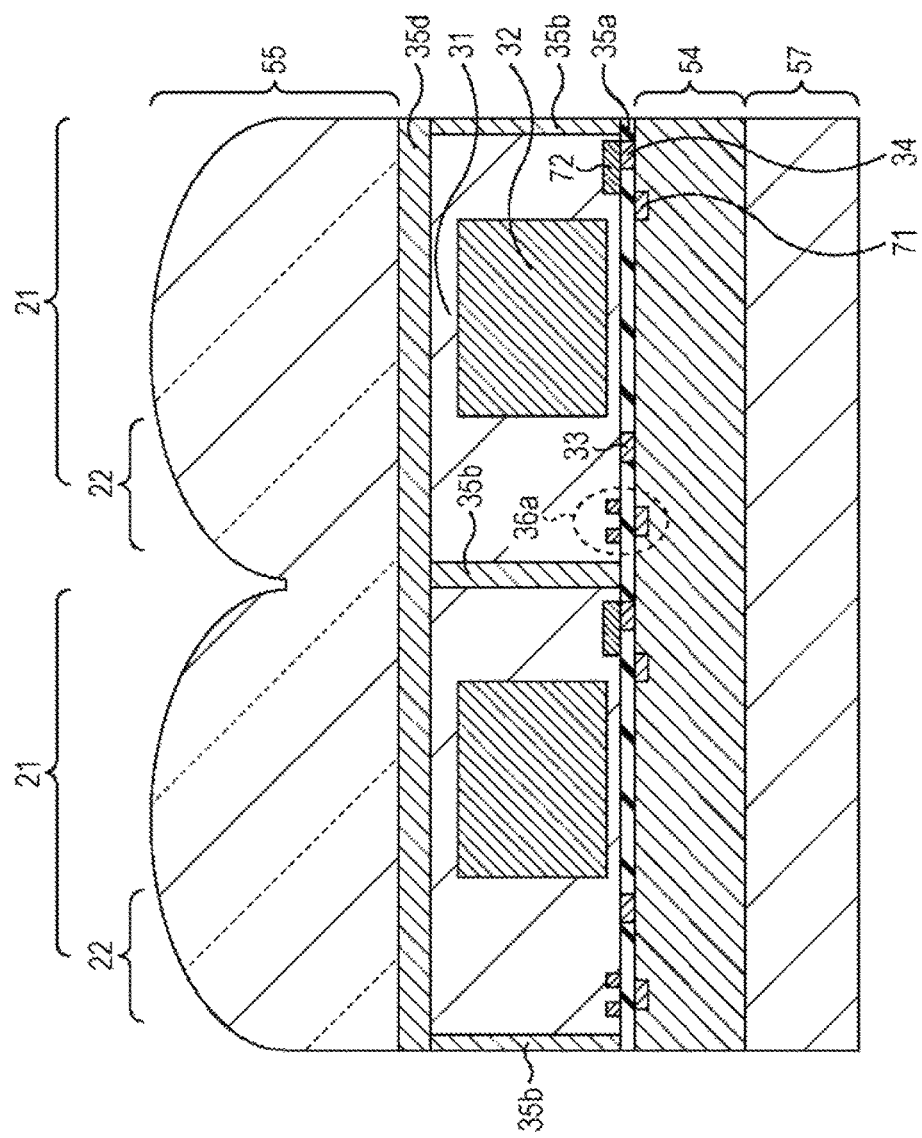
FIG. 37 is a cross-sectional view illustrating a ninth configuration example when the accumulation type and photovoltaic type pixel of FIG. 31 is applied to a back surface irradiation type imaging device.

Next, FIG. 37 is a cross-sectional view of a configuration example (hereinafter, referred to as a ninth configuration example) when the accumulation type and photovoltaic type pixel 70 of the second embodiment is applied to the back surface irradiation type imaging device.

Figure 17:
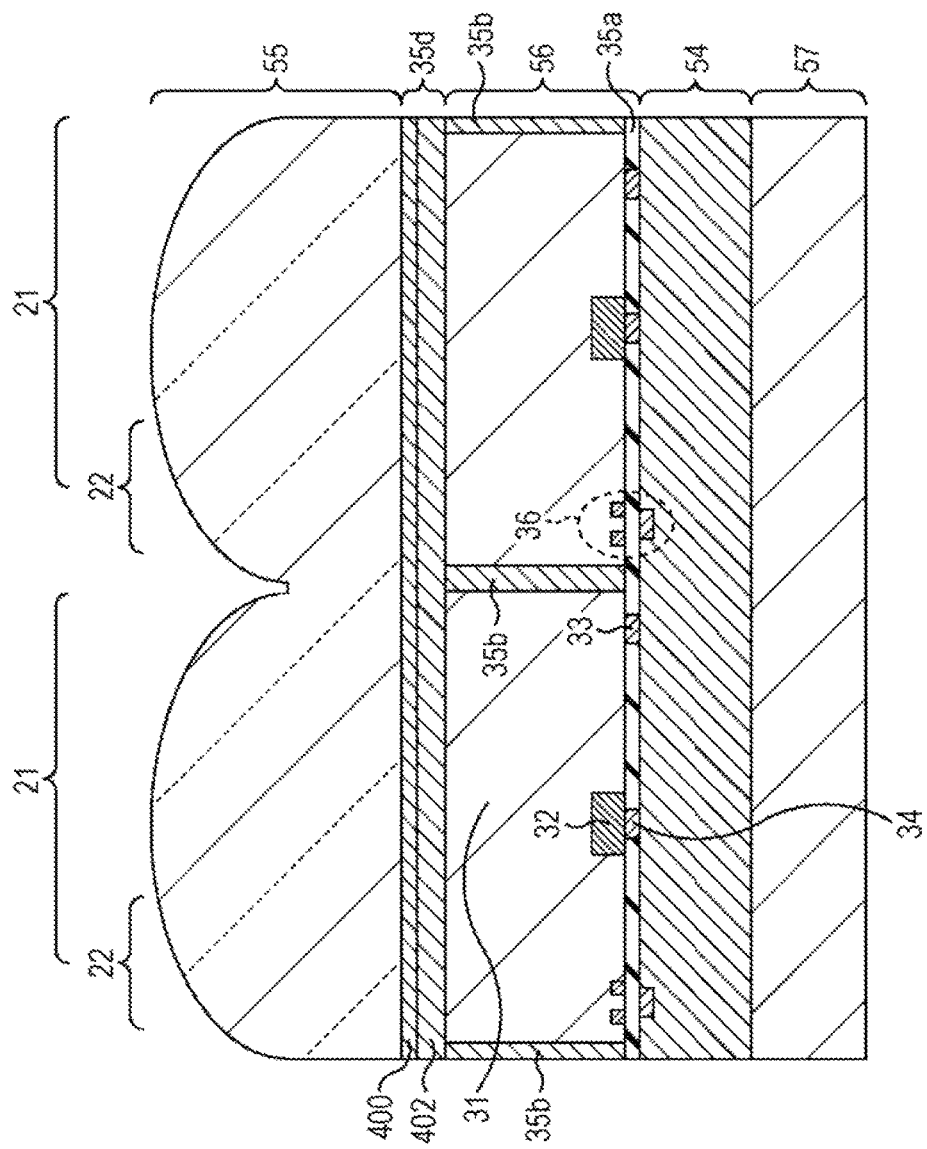
FIG. 17 is a cross-sectional view illustrating a second modified example of the fifth configuration example illustrated in FIG. 15.

Moreover, element isolation regions 35a to 35d of the ninth configuration example use the same material as that of the element isolation regions 35a to 35d of the fifth configuration example illustrated in FIG. 15, but may be the same configuration as the first or second modified example illustrated in FIG. 16 or 17. Furthermore, the element isolation regions 35a to 35d may be the same configuration as the sixth configuration example illustrated in FIG. 18 or the seventh configuration example illustrated in FIG. 19. Otherwise, similar to the third configuration example illustrated in FIG. 13, the element isolation region 35b may be also configured of $SiO_2$ and metal.

A manufacturing method of the ninth configuration example will be described. It is possible to manufacture the ninth configuration example by slightly modifying the manufacturing method of the back surface irradiation type and accumulation type pixel of the related art as described below and by adding a forming process of the element isolation regions 35a to 35d. That is, an acceptor impurity is introduced into the P-type region 31 or a film that generates negative fixed charges is embedded inside $SiO_2$ of the element isolation region 35b so that the hole concentration in the vicinity of the interface of the P-type region 31 and the element isolation region 35b is set so as to have a predetermined concentration or more. As the film generating the negative fixed charges, for example, it is possible to use a hafnium oxide film and as a film deposition method, it is possible to use a chemical vapor deposition method, a sputtering method, an atomic layer deposition method and the like. Therefore, when operating the ninth configuration example as the accumulation type pixel, it is possible to reduce the dark current to the same level as that of the accumulation type pixel of the related art.

(Configuration Example of Amplifier 12 of Equivalent Circuit of Accumulation Type and Photovoltaic Type Pixel 70)

Figure 38:
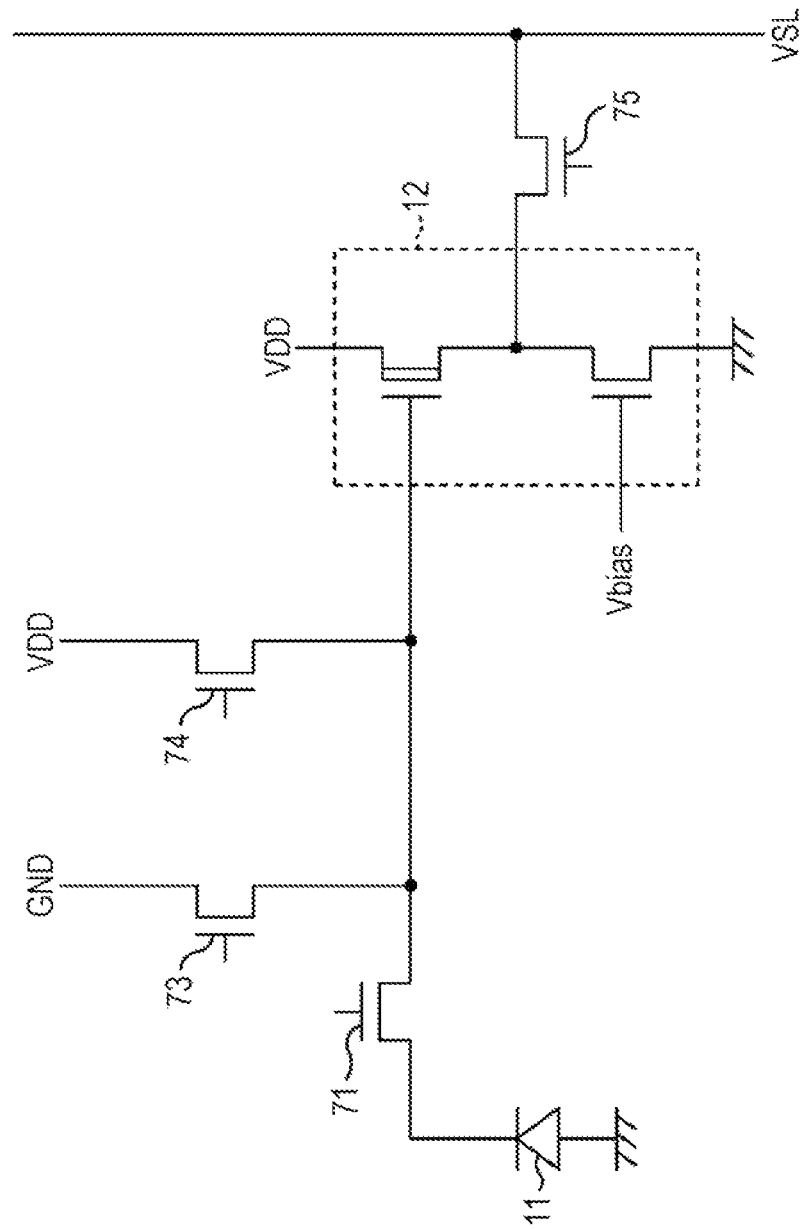
FIG. 38 is an equivalent circuit diagram illustrating a first configuration example which can be employed in an amplifier of FIG. 31.

Next, FIG. 38 illustrates a first configuration example capable of employing the amplifier 12 in the equivalent circuit of the accumulation type and photovoltaic type pixel 70 illustrated in FIG. 31.

The first configuration example is a configuration example of the accumulation type and photovoltaic type pixel 70 when the amplifier 12 is configured as a source-follower type amplifier using a depletion-type MOSFET. It is possible to amplify a negative signal voltage when operating the same pixel as the photovoltaic type pixel in addition to the positive signal voltage when operating as the accumulation type pixel by using the depletion-type MOSFET.

Figure 39:
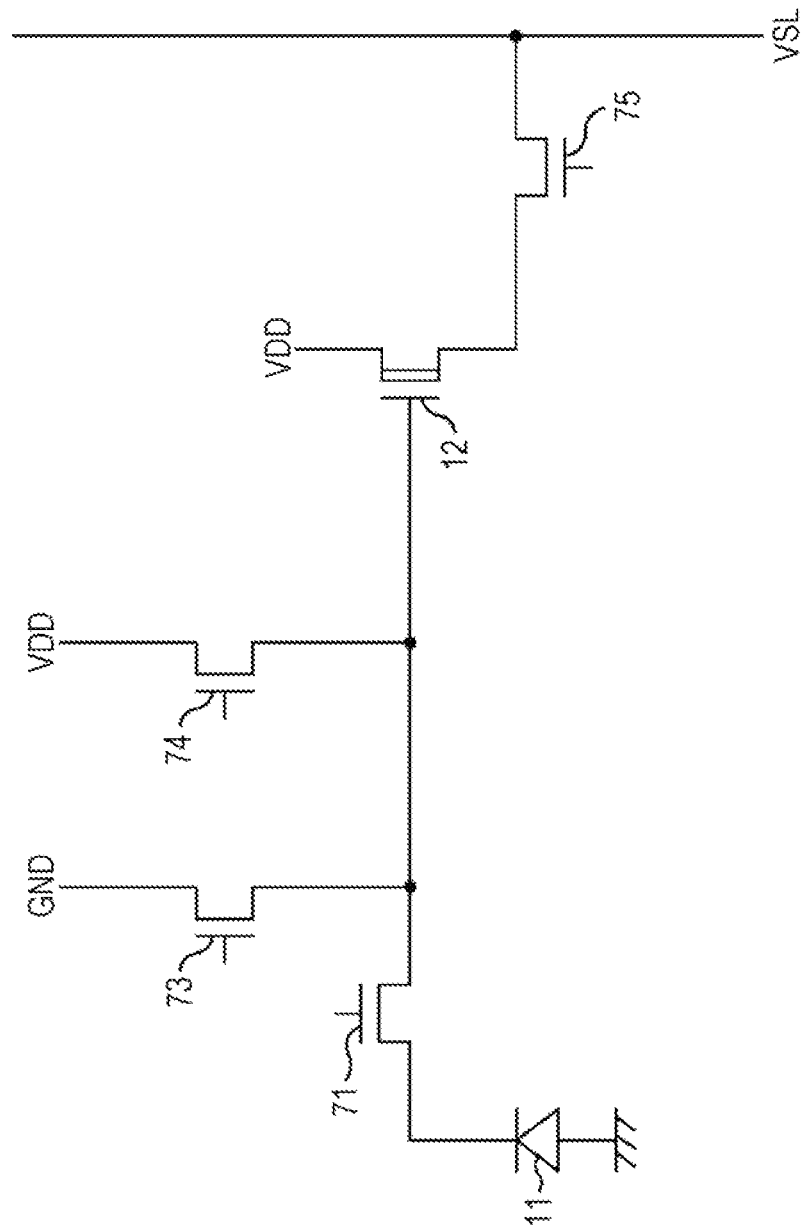
FIG. 39 is an equivalent circuit diagram illustrating a second configuration example which can be employed in an amplifier of FIG. 31.

FIG. 39 illustrates a second configuration example capable of employing the amplifier 12 in the equivalent circuit of the accumulation type and photovoltaic type pixel 70 illustrated in FIG. 31. The second configuration example is a configuration example of the accumulation type and photovoltaic type pixel 70 in a case where a charge MOSFET (not illustrated) operated as a constant current source of a source follower type amplifier of FIG. 38 is disposed on the vertical signal line. It is possible to obtain an aperture ratio or a saturation charge amount equivalent to the accumulation type pixel of the related art by disposing the charge MOSFET outside the pixel.

Figure 40:
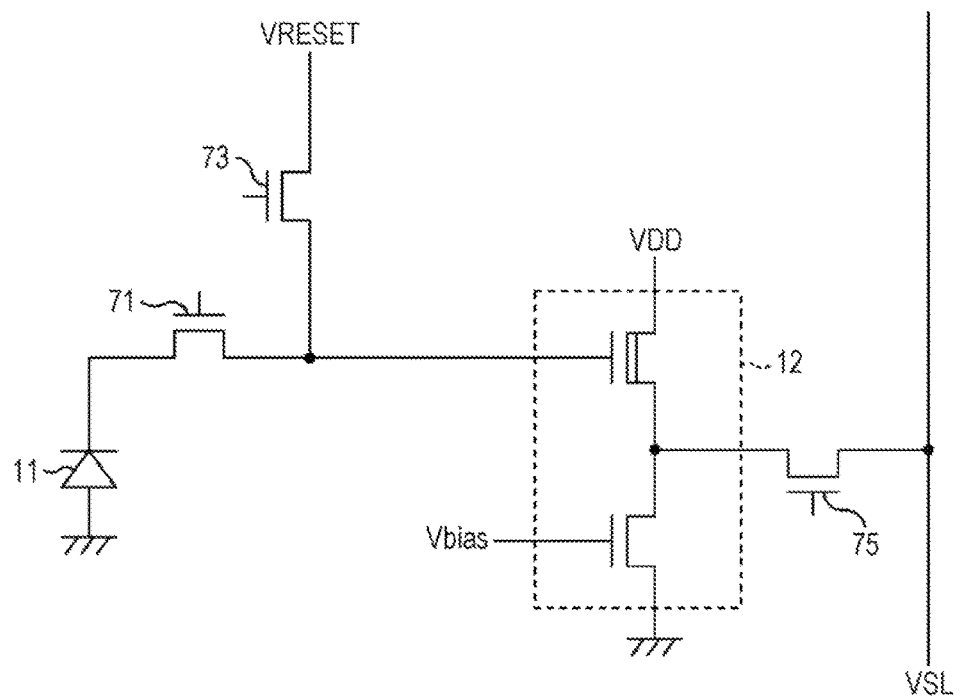
FIG. 40 is another equivalent circuit diagram of the accumulation type and photovoltaic type pixel that is the second embodiment of the disclosure.

FIG. 40 illustrates an equivalent circuit of the accumulation type and photovoltaic type pixel 70 that can be replaced with the equivalent circuit of FIG. 31. A Reset 73 of the equivalent circuit is turned on in a period in which one of the Reset 73 and a Reset 74 of FIG. 31 is turned on. Furthermore, in the equivalent circuit of FIG. 40, a GND potential is applied to a VRESET in a period in which the Reset 73 is turned on in the equivalent circuit of FIG. 31 and a VDD potential is applied to the VRESET in a period in which the Reset 74 is turned on. Thus, a reset period of a FD can be determined simply by a signal applied to the Reset 73 regardless of whether the accumulation type and photovoltaic type pixel 70 is operated in either the photovoltaic type or the accumulation type. Whether the FD potential is set to the potential of either VDD or the GND can be determined by a voltage applied to the VRESET depending on whether the accumulation type and photovoltaic type pixel 70 is operated as either the photovoltaic type or the accumulation type.

Figure 41:
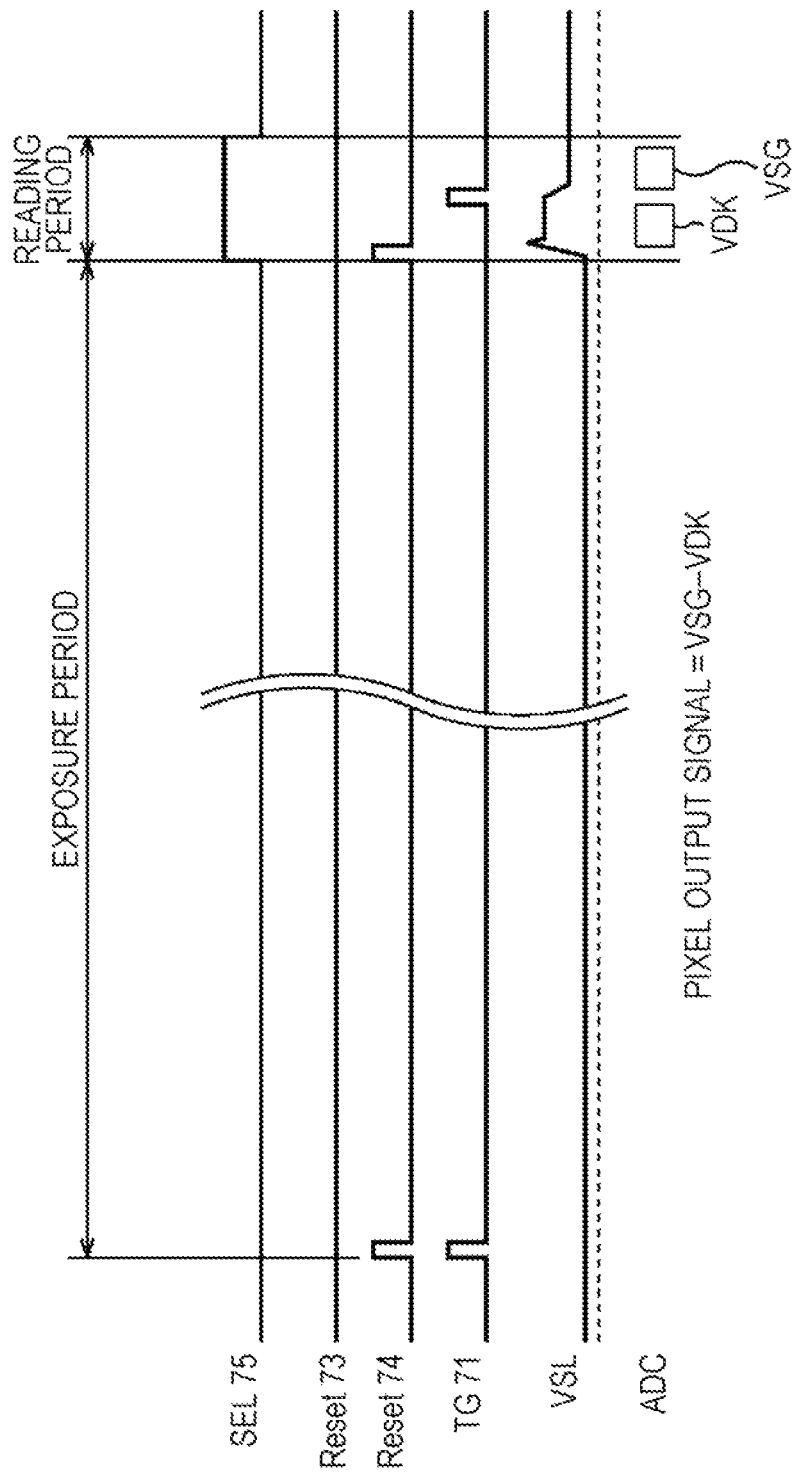
FIG. 41 is a timing chart when the accumulation type and photovoltaic type pixel is operated as the accumulation type pixel.

Next, FIG. 41 illustrates an example of a drive timing when the accumulation type and photovoltaic type pixel 70 is operated as the accumulation type pixel.

The drive timing is the same as the drive timing of the accumulation type pixel of the related art illustrated in FIG. 25 except that the Reset 73 is typically fixed to the GND. That is, the accumulation type and photovoltaic type pixel 70 can be driven similar to the accumulation type pixel of the related art if the Reset 73 is typically fixed to the GND.

Figure 42:
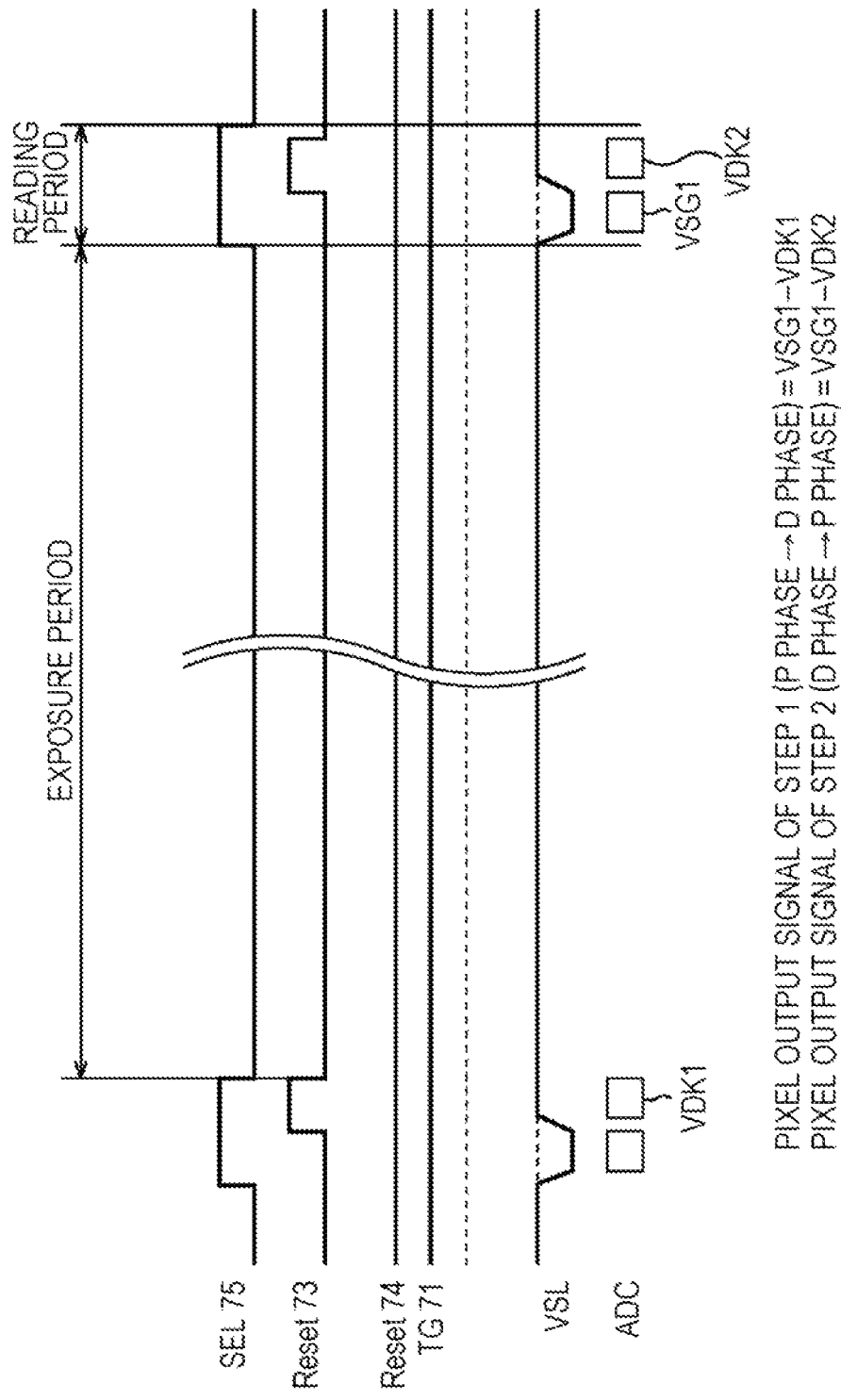
FIG. 42 is a timing chart when the accumulation type and photovoltaic type pixel is operated as the photovoltaic type pixel.

FIG. 42 illustrates an example of a drive timing when the accumulation type and photovoltaic type pixel 70 is operated as the photovoltaic type pixel.

The drive timing is the same as the drive timing of the photovoltaic type pixel 61 illustrated in FIG. 24 except that the Reset 74 is typically fixed to the GND. That is, the accumulation type and photovoltaic type pixel 70 can be driven similar to the photovoltaic type pixel 61 if the Reset 74 is typically fixed to the GND.

Thus, if the drive timing illustrated in FIG. 41 and the drive timing illustrated in FIG. 42 are appropriately selected for each frame, it is possible to realize the image output sequence illustrated in FIG. 26A or 26B.

However, in the accumulation type and photovoltaic type pixel 70, since all pixels can be configured of the logarithmic image and the linear image, it is possible to obtain the image of resolution in any image higher than the imaging device to which the first embodiment is applied.

Furthermore, if characteristics in which all pixels are operated as both the accumulation type and the photovoltaic type are utilized, it is possible to switch the pixel output of the accumulation type and the photovoltaic type by row unit within one frame.

Figure 43:
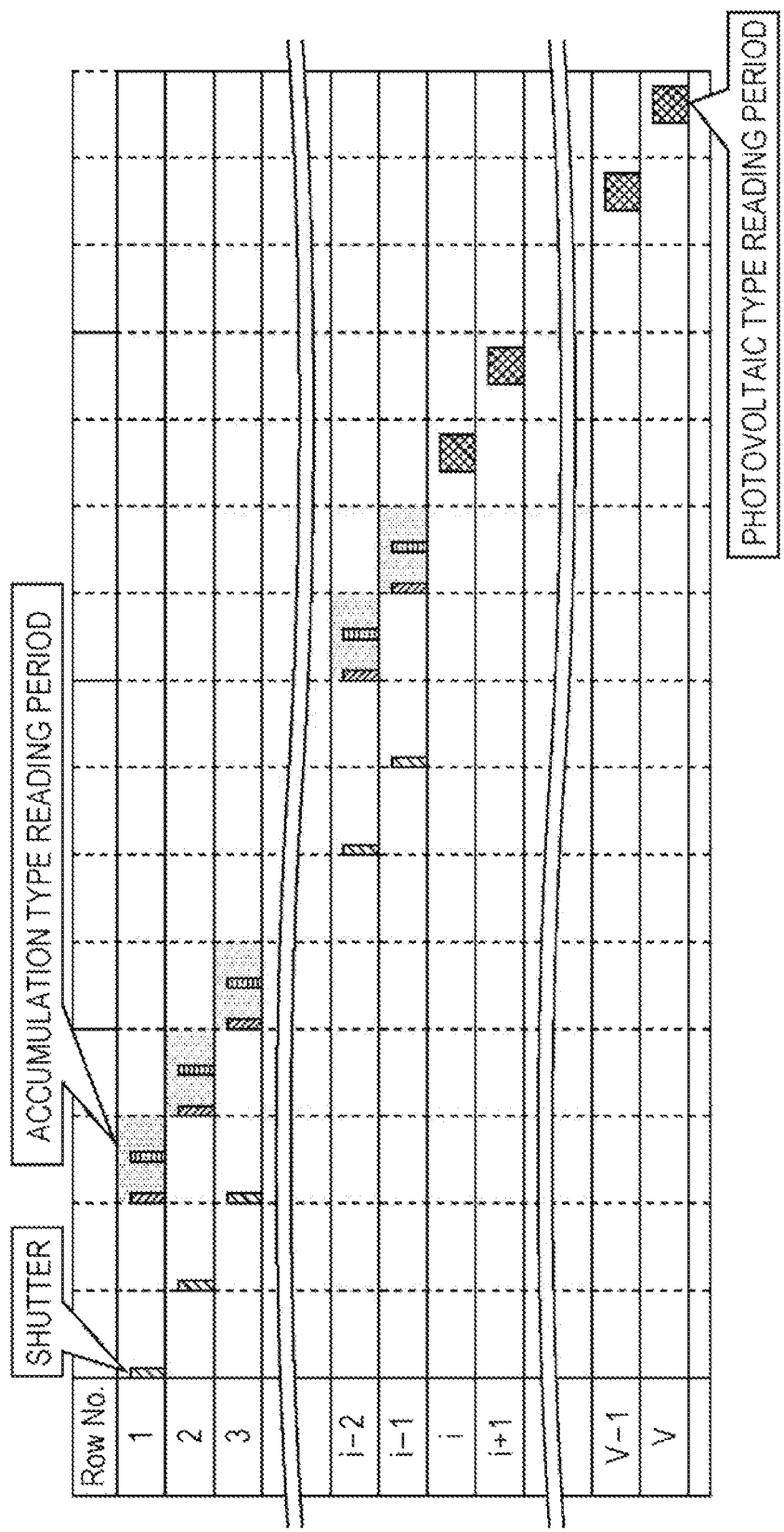
FIG. 43 is a timing chart when outputs of the accumulation type pixel and the photovoltaic type pixel are switched for each row inside one frame.
Figure 44:
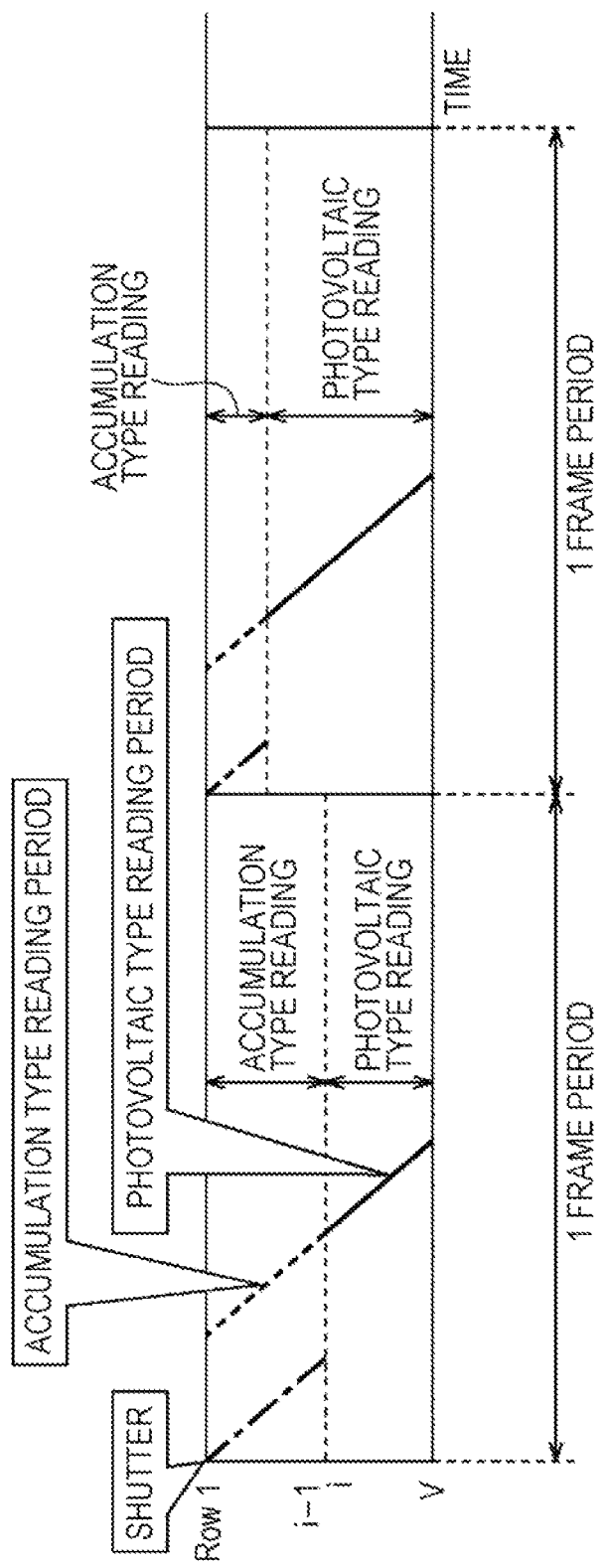
FIG. 44 is a timing chart when the outputs of the accumulation type pixel and the photovoltaic type pixel are switched for each row inside one frame.

FIGS. 43 and 44 illustrate an example of a drive timing that is switched whenever the pixel output of the accumulation type and the photovoltaic type is switched for each row within one frame. That is, the drive timing in which the accumulation type and photovoltaic type pixel 70 is operated as the accumulation type pixel illustrated in FIG. 41 for a first to (i-1)-th rows is employed and the drive timing in which the accumulation type and photovoltaic type pixel 70 is operated as the photovoltaic type pixel illustrated in FIG. 42 for an i-th to V-th rows is employed.

Figure 45:
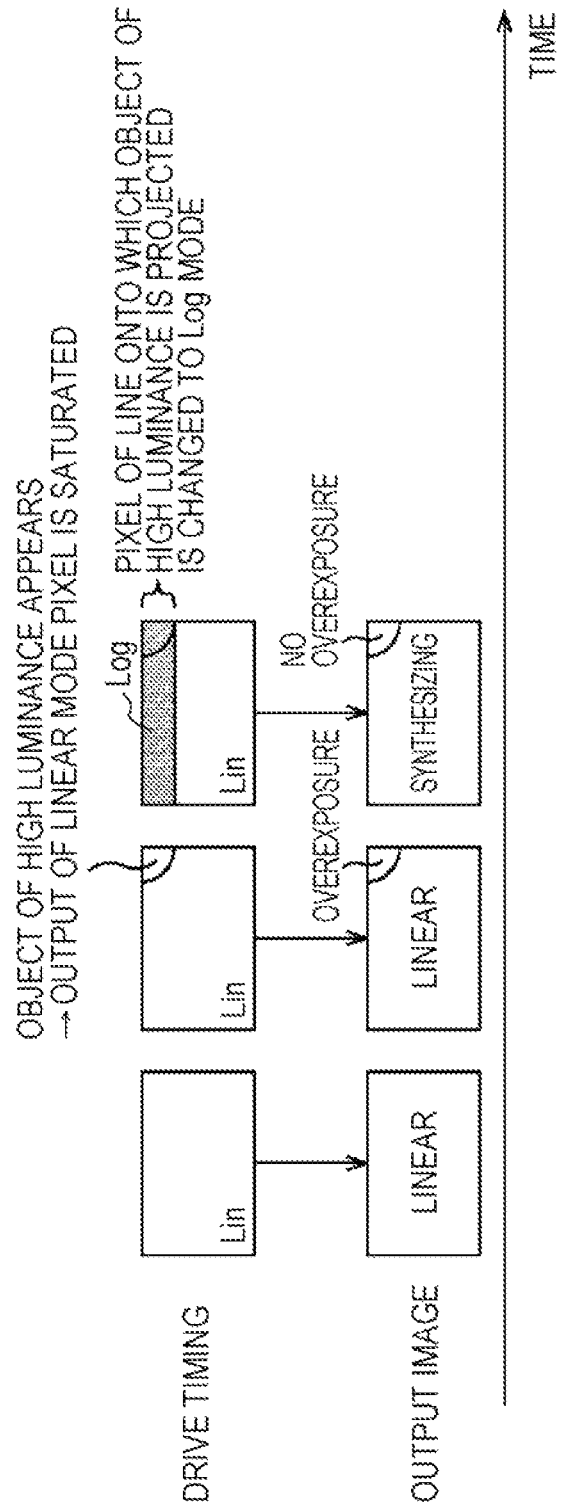
FIG. 45 is a view illustrating an effect obtained when the outputs of the accumulation type pixel and the photovoltaic type pixel are switched for each row inside one frame.

It is possible to obtain effects illustrated in FIG. 45 by driving the accumulation type and photovoltaic type pixel 70 as illustrated in FIGS. 43 and 44. FIG. 45 illustrates effects that are obtained when an object of high luminance suddenly appears in a scene during video recording in the linear image.

In a region in which the object of high luminance appears, an output of a part of the accumulation type pixel is saturated. In this case, in the imaging device, the pixel in which the accumulation type output is saturated is detected by a control circuit (not illustrated) and the drive timing of a certain row of the pixels is selectively changed from the accumulation type to the photovoltaic type in the next frame. Thus, in the next frame, the row in which the object of high luminance is captured is imaged by the pixel that is driven by the photovoltaic type, but the row in which the object of high luminance is not captured is imaged by the accumulation type timing. In the region of the low luminance, the SIN is good and it is possible to obtain a synthesized image of high resolution having good tone and color reproducibility even in the object of high luminance by synthesizing the logarithmic image and the linear image imaged as described above.

Figure 46:
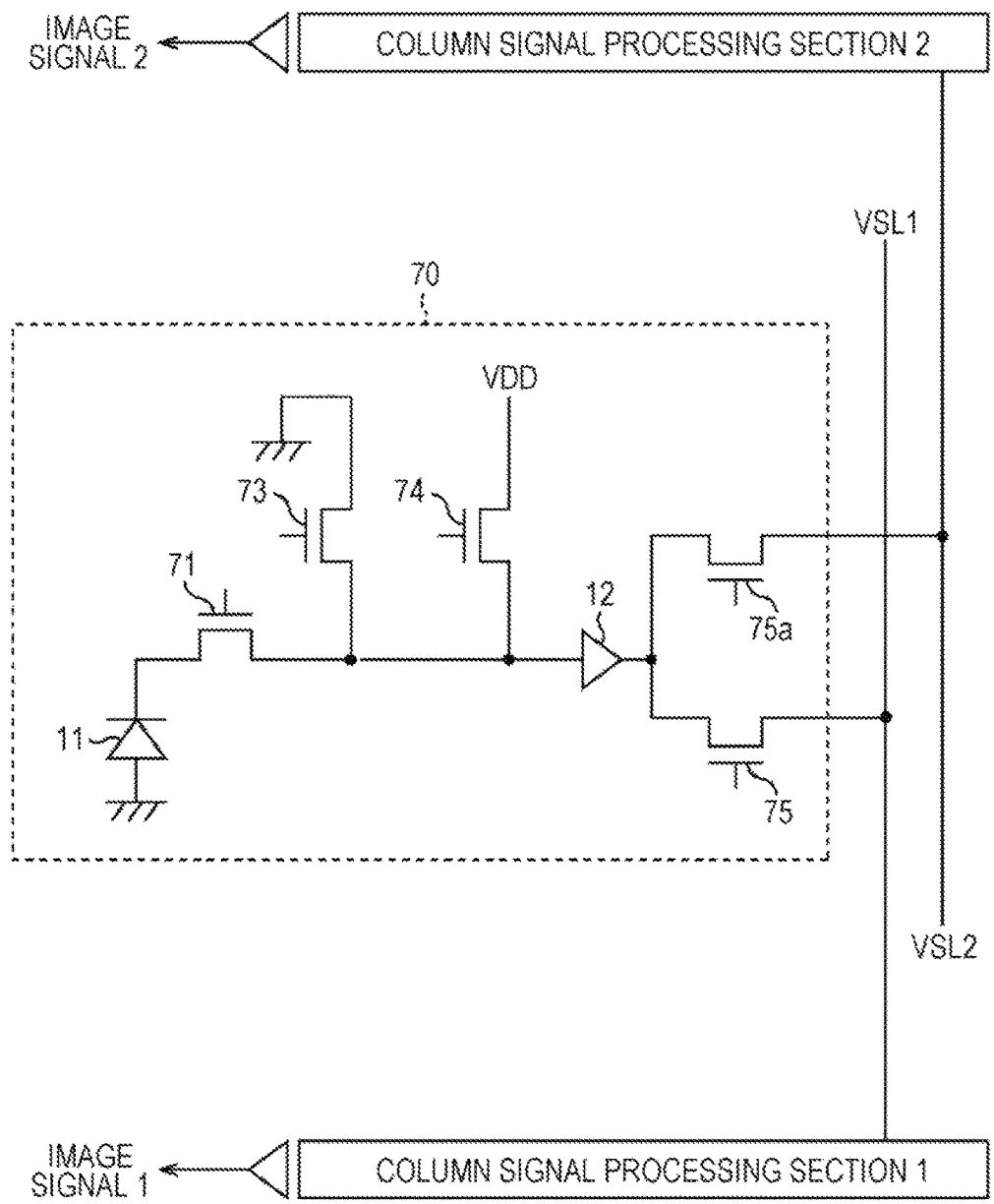
FIG. 46 is an equivalent circuit diagram for obtaining a higher frame rate than that in the drive timing of FIGS. 43 and 44.

Next, FIG. 46 illustrates an example of an equivalent circuit for one pixel for obtaining a higher frame rate in the drive timing illustrated in FIGS. 43 and 44.

As illustrated in the drawing, each pixel is connected to two vertical signal lines VSL 1 and VSL 2, and whether the pixel output is performed in either vertical signal lines VSL 1 or VSL 2 can be selected by selection transistors 75 and 75a. Two vertical signal lines VSL 1 and VSL 2 are connected to column signal processing sections 1 and 2 that are independent from each other, and the column signal processing sections 1 and 2 can perform column signal processes such as AD conversion simultaneously and in parallel to the pixel output from the vertical signal lines VSL 1 and VSL 2.

Figure 47:
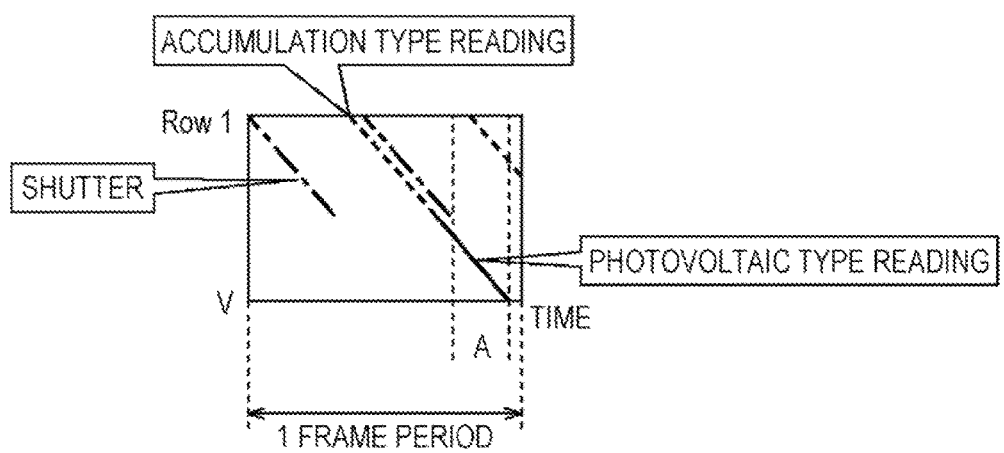
FIG. 47 is a timing chart illustrating a higher frame rate.

It is possible to use both two vertical signal lines VSL 1 and VSL 2 in the row in which the accumulation type and photovoltaic type pixel 70 is operated as the accumulation type and in the row in which the accumulation type and photovoltaic type pixel 70 is operated as the photovoltaic type by employing the circuit configuration illustrated in FIG. 46. In this case, it is possible to simultaneously output the pixel signal in the row in which the accumulation type and photovoltaic type pixel 70 is driven as the accumulation type and in the row in which the accumulation type and photovoltaic type pixel 70 as driven in the photovoltaic type. As a result, as the timing chart illustrated in FIG. 47, since the reading of the accumulation type can be started before the reading of the photovoltaic type ends (period A in the drawing), it is possible to increase the frame rate.

Figure 48:
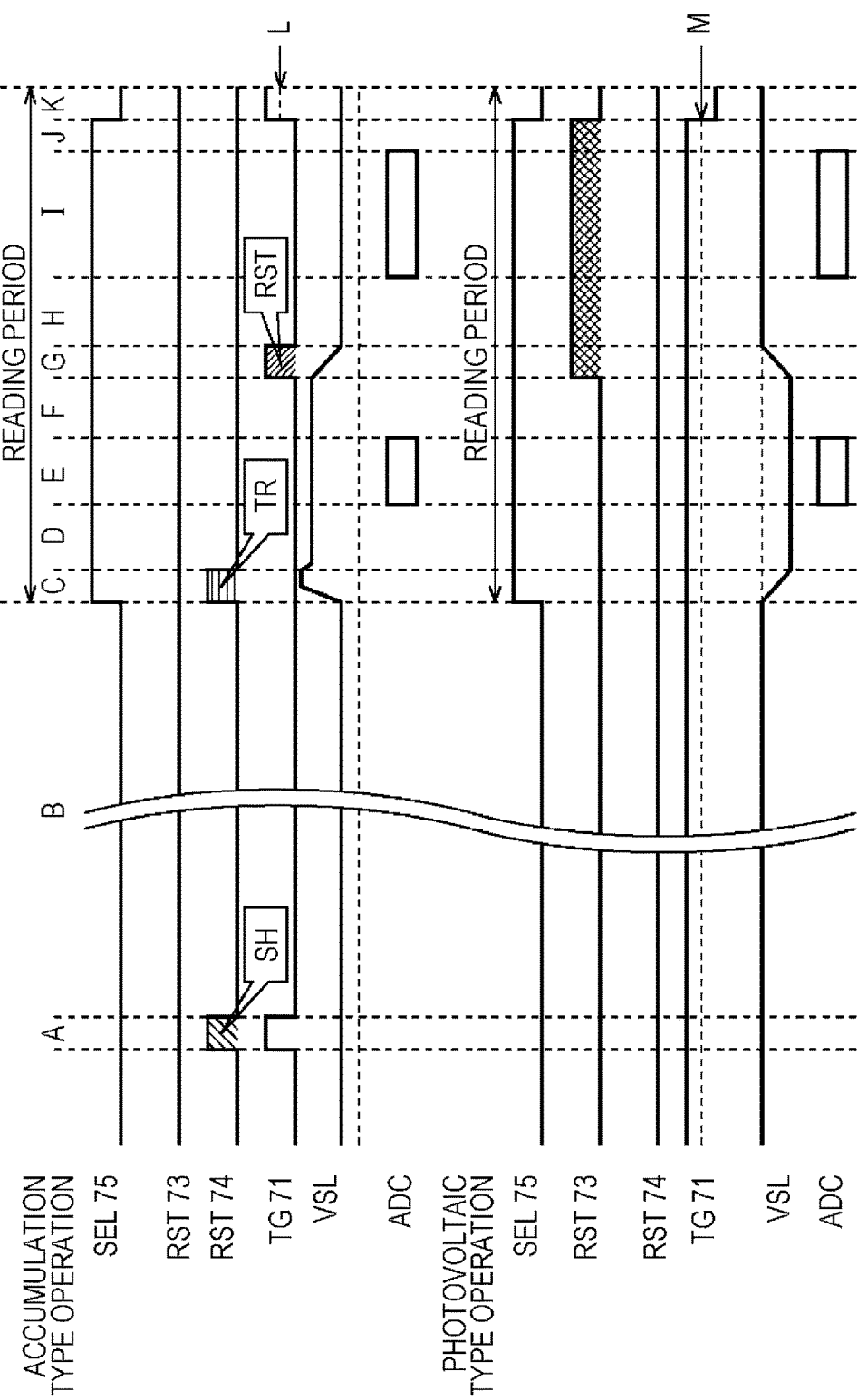
FIG. 48 is a drive timing chart when employing the circuit configuration of FIG. 46 and simultaneously outputting a pixel signal of the accumulation type pixel and a pixel signal of the photovoltaic type pixel from different rows.

Next, FIG. 48 illustrates an example of a drive timing when the circuit configuration illustrated in FIG. 46 is employed and the pixel signal of the accumulation type and the pixel signal of the photovoltaic type are simultaneously output from different rows.

In the drawing, a P phase voltage of the accumulation type and a signal voltage of the photovoltaic type are simultaneously read and a D phase voltage of the accumulation type and a voltage when dark of the photovoltaic type are simultaneously read. Since the accumulation type pixel signal of a certain row and the photovoltaic type pixel signal of another row can be simultaneously AD-converted by being synchronized as described above, it is possible to obtain a higher frame rate. Moreover, in an exposure period of the photovoltaic type drive, a voltage of the TG 71 may be set to potentials (L and M in the drawing) that are lower than the VDD. Thus, it is possible to reduce an effective junction capacitance of a PN junction diode 11 and to stabilize the photovoltaic power generated in the PN junction diode 11 in a shorter time.

Figure 49:
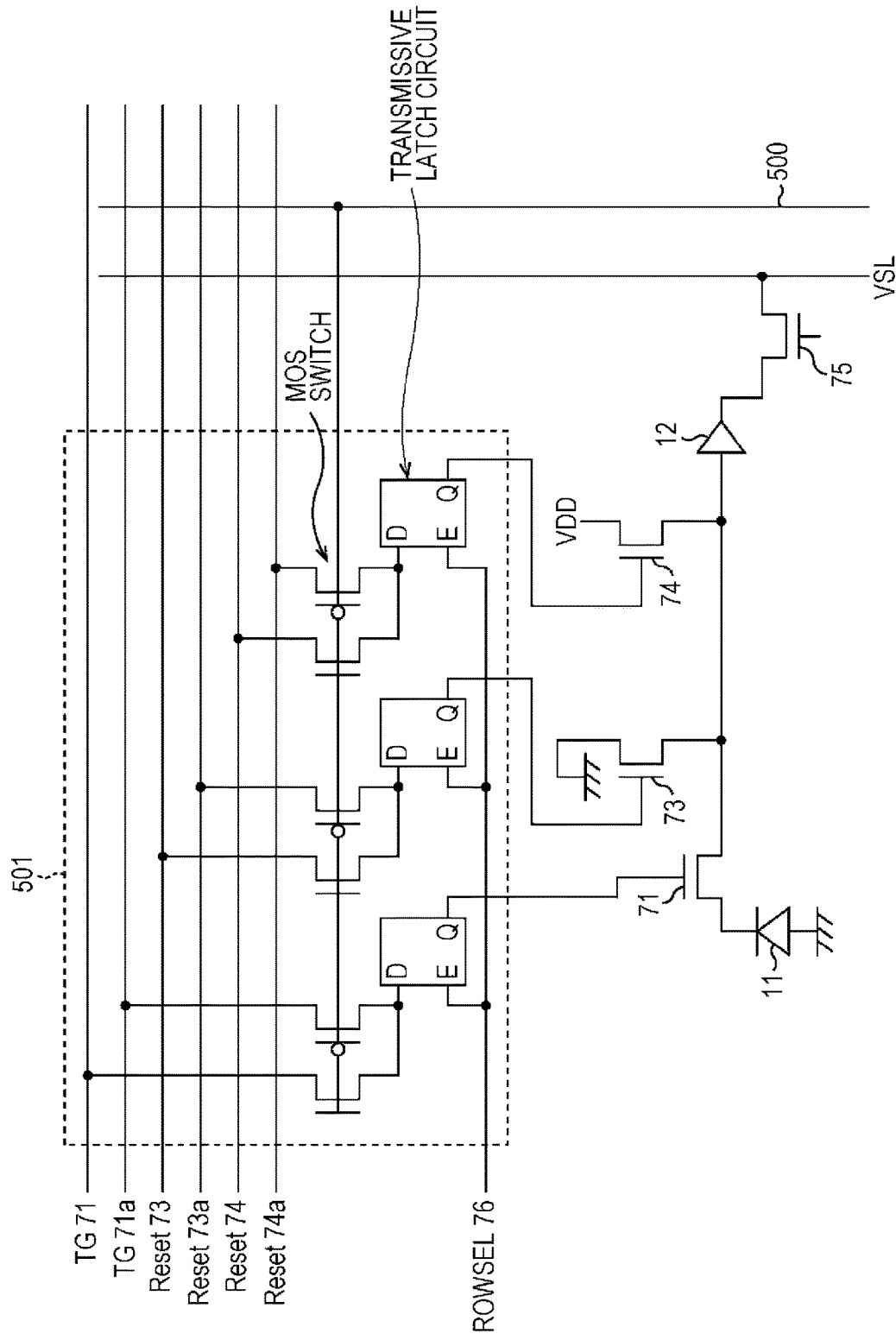
FIG. 49 is a view illustrating a configuration example of a selection circuit for selecting the drive timing of the accumulation type pixel and the drive timing of the photovoltaic type pixel by column unit in the same row inside one frame.

Next, FIG. 49 illustrates an example of a selection circuit for selecting the drive timing of the accumulation type and the drive timing of the photovoltaic type in the same row within one frame by column unit.

Moreover, in the drawing, the TG 71 represents a transfer gate signal for the photovoltaic type timing. A TG 71a represents a transfer gate signal for the accumulation type timing. The Resets 73 and 74 represent the reset signals for the photovoltaic type timing. Resets 73a and 74a represent reset signals for the accumulation type timing. A ROWSEL 76 is a signal that is turned on during a row selection period.

A mode selection line 500 is a signal line that transmits timing selection signals (the accumulation type is selected for OV and the photovoltaic type is selected for the VDD) of the photovoltaic type and the accumulation type and is provided for each pixel column or for a predetermined column interval. A signal selection circuit 501 is provided for selecting the signal transmitted to the transfer gate 71 and the reset gates 73 and 74 by the signal voltage of the mode selection line. A transmission latch circuit has terminals D, E, and Q, and an input voltage of the terminal D is output to the terminal Q when the ROWSEL 76 is turned on and next, when the ROWSEL 76 is turned off, the voltage of the terminal Q when being turned off is held until the next time it is turned on.

In the selection circuit illustrated in the drawing, when the ROWSEL 76 of the reading row is turned on, the drive signal of the accumulation type or the photovoltaic type is selected by a MOS switch depending on the signal voltage of the mode selection line 500 and the drive signal is transmitted to the transfer gate 71 and the reset gates 73 and 74 though the transmission latch circuit. That is, whether a certain pixel is driven as the accumulation type or is driven as the photovoltaic type is determined by the signal voltage of the mode selection line 500. Thus, it is possible to optionally select the drive timing of each pixel of a selected row for each column by changing the signal voltage of the mode selection line 500 for each column.

When the ROWSEL 76 is turned off, since the output voltage of the transmission latch circuit is held, the signal voltage of the accumulation type or the photovoltaic type is held until the row is selected the next time. Thus, each pixel is driven at one of timings of the accumulation type or the photovoltaic type though one frame period.

Moreover, the selection circuit illustrated in FIG. 49 may be provided for each pixel or, for example, may be provided for each repetition period of the Bayer array. Otherwise, the selection circuit may be provided for each greater region. In either case, it is preferable that the pixel structure is the back surface irradiation type and the selection circuit is disposed on a circuit substrate 57 so that the selection circuit does not limit the aperture ratio of the pixel or the accumulation charge amount.

Figure 50:
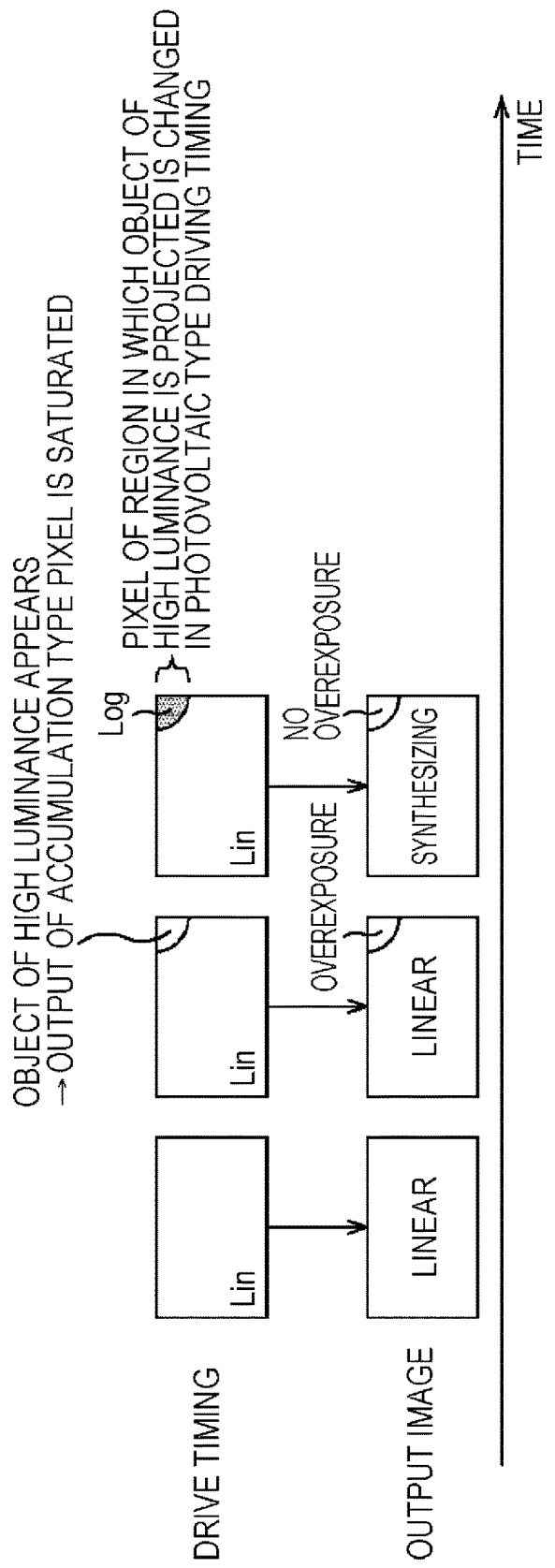
FIG. 50 is a view illustrating an effect obtained when selecting the drive timing of the accumulation type pixel and the drive timing of the photovoltaic type pixel by column unit in the same row inside one frame.

Effects illustrated in FIG. 50 can be obtained by providing the selection circuit of FIG. 49. FIG. 50 illustrates effects that are obtained when the object of high luminance suddenly appears in the scene during video recording in the linear image.

In a region in which the object of high luminance is captured, an output of a part of the accumulation type pixel is saturated. In the imaging device, the pixel in which the output is saturated is detected by a control circuit (not illustrated) and the drive timing of a region of the pixels in which the output is saturated is selectively changed to the photovoltaic type in the next frame. In the next frame, since the selection signal of the photovoltaic type is output to the mode selection line 500 of the region in which the object of high luminance is captured, the object of the high luminance is imaged in the drive timing of the photovoltaic type and the other region is imaged in the drive timing of the accumulation type.

In a region other than the region in which the object of the high luminance is captured, the SIN is good and it is possible to obtain a synthesized image of high resolution having good tone or color reproducibility even in the object of the high luminance by synthesizing and outputting the logarithmic image and the linear image imaged as described above.

Next, FIGS. 51A to 51C illustrate an example of the drive timing when both of the accumulation type pixel signal and the photovoltaic type pixel signal are output from all pixels within one frame.

As illustrated in the drawing, each pixel is driven in the accumulation type timing illustrated in FIG. 48 immediately after the photovoltaic type pixel signal is output in the drive timing of the photovoltaic type illustrated in-FIG. 48, and then the accumulation type pixel signal is output. As a result, it is possible to obtain both the logarithmic image and the linear image by all pixels configuring one frame.

Furthermore, in the case of FIGS. 51A to 51C, since the exposure period of the photovoltaic type and the accumulation type are continuous, shift of the exposure timing of both is small. As a result, since image shift of the logarithmic image and the linear image is reduced, artifact generation is suppressed in the synthesized image of both.

Figure 51:
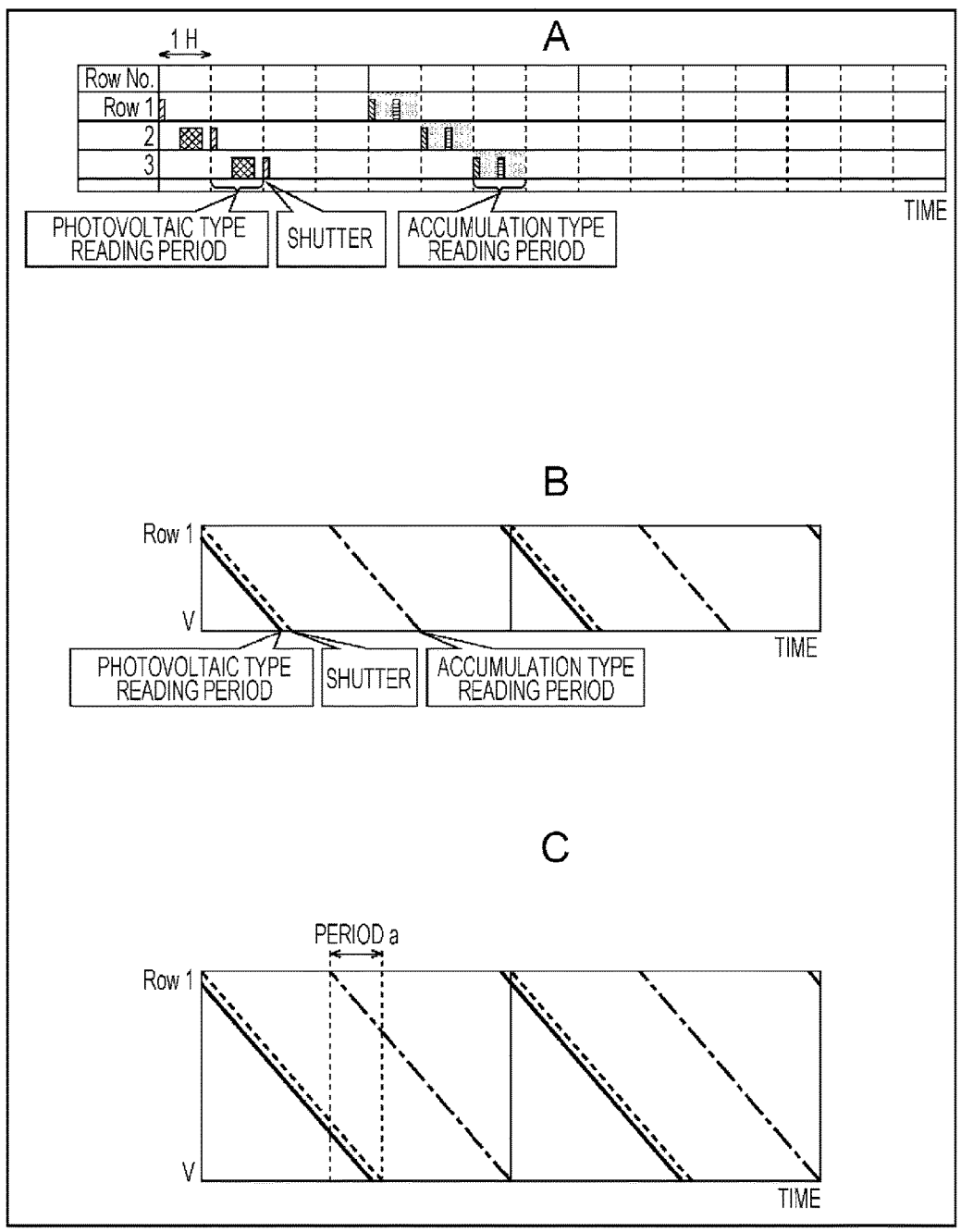
FIGS. 51A-51C illustrate an example of the driving timing when outputting both the accumulation type pixel signal and the photovoltaic type pixel signal from all pixels inside one frame.
Figure 52:
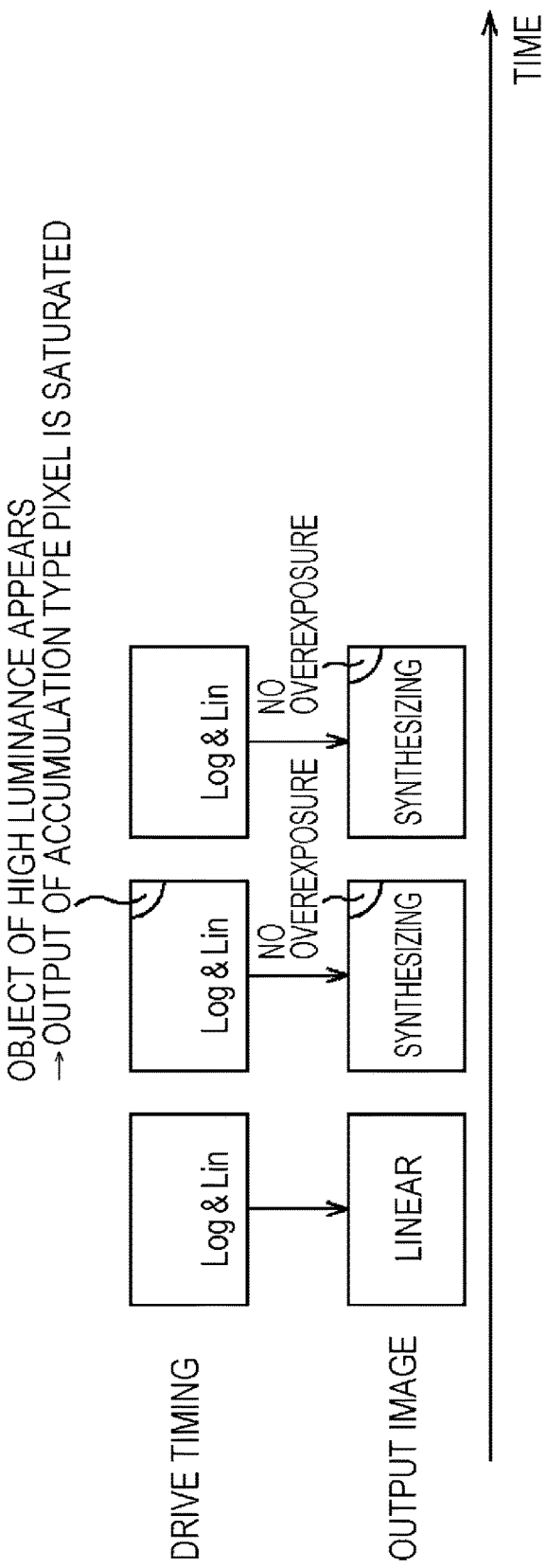
FIG. 52 is a view illustrating an effect obtained when outputting both the accumulation type pixel signal and the photovoltaic type pixel signal from all pixels inside one frame.

Furthermore, it is possible to obtain the effects illustrated in FIG. 52 by using the drive timing of FIGS. 51A to 51 C. FIG. 52 illustrates effects that are obtained when the object of high luminance suddenly appears in the scene during video recording in the linear image.

In a region in which the object of high luminance is captured, an output of a part of the accumulation type is saturated. However, since all pixels within one frame output the pixel signal of both the photovoltaic type and the accumulation type, it is possible to synthesize the logarithmic image and the linear image by referring to the photovoltaic type output in the pixel in which an accumulation type output is saturated by storing the output to a line buffer or a frame buffer. As a result, as illustrated in FIG. 52, in a region other than the region in which the object of the high luminance is captured from the first frame in which the object of the high luminance appears, the S/N is good and it is possible to obtain a synthesized image of high resolution having good tone or color reproducibility even in the object of the high luminance.

Moreover, the circuit configuration illustrated in FIG. 46 may be operated in the drive timing illustrated in FIG. 51A and, in this case, it is possible to simultaneously output the photovoltaic type pixel signal and the accumulation type pixel signal respectively from different rows so as to be performed in a period a of FIG. 51 C. Thus, it is possible to increase the frame rate in the drive timing of FIGS. 51 A to 51C.

<Output Voltage Characteristics of FD 37>

Figure 53:
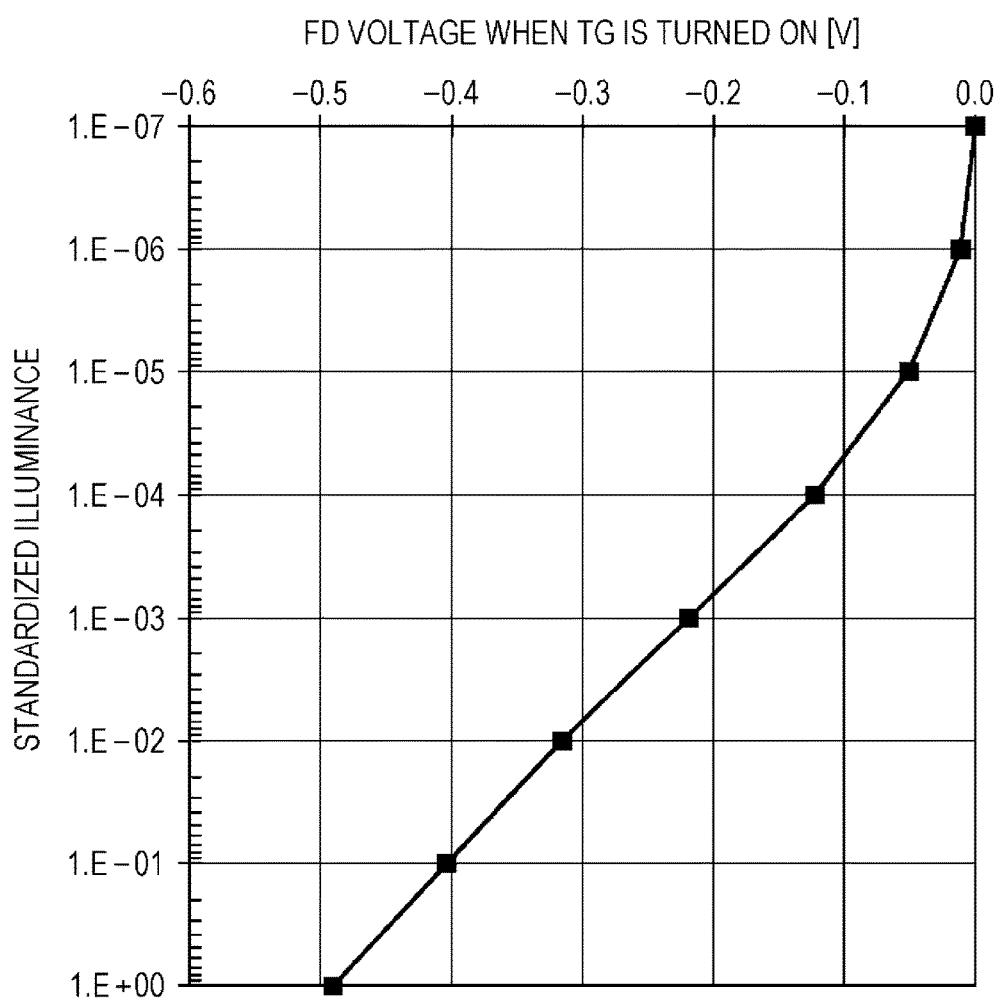
FIG. 53 is a view illustrating output voltage characteristics of a PN junction diode 11.

Next, FIG. 53 illustrates simulation results of the output voltage of the FD 72 corresponding to the irradiation light in a state where the TG 71 is turned on in the eighth configuration example illustrated in FIG. 36. As illustrated in the drawing, it can be understood that the output voltage of the FD 72 logarithmically increases with respect to the illuminance. That is, it can be understood that the eighth configuration example is also operated as the photovoltaic type pixel.

<Calibration of Output Value of Photovoltaic Type Pixel>

FIG. 54 illustrates an outline of a calibration method of an output value of the photovoltaic type pixel by using the output value of the accumulation type pixel of the same pixel or the adjacent pixel.

Moreover, in the drawing, Is and Vs represent an exposure amount and a pixel output value when the pixel is driven in the accumulation type timing and the accumulation charge amount is saturated. A graph G1 schematically represents a relationship between the output value of the accumulation type and the exposure amount when any pixel is driven in the accumulation type timing or a relationship between the pixel output value and the exposure amount expected if it is assumed that the pixel is driven in the accumulation type timing. A graph G2 schematically represents a relationship between the output value of the photovoltaic type and the exposure amount before calibration when the pixel of the graph G1 is driven in the photovoltaic type timing. A graph G3 schematically represents a relationship between the pixel output value and the exposure amount that is obtained by converting the pixel output value of the graph G2 from a logarithmic value to a linear value. A graph G4 schematically represents a relationship between the output value of the photovoltaic type and the exposure amount after calibration of the output value of the photovoltaic type of the graph G2 using a comparison result of the graph G3 and the graph G1.

Here, "the output value of the accumulation type (or, its expected value) of any pixel" indicates an average value (or, its expected value) of the accumulation type output of a plurality of pixels of the same color configuring an imaging device, or an output value (or, its expected value) of the accumulation type of an individual pixel. Similarly, "the output value of the photovoltaic type of any pixel" indicates an average value of the photovoltaic type output of a plurality of pixels of the same color configuring an imaging device, or an output value of the photovoltaic type of an individual pixel.

First, an accumulation type pixel output V1 and a photovoltaic type pixel output V2 are acquired by an exposure amount $1_1$ in which a signal amount when driving as the accumulation type is not saturated. Next, a value of the photovoltaic type pixel output V2 is converted from the logarithmic value to the linear value and an output value V3 of the photovoltaic type after linear conversion is obtained. A calibration parameter of the output value of the photovoltaic type is calculated such that the output value V3 of the photovoltaic type coincides with the accumulation type pixel output V1. Thereafter, it is possible to obtain the photovoltaic type output smoothly leading to the accumulation type pixel output by calibrating the output value of the photovoltaic type using the calibration parameter.

Here, the accumulation type pixel output V1 can be the signal amount when any pixel is driven in the accumulation type timing and the photovoltaic type pixel output V2 can be the signal amount when the same pixel is driven in the photovoltaic type timing.

Otherwise, the photovoltaic type pixel output V2 can be the signal amount when any pixel is driven in the photovoltaic type tinling and the accumulation type pixel output VI can be a signal amount predicted value when the pixel is driven in the accumulation type timing. Here, the signal amount predicted value can be obtained from the output value of the accumulation type of near one or a plurality of pixels of the same color using a method such as interpolation.

Moreover, the calibration parameter described above may be determined for each individual sensor, may be determined for each predetermined pixel region, or may be determined for an individual pixel. Furthermore, the calibration parameter may be calculated in an inspection step before shipment of the imaging device or may be calculated from an image imaged after the shipment of the imaging device.

Thus, the calibration parameter obtained as described above is recorded in the substrate 54 in which the pixel is formed, the circuit substrate 57, or a storage element formed in another substrate (not illustrated) mounted on the same package as the substrate 54, and then the calibration parameter can be referred to when synthesizing the logarithmic image and the linear image.

Otherwise, the calibration parameter is transferred and stored in an image processing device (not illustrated) outside of the imaging device and then the calibration parameter can be referred to when synthesizing the logarithmic image and the linear image by the image processing device.

As described above, it is possible to obtain the output value that is continuous to the output value of the accumulation type pixel by calibrating the output value of the photovoltaic type even when the output value of the photovoltaic type pixel is changed by the temperature. Thus, it is possible to suppress the luminance or color level difference when synthesizing the image when operating as the accumulation type pixel and the image when operating as the photovoltaic type pixel.

<Overview>

As described above, according to the first and second embodiments, it is possible to block the diffusion of the signal charge to the adjacent pixel by providing the element isolation region.

Therefore, crosstalk is suppressed in the vicinity of the photovoltaic type pixel and, in the first embodiment, it is possible to dispose the photovoltaic type pixel and the accumulation type pixel adjacent to each other without degrading the image quality or the sensitivity.

Furthermore, for example, it is possible to obtain the linear output image and the logarithmic output image in the same imaging device by disposing the photovoltaic type pixel and the accumulation type pixel adjacent to each other without using an optical system that is large scale and expensive such as using a half mirror.

Then, it is possible to obtain the image in a wide luminance range with less noise by obtaining the linear output image and the logarithmic output image in the same imaging device without underexposing a low luminance portion or overexposing a high luminance portion of the object.

Furthermore, according to the second embodiment, since the same pixel can be operated as the photovoltaic type pixel and the accumulation type pixel without increasing the dark current, it is possible to synchronize the image by using the output value of the accumulation type in the low luminance portion of the object and using the output value of the photovoltaic type in the high luminance portion of the object. Therefore, it is possible to obtain the linear output image and the log output image without sacrificing the resolution.

Furthermore, when calibrating the log output value by using the linear output value, it is possible to cancel the change in the temperature of the output value of the photovoltaic type by calibrating the output value of the photovoltaic type using the output value of the accumulation type. Thus, it is possible to reduce the luminance or color level difference in the interface between the linear output image and the log output image.

Moreover, the first and second embodiments described above can be applied to any electronic apparatus having an imaging function in addition to the imaging apparatus represented by a digital camera.

Furthermore, embodiments of the present disclosure are not limited to the embodiments described above and various modifications are possible without departing from the scope of the present disclosure.

The present disclosure can take the following configurations.

(1) An imaging device including: photovoltaic type pixels that have photoelectric conversion regions generating photovoltaic power for each pixel depending on irradiation light; and an element isolation region that is provided between the photoelectric conversion regions of adjacent pixels and in a state of substantially surrounding the photoelectric conversion region.

(2) The imaging device according to (1), in which the element isolation region is configured of a material that blocks diffusion of signal charge of the photovoltaic type pixels to the adjacent pixel.

(3) The imaging device according to (1) or (2), further including: an accumulation type pixel that is provided in a position adjacent to the photovoltaic type pixel.

(4) The imaging device according to any one of (1) to (3), in which a PN junction diode is formed in the photoelectric conversion region as a photo-sensor.

(5) The imaging device according to any one of (1) to (4), in which the photovoltaic type pixel further includes a transfer gate and floating diffusion and operates as an accumulation type and photovoltaic type pixel.

(6) The imaging device according to (5), further including: an accumulation type pixel that is in a position adjacent to the accumulation type and photovoltaic type pixel.

(7) The imaging device according to any one of (1) to (4), further including: an accumulation type and photovoltaic type pixel having the photoelectric conversion region, a transfer gate, and floating diffusion, in which the photovoltaic type pixel and the accumulation type and photovoltaic type pixel are formed adjacent to each other.

(8) The imaging device according to any one of (1) to (7), in which a portion between the photoelectric conversion region and a pixel circuit region in each pixel is insulated.

(9) An electronic apparatus equipped with an imaging device, in which the imaging device includes photovoltaic type pixels that have photoelectric conversion regions generating photovoltaic power for each pixel depending on irradiation light, and an element isolation region that is provided between the photoelectric conversion regions of adjacent pixels and in a state of substantially surrounding the photoelectric conversion region.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

10 Photovoltaic type pixel
11 PN junction diode
12 Amplifier
21 Photoelectric conversion region
22 Pixel circuit region
31 P-type region
32 N-type region
33, 34 Electrode
35 Element isolation region
61 Photovoltaic type pixel
62 Accumulation type pixel
70 Accumulation type and photovoltaic type pixel
71 TG
72 FD
73, 74 RST
75 Sel

What is claimed is:

1. An imaging device comprising:
a first pixel that is a photovoltaic type pixel having a first photoelectric conversion region;
a second pixel that is an accumulation type pixel having a second photoelectric conversion region and that is adjacent to the first pixel; and
an isolation region that is provided between the first photoelectric conversion region and the second photoelectric conversion region.

2. The imaging device according to claim 1, wherein the isolation region is configured of a material that blocks diffusion of a signal charge of the first pixel to the second pixel.

3. The imaging device according to claim 1, wherein the first photoelectric conversion region has a PN junction diode.

4. The imaging device according to claim 3, wherein the first pixel further includes a transfer gate and floating diffusion.

5. The imaging device according to claim 1, further comprising:
a third pixel that is an accumulation type pixel and that is adjacent to the first pixel and the second pixel.

6. The imaging device according to claim 1, wherein a portion between the first photoelectric conversion region and a pixel circuit region is insulated.

7. An electronic apparatus, comprising:
an imaging device including:
a first pixel that is a photovoltaic type pixel having a first photoelectric conversion region;
a second pixel that is an accumulation type pixel having a second photoelectric conversion region and that is adjacent to the first pixel; and
an isolation region that is provided between the first photoelectric conversion region and the second photoelectric conversion region.

8. The electronic apparatus according to claim 7, wherein the isolation region is configured of a material that blocks diffusion of a signal charge of the first pixel to the second pixel.

9. The electronic apparatus according to claim 7, wherein the isolation region is configured of a material that blocks diffusion of a signal charge of the photovoltaic type pixels to the adjacent pixel.

10. The electronic apparatus according to claim 7, wherein the first photoelectric conversion region has a PN junction diode.

11. The electronic apparatus according to claim 7, wherein the first pixel further includes a transfer gate and floating diffusion.

12. The electronic apparatus according to claim 7, further comprising:
a third pixel that is an accumulation type pixel and that is adjacent to the first pixel and the second pixel.

13. The electronic apparatus according to claim 7, wherein a portion between the first photoelectric conversion region and a pixel circuit region is insulated.

* * * * *